(12) United States Patent
Chang et al.

(10) Patent No.: US 12,252,784 B2
(45) Date of Patent: Mar. 18, 2025

(54) COPPER HALIDE LAYERS

(71) Applicant: President and Fellows of Harvard College, Cambridge, MA (US)

(72) Inventors: Christina M. Chang, Cambridge, MA (US); Luke M. Davis, Cambridge, MA (US); Roy Gerald Gordon, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 299 days.

(21) Appl. No.: 17/618,217

(22) PCT Filed: Jun. 12, 2020

(86) PCT No.: PCT/US2020/037537
§ 371 (c)(1),
(2) Date: Dec. 10, 2021

(87) PCT Pub. No.: WO2020/252342
PCT Pub. Date: Dec. 17, 2020

(65) Prior Publication Data
US 2022/0380893 A1 Dec. 1, 2022

Related U.S. Application Data

(60) Provisional application No. 62/860,579, filed on Jun. 12, 2019.

(51) Int. Cl.
*C23C 16/30* (2006.01)
*C01G 3/05* (2006.01)
(Continued)

(52) U.S. Cl.
CPC .............. *C23C 16/30* (2013.01); *C01G 3/05* (2013.01); *C23C 16/0272* (2013.01); *H01G 9/20* (2013.01); *H10K 30/40* (2023.02); *H10K 2102/00* (2023.02)

(58) Field of Classification Search
None
See application file for complete search history.

(56) References Cited

U.S. PATENT DOCUMENTS

| 4,935,385 A | * | 6/1990 | Biegelsen | ........... H01L 21/0237 |
| | | | | 117/9 |
| 5,009,719 A | | 4/1991 | Yoshida | |
| | | (Continued) | | |

FOREIGN PATENT DOCUMENTS

| CN | 103764769 B | 8/2016 | |
| JP | 2003273381 A | * 9/2003 | ........... H01G 9/2031 |
| | (Continued) | | |

OTHER PUBLICATIONS

Machine translation of KR202000033569A (Year: 2020).*
(Continued)

*Primary Examiner* — Ryan S Cannon
(74) *Attorney, Agent, or Firm* — Wilmer Cutler Pickering Hale and Dorr LLP

(57) ABSTRACT

Articles are described including a substrate and a copper halide layer on the substrate, where the interfacial free energy between the substrate and the copper halide layer allows the copper halide layer to form continuously, wherein the copper halide layer conforms to the shape of the substrate. The articles may further include an adhesion layer disposed in-between the substrate and the copper halide layer, where the surface free energy between the adhesion layer and the copper halide layer allows the copper halide layer to form continuously, wherein the copper halide layer or the adhesion layer conform to the shape of the substrate. Also described are methods of forming an article using chemical vapor deposition.

36 Claims, 88 Drawing Sheets

(51) Int. Cl.
  *C23C 16/02* (2006.01)
  *H01G 9/20* (2006.01)
  *H10K 30/40* (2023.01)
  *H10K 102/00* (2023.01)

(56) References Cited

U.S. PATENT DOCUMENTS

| | | | |
|---|---|---|---|
| 5,075,171 | A | 12/1991 | Kondo et al. |
| 5,440,664 | A | 8/1995 | Harrington et al. |
| 7,772,556 | B2 | 8/2010 | Reddy et al. |
| 8,486,252 | B2 | 7/2013 | Lin |
| 8,679,587 | B2 | 3/2014 | Chang et al. |
| 2010/0304954 | A1 | 12/2010 | Sogabe et al. |
| 2013/0100675 | A1* | 4/2013 | Han .................... B60Q 3/208 136/258 |
| 2015/0279573 | A1* | 10/2015 | Horiuchi ............ H01G 9/2059 136/263 |
| 2020/0111981 | A1* | 4/2020 | Arora .................. H10K 85/331 |
| 2021/0175450 | A1* | 6/2021 | Kim ..................... H10K 85/50 |
| 2022/0246872 | A1* | 8/2022 | Williams ............. H01L 31/078 |
| 2022/0380893 | A1* | 12/2022 | Chang ................ C23C 16/0272 |

FOREIGN PATENT DOCUMENTS

| | | | | |
|---|---|---|---|---|
| KR | 2020033569 | A | * 3/2020 | ......... C23C 14/0694 |
| WO | WO-2020/252342 | A2 | 12/2020 | |

OTHER PUBLICATIONS

Machine translation of JP2003273381 (Year: 2003).*
"EPFL perovskite solar cells reach 21% efficiency. Dyesol announced that an EPFL research team established a new world record efficiency for perovskite solar cells." Laser Focus World, Dec. 8, 2015. 3 pages. (https://www.laserfocusworld.com/detectors-imaging/article/16557983/epfl-perovskite-solar-cells-reach-21-efficiency).
Ambacher, O., "Growth and Applications of Group III-Nitrides," J. Phys. D: Appl. Phys., Oct. 1998, vol. 31, pp. 2653-2710.
Candelise et al., "Implications for CdTe and CIGS technologies production costs of indium and tellurium scarcity," Progress in Photovoltaics: Research and Applications, published online Jun. 13, 2012, vol. 20, pp. 816-831.
Chen et al., "Low-cost solution-processed copper iodide as an alternative to PEDOT:PSS hole transport layer for efficient and stable inverted planar heterojunction perovskite solar cells," J. Mater. Chem. A, Aug. 18, 2015, vol. 3(38), pp. 19353-19359.
Christians et al., "An Inorganic Hole Conductor for Organo-Lead Halide Perovskite Solar Cells. Improved Hole Conductivity with Copper Iodide," J. Am. Chem. Soc. (2014), published Dec. 18, 2013, vol. 136(2), pp. 758-764.
Christians et al., "Best Practices in Perovskite Solar Cell Efficiency Measurements. Avoiding the Error of Making Bad Cells Look Good," The Journal of Physical Chemistry Letters, Mar. 5, 2015, vol. 6, pp. 852-857.
Cowley et al., "Electroluminescence of γ—CuBr thin films via vacuum evaporation deposition," Journal of Physics D: Applied Physics, Apr. 8, 2010, vol. 43:165101, pp. 1-5.
Fai, T. K., "Investigating the Open-Circuit Voltage Deficit in Cu2ZnSn(S,Se)4 Solar Cells," Ph.D. Thesis. Nanyang Technological University: Singapore, 2015. 164 pages. (https://dr.ntu.edu.sg/bitstream/10356/66930/1/KongFaiTAI_PhD_Thesis.pdf).
Girifalco et al., "A Theory for the Estimation of Surface and Interfacial Energies. I. Derivation and Application to Interfacial Tension," J. Phys. Chem., Jul. 1, 1957, vol. 61, pp. 904-909.
Gomes et al., "Time-Resolved Four-Wave Mixing Experiments in CuCl," Phys. Status Solidi. B, May 1, 1990, vol. 159, pp. 101-106.
Gordon, R., "Criteria for Choosing Transparent Conductors," MRS Bulletin, Aug. 2000, vol. 25(08), pp. 52-57.
Gottschalch et al., "Copper iodide synthesized by iodization of Cu-films and deposited using MOCVD," Journal of Crystal Growth, available online May 3, 2017, vol. 471, pp. 21-28.
Gratzel, M., "The light and shade of perovskite solar cells," Nature Materials, Sep. 2014, vol. 13, p. 838-842.
Grundmann et al. "Cuprous iodide—a p-type transparent semiconductor: history and novel applications," Physica Status Solidi A, published online Aug. 15, 2013, vol. 210(9), pp. 1671-1703.
Heasley et al., "Vapor deposition of copper(I) bromide films via a two-step conversion process," J. Vac. Sci. Technol. A (Jan./Feb. 2017), published online Nov. 30, 2016, vol. 35(1):01B109, pp. 1-7.
Heasley et al., "Vapor Deposition of Transparent, p-Type Cuprous Iodide Via a Two-Step Conversion Process," ACS Appl. Energy Mater., Oct. 26, 2018, vol. 1(12), pp. 6953-6963.
Igumenov et al., "Volatile Precursors for Films Deposition: Vapor Pressure, Structure and Thermodynamics," Chapter 20 of Application of Thermodynamics to Biological and Materials Science, edited by Mizutani Tadashi, INTECH, Shanghai China, published online Jan. 14, 2011. (https://www.intechopen.com/books/1293). 28 pages.
International Search Report and Written Opinion mailed Feb. 4, 2021, in the International Application No. PCT/US20/37537. 13 pages.
Kim et al., "Thermal-strain-induced splitting of heavy- and light-hole exciton energies in CuI thin films grown by vacuum evaporation," Phys. Rev. B, Nov. 15, 1999, vol. 60(19), p. 13879-13884.
Knauth et al., "Semiconductor Properties of Polycrystalline CuBr by Hall Effect and Capacitive Measurements," Phys. Stat. Sol. A, Feb. 1998, vol. 165(2), pp. 461-465.
Krumpolec et al., "Structural and Optical Properties of Luminescent Copper(I) Chloride Thin Films Deposited by Sequentially Pulsed Chemical Vapour Deposition," Coatings, Oct. 18, 2018, vol. 8:369, pp. 1-16.
Liu et al., "Room-Temperature Solution-Synthesized p-Type Copper(I) Iodide Semiconductors for Transparent Thin-Film Transistors and Complementary Electronics," Adv. Mater., vol. 30:1802379, pp. 1-7.
Louwen et al., "A cost roadmap for silicon heterojunction solar cells," Solar Energy Materials and Solar Cells, available online Jan. 15, 2016, vol. 147, pp. 295-314.
Maydannik et al., "Atomic layer deposition of nanocrystallite arrays of copper(I) chloride for optoelectronic structures," J. Mater. Sci.: Mater. Electron., published online May 19, 2017, vol. 28(16), p. 11695-11701.
McMeekin et al., "A mixed-cation lead mixed-halide perovskite absorber for tandem solar cells," Science, Jan. 8, 2016, vol. 351(6269), pp. 151-155.
Mitra et al., "Optical properties of CuCl films on silicon substrates," Phys. Stat. Sol. B, Aug. 26, 2008, vol. 245(12), pp. 2808-2814.
Ong et al., "A New Fabrication Method for Low Stress PECVD—SiNx Layers," Journal of Physics: Conference Series, International MEMS Conference, May 9-12, 2006, vol. 34, pp. 764-769. (https://doi.org/10.1088/1742-6596/34/1/126).
Oxford Photovoltaics, "Making Our Cells," available online Mar. 16, 2015. 3 pages. (https://www.oxfordpv.com/Technology/How-Perovskite-Solar-Cells-Are-Made).
Oxford Photovoltaics, "Who we are," available online Mar. 12, 2015. 2 pages. (https://www.oxfordpv.com/About-us/Who-We-Are).
Patel, P., "Perovskites: Is there a reason for concern?" Materials Research Society/Energy Quarterly, materials360 online, Aug. 26, 2015. 3 pages. (http://www.materials360online.com/newsDetails/55418).
Phillips, D., "How first solar's tellurium deal shows the fragile economics of solar panels," CBS News, Money Watch, Nov. 29, 2010. 6 pages. (https://www.cbsnews.com/news/how-first-solars-tellurium-deal-shows-the-fragile-economics-of-solar-panels/).
Plus Plastic Electronics, "Perovskite solar cells coming to market in 2017, says start-up," available online Mar. 13, 2015. 3 pages. (https://www.plusplasticelectronics.com/energy/perovskite-solar-cells-coming-to-market-in-2017,-s).
Popov et al., "Atomic Layer Deposition of PbI2 Thin Films," Chemistry of Materials, Jan. 16, 2019, vol. 31, pp. 1101-1109.
Rusop et al., "Copper Iodide Thin Films as a p-Type Electrical Conductivity in Dye-Sensitized p-CuI|Dye|n-TiO2 Heterojunction Solid State Solar Cells," Surface Review and Letters (2004), vol. 11, pp. 577-583.

(56) References Cited

OTHER PUBLICATIONS

Seguin et al., "Preparation of thin films of copper(I) bromide by r.f. sputtering: morphology and electrical properties," Thin Solid Films, Jun. 1998, vol. 323, pp. 31-36.

Shah et al., "Photovoltaic Technology: The Case for Thin-Film Solar Cells," Science, Jul. 30, 1999, vol. 285, pp. 692-698.

Shockley et al., "Detailed Balance Limit of Efficiency of p—n Junction Solar Cells," Journal of Applied Physics, Mar. 1961, vol. 32(3), pp. 510-519.

Sievers et al., "Volatile Metal Complexes," Science, Jul. 21, 1978, vol. 201, No. 4352, pp. 217-223.

Sirimanne et al., "Characterization of transparent conducting CuI thin films prepared by pulse laser deposition technique," Chemical Physics Letters, Dec. 20, 2002, vol. 366(5-6), pp. 485-489.

Tanaka et al., "Transparent, conductive CuI films prepared by rf—dc coupled magnetron sputtering," Thin Solid Films, Aug. 1, 1996, vol. 281-282, pp. 179-181.

Wijekoon et al., "Characterization of copper iodide thin films fabricated via laser-assisted molecular-beam deposition," Journal of Applied Physics, Nov. 1993, vol. 74(9), pp. 5767-5772.

Yamada et al., "Truly Transparent p-Type $\gamma$—CuI Thin Films with High Hole Mobility," Chem. Mater., Jul. 1, 2016, vol. 28(14), pp. 4971-4981.

Yamamoto et al., "Degradation mechanism for planar heterojunction perovskite solar cells," Japanese Journal of Applied Physics, published online Mar. 9, 2016, vol. 55:04ES07, pp. 1-4.

Yanase et al., "Two different in-plane orientations in the growths of cuprous halides on MgO(001)," Surface Science, May 20, 1995, vol. 329(3), pp. 219-226.

Yang et al. "Room-temperature synthesized copper iodide thin film as degenerate p-type transparent conductor with a boosted figure of merit," Proc. Natl. Acad. Sci., Nov. 15, 2016, vol. 113(46), pp. 12929-12933.

Zhu et al., "Transparent Inorganic Copper Bromide (CuBr) p-Channel Transistors Synthesized From Solution at Room Temperature," IEEE Electron Device Letters, May 2019, vol. 40(5), pp. 769-772.

\* cited by examiner 600 cycles, 0.1 second wait time, $T_{i,\ in\ situ}$ 87.1 °C, $T_b$ 35 °C, 300 nm $SiO_2$ on Si Overlay of spectra in FIGS. 25I-M

COPPER HALIDE LAYERS

CROSS REFERENCE TO RELATED APPLICATIONS

This application is a National Stage Entry of PCT International Application No. PCT/US2020/037537, filed Jun. 12, 2020, which claims the benefit and priority of U.S. Provisional Patent Application No. 62/860,579, filed Jun. 12, 2019, the contents of each of which are hereby incorporated by reference in their entirety.

STATEMENT REGARDING FEDERALLY SPONSORED RESEARCH OR DEVELOPMENT

This invention was made with government support under 1541959 and 1764338 awarded by the National Science Foundation and FA8650-15-C-7543 awarded by the U.S. Air Force Office of Scientific Research. The government has certain rights in the invention.

INCORPORATION BY REFERENCE

All patents, patent applications, and publications cited herein are hereby incorporated by reference in their entirety in order to more fully describe the state of the art as known to those skilled therein as of the date of the invention described herein.

FIELD OF THE INVENTION

The present disclosure relates generally to the field of material layers. More particularly, the present disclosure relates to copper halide layers.

SUMMARY OF THE INVENTION

In one aspect, an article includes:
a substrate; and
a copper halide layer on the substrate;
where the interfacial free energy between the substrate and the copper halide layer allows the copper halide layer to be free of discontinuations of sizes of about 5 nm$^2$ or greater; and
where the copper halide layer conforms to the shape of the substrate.

In any one of the embodiments described herein, the substrate further includes an adhesion layer conformally formed on the substrate; and
the copper halide layer is on the adhesion layer;
where the interfacial free energy between the substrate or the adhesion layer and the copper halide layer allows the copper halide layer to be free of discontinuations of sizes of about 5 nm$^2$ or greater; and
where the copper halide layer conforms to the shape of the adhesion layer.

In any one of the embodiments described herein, the copper halide comprises a compound of formula $CuF_aCl_bBr_dI_e$, where a, b, d, and e are independently between 0 and 1, inclusive, and the sum of a, b, d, and e is 1.

In any one of the embodiments described herein, the copper halide is CuF, CuCl, CuBr, or CuI.

In any one of the embodiments described herein, the copper halide is CuBr.

In any one of the embodiments described herein, the copper halide is CuI.

In any one of the embodiments described herein, the substrate is selected from the group consisting of a metal, a metalloid, a metal halide, a metal oxide, a metal nitride, glassy carbon, a semiconductor wafer, plastic, glass, and a combination thereof.

In any one of the embodiments described herein, the metal is platinum, titanium, gold, or a combination thereof.

In any one of the embodiments described herein, the metalloid is silicon.

In any one of the embodiments described herein, the metal halide is NaCl or a perovskite.

In any one of the embodiments described herein, the perovskite includes methylammonium tin trishalide, methylammonium lead trishalide, cesium tin trishalide, cesium lead trishalide, formamidinium tin trishalide, formamidinium lead trishalide, or a combination thereof.

In any one of the embodiments described herein, the metal oxide is $SiO_2$, $Al_2O_3$, $TiO_2$, quartz, or a combination thereof.

In any one of the embodiments described herein, the metal nitride is silicon nitride, manganese nitride, or a combination thereof.

In any one of the embodiments described herein, the silicon nitride includes silicon oxynitride at its surface.

In any one of the embodiments described herein, the semiconductor wafer includes silicon, a mixture of silicon and $SiO_2$, GaAs, silicon carbide, or gallium nitride.

In any one of the embodiments described herein, the semiconductor wafer includes a mixture of silicon and $SiO_2$.

In any one of the embodiments described herein, the substrate has a thickness of between about 1 nm and about 1 cm.

In any one of the embodiments described herein, the substrate has a thickness of between about 1 nm and about 1 mm.

In any one of the embodiments described herein, the adhesion layer is selected from the group consisting of a metal, a metalloid, a metal halide, a metal oxide, a metal nitride, glassy carbon, a semiconductor wafer, plastic, glass, and a combination thereof.

In any one of the embodiments described herein, the adhesion layer has a thickness of between about 1 nm and about 1000 nm.

In any one of the embodiments described herein, the adhesion layer has a thickness of between about 40 nm and about 300 nm.

In any one of the embodiments described herein, the article is optically transparent.

In any one of the embodiments described herein, the article has a transmittance of greater than about 80% over the wavelength range from about 400 nm to about 800 nm.

In any one of the embodiments described herein, the article is electrically conductive.

In any one of the embodiments described herein, the resistivity of the article is between about 0.00375 Ω·cm and about 20 Ω·cm.

In any one of the embodiments described herein, the sheet resistance of the article is between about $2.5 \times 10^2$ Ω·sq$^{-1}$ and about $2 \times 10^6$ Ω·sq$^{-1}$.

In any one of the embodiments described herein, the hole concentration of the article is between about $1 \times 10^{17}$ cm$^{-3}$ and about $1 \times 10^{19}$ cm$^{-3}$.

In any one of the embodiments described herein, the mobility of the article is between about 0.07 cm$^2$V$^{-1}$ s$^{-1}$ and about 10 cm$^2$ V$^{-1}$ s$^{-1}$.

In any one of the embodiments described herein, the electrical conductivity of the copper halide layer is p-type.

In any one of the embodiments described herein, the surface free energy of the copper halide layer, the substrate, or the adhesion layer is between about 0 mJ/m$^2$ to about 50 mJ/m$^2$.

In any one of the embodiments described herein, the copper halide layer has a thickness of between about 50 nm to about 1000 nm.

In any one of the embodiments described herein, the copper halide layer is CuBr and the substrate is selected from the group consisting of silicon nitride, platinum, SiO$_2$, Al$_2$O$_3$, and glassy carbon.

In any one of the embodiments described herein, the copper halide layer is CuBr, the adhesion layer is silicon nitride or platinum, and the substrate is selected from the group consisting of SiO$_2$, quartz, silicon, and a SiO$_2$/Si wafer.

In any one of the embodiments described herein, the copper halide layer is CuI and the substrate is selected from the group consisting of silicon nitride, platinum, SiO$_2$, Al$_2$O$_3$, and glassy carbon.

In any one of the embodiments described herein, the copper halide layer is CuI, the adhesion layer is silicon nitride or platinum, and the substrate is selected from the group consisting of SiO$_2$, quartz, silicon, and a SiO$_2$/Si wafer.

In any one of the embodiments described herein, an optoelectronic device includes the article as described in any one of the embodiments described herein.

In any one of the embodiments described herein, the optoelectronic device is selected from the group consisting of perovskite solar cells, dye-sensitized solar cells, photonic emitters, electrooptic modulators, optical fibers, four-wave mixing devices, flat-panel displays, thin-film transistors, and a combination thereof.

In another aspect, a method of fabricating an article includes:
providing a substrate; and
depositing a copper halide layer on the substrate using a chemical vapor deposition process;
where the interfacial free energy between the substrate and the copper halide layer allows the copper halide layer to form free of discontinuations of sizes of about 5 nm$^2$ or greater; and
where the copper halide layer conforms to the shape of the substrate.

In any one of the embodiments described herein,
the substrate further includes an adhesion layer; and
the copper halide layer is deposited on the adhesion layer using a chemical vapor deposition process;
where the interfacial free energy between the substrate or adhesion layer and the copper halide layer allows the copper halide layer to form free of discontinuations of sizes of about 5 nm$^2$ or greater; and
where the copper halide layer conforms to the shape of the substrate or adhesion layer.

In any one of the embodiments described herein, the chemical vapor deposition process comprises a pulsed chemical vapor deposition.

In any one of the embodiments described herein, the pulsed chemical vapor deposition includes reaction of a compound $Q_mL_nX_y$ with a copper (I) precursor compound to form a copper halide layer 102, where:
Q is a metal or carbon;
L is hydrogen, oxygen, alkyl, cycloalkyl, aryl, heteroalkyl, heterocycloalkyl, heteroaryl, a metal ligand, or a combination thereof;
X is a halogen; and
m, n, and y are each independently 0 or an integer.

In any one of the embodiments described herein, Q is a metal selected from the group consisting of Li, Be, Mg, Ca, Sr, Ba, Sc, Y, La, Ti, Zr, Hf, V, Nb, Ta, Cr, Mo, W, Mn, Re, Fe, Ru, Os, Co, Rh, Ir, Ni, Pd, Pt, Cu, Ag, Zn, Cd, Hg, B, Al, Ga, In, Ge, Sn, Pb, As, Sb, Bi, Te, Ce, Pr, Nd, Sm, Eu, Gd, Tb, Dy, Ho, Er, Tm, Yb, Lu, and a combination thereof.

In any one of the embodiments described herein, L is a metal ligand selected from the group consisting of oxygen, chloride, iodide, bromine, sulfide, thiocyanate, nitrate, azide, fluoride, hydroxide, oxalate, water, nitrite, isothiocyanate, acetonitrile, pyridine, ammonia, ethylenediamine, 2,2'-bipyridine, 1,10-phenanthroline, nitrite, triphenylphosphine, cyanide, carbon monoxide, acetylacetonate, alkene, aminopolycarboxylic acid (1,2-bis(O-aminophenoxy)ethane-N, N,N',N'-tetraacetic acid, benzene, 1,2-bis(diphenylphosphino)ethane, 1,2-bis(diphenylphosphino)methane, corroles, 2,2,2-cryptand, cryptates, cyclopentadienyl, diethylenetriamine, dimethylglyoxime, 1,4,7,10-tetraazacyclodecane-1,4,7,10-tetraacetic acid, diethylenetriaminepentaacetic acid, ethylenediaminetetraacetic acid, ethylenediaminetriacetate, ethyleneglycolbis(oxyethylenenitrilo)tetraacetate, fura-2, glycinate, porphyrins, iminodiacetic acid, nicotinamide, nitrosyl, nitrilotriacetic acid, oxo, pyrazine, scorpionate ligand, sulfite, 2,2'; 6',2"-terpyridine, triazacyclononane, tricyclohexylphosphine, triethylenetetramine, trimethylphosphine, tris(o-tolyl)phosphine, tris(2-aminoethyl)amine, tris(2-aminoethyl)amine, tris(2-diphenylphosphineethyl)amine, tropylium, carbon dioxide, phosphorous trihalide, hexafluoroacetylacetonate, trifluoroacetylacetonate, 2,2,6,6-tetramethyl-3,5-heptanedionate, and a combination thereof.

In any one of the embodiments described herein, m is 0, and n and y are both 1, L is hydrogen, and X is Cl, Br, or I.

In any one of the embodiments described herein, m, n, and y are integers, Q is carbon, L is hydrogen, and X is F, Cl, Br, or I.

In any one of the embodiments described herein, m is 1 and n is 3.

In any one of the embodiments described herein, m and y are integers, n is 0, Q is a metal, and X is selected from F, Cl, Br, or I.

In any one of the embodiments described herein, the copper(I) precursor compound is a compound of formula Cu(A)(L), where:
A is a β-diketonate ligand; and
B is a Lewis base.

In any one of the embodiments described herein, A is selected from the group consisting of hexafluoroacetylacetonate, acetylacetonate, trifluoroacetylacetonate, and 2,2,6, 6-tetramethyl-3,5-heptanedionate.

In any one of the embodiments described herein, B is unsaturated.

In any one of the embodiments described herein, B includes C$_1$-C$_8$ alkyl groups, C$_1$-C$_8$ alkoxy groups, silyl groups, or a combination thereof.

In any one of the embodiments described herein, B includes ethyl, propyl, butyl, pentyl, hexyl, octyl, aryl, ethoxy, propoxy, butoxy, pentyloxy, hexyloxy, heptyloxy, octyloxy, aryloxy, groups, or a combination thereof.

In any one of the embodiments described herein, B includes bis(trimethylsilyl)acetylene, vinyltrimethylsilane, 1,5-cyclooctadiene, 2-butyne, 2-methyl-1-hexen-3-yne, hex-3-yn-1-ene, or a combination thereof.

In any one of the embodiments described herein, B is provided as a mixture with hexafluoroacetylacetone, hexafluoroacetylacetone dihydrate, water, or a combination thereof, where the mixture modulates deposition rate, precursor stability, reaction conditions, or a combination thereof.

In any one of the embodiments described herein, the copper(I) precursor compound is vinyltrimethylsilane (hexafluoroacetylacetonato)copper(I).

In any one of the embodiments described herein, the copper halide layer is deposited on the substrate or adhesion layer at a temperature between about 60° C. and about 200° C.

In any one of the embodiments described herein, the chemical vapor deposition includes between about 100 to about 5000 cycles.

In any one of the embodiments described herein, the chemical vapor deposition includes between about 500 to about 1000 cycles.

In any one of the embodiments described herein, the chemical vapor deposition includes:
  (1) an evacuation of a reaction chamber;
  (2) a pulse of vinyltrimethylsilane(hexafluoroacetylacetonato)copper(I) with an inert carrier gas into the reaction chamber;
  (3) a pulse of HCl, HBr, or HI into the reaction chamber;
  (4) a delay time of about 0.1 seconds to about 5 seconds to allow the reaction between vinyltrimethylsilane (hexafluoroacetylacetonato)copper(I) and HCl, HBr, or HI to occur; and
  (5) a purge of the reaction chamber with an inert gas.

In any one of the embodiments described herein, the chemical vapor deposition includes:
  (1) an evacuation of a reaction chamber;
  (2) a pulse of vinyltrimethylsilane(hexafluoroacetylacetonato)copper(I) with an inert carrier gas into the reaction chamber;
  (3) a pulse of HBr into the reaction chamber;
  (4) a delay time of about 0.1 to about 5 seconds to allow the reaction between vinyltrimethylsilane(hexafluoroacetylacetonato)copper(I) and HBr to occur; and
  (5) a purge of the reaction chamber with an inert gas.

In yet another aspect, a method of fabricating a CuCl, CuBr, or CuI layer includes:
  providing a substrate; and
  depositing the CuCl, CuBr, or CuI layer on the substrate using a chemical vapor deposition process,
  where the chemical vapor deposition process comprises a reaction between vinyltrimethylsilane(hexafluoroacetylacetonato)copper(I) and a hydrogen halide selected from the group consisting of HCl, HBr, and HI.

In any one of the embodiments described herein,
  the substrate further comprises an adhesion layer; and
  the CuCl, CuBr, or CuI layer is deposited on the adhesion layer using the chemical vapor deposition process,
  where the chemical vapor deposition process comprises the reaction between vinyltrimethylsilane(hexafluoroacetylacetonato)copper(I) and a hydrogen halide selected from the group consisting of HCl, HBr, and HI.

In any one of the embodiments described herein, the CuCl, CuBr, or CuI layer conforms to the shape of the substrate.

In any one of the embodiments described herein, the CuCl, CuBr, or CuI layer conforms to the shape of the adhesion layer.

In any one of the embodiments described herein, the interfacial free energy between the substrate and the CuCl, CuBr, or CuI layer allows the CuCl, CuBr, or CuI layer to form free of discontinuations of sizes of about 5 $nm^2$ or greater.

In any one of the embodiments described herein, the interfacial free energy between the adhesion layer and the CuCl, CuBr, or CuI layer allows the CuCl, CuBr, or CuI layer to form free of discontinuations of sizes of about 5 $nm^2$ or greater.

Any aspect or embodiment disclosed herein may be combined with another aspect or embodiment disclosed herein. The combination of one or more embodiments described herein with other one or more embodiments described herein is expressly contemplated.

Unless otherwise defined, used, or characterized herein, terms that are used herein, including technical and scientific terms, are to be interpreted as having a meaning that is consistent with their accepted meaning in the context of the relevant art and are not to be interpreted in an idealized or overly formal sense unless expressly so defined herein.

Although the terms, first, second, third, etc., may be used herein to describe various elements, these elements are not to be limited by these terms. These terms are simply used to distinguish one element from another. Thus, a first element could be termed a second element without departing from the teachings of the exemplary embodiments. Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90° or at other orientations) and the spatially relative descriptors used herein interpreted accordingly. Further still, in this disclosure, when an element is referred to as being "linked to," "on," "connected to," "coupled to," "in contact with," etc., another element, it may be directly linked to, on, connected to, coupled to, or in contact with the other element or intervening elements may be present unless otherwise specified.

The terminology used herein is for the purpose of describing particular embodiments and is not intended to be limiting. As used herein, singular forms, such as "a" and "an," are intended to include the plural forms as well, unless the context indicates otherwise. The term "about" as used herein can describe a range of a recited value, including ±10%, ±5%, ±2%, or ±1% of the value. The terms "includes," "including," "comprises," and "comprising" specify the presence of the stated elements or steps but do not preclude the presence or addition of one or more other elements or steps.

BRIEF DESCRIPTION OF THE DRAWINGS

The invention is described with reference to the following figures, which are presented for the purpose of illustration only and are not intended to be limiting. In the Drawings.

DETAILED DESCRIPTION OF THE INVENTION

Figure 1A:
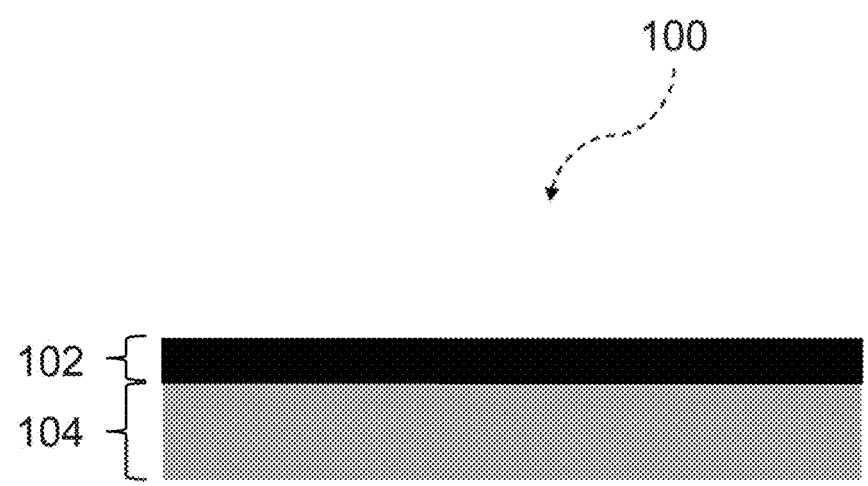
FIG. 1A shows a copper halide layer deposited on a substrate, according to one or more embodiments.

Several modern electronic devices use semiconductors. These semiconductors can include articles including n-type electron transport layers and p-type hole transport layers, where the layers can be deposited on a substrate. In some embodiments, certain optoelectronic devices (e.g., photovoltaics, perovskite solar cells, and flat-panel displays) can require that these layers, for example, have a wide bandgap, have a high charge carrier mobility, be optically transparent, have a thickness of a few nanometers, have a smooth surface, and be continuous across a given substrate and conform to the shape thereof. In some embodiments, the need to fulfill two or more of these criteria simultaneously makes finding suitable materials and fabrication methods for these layers challenging, particularly for p-type hole transport layers.

One example of a class of material that can, in theory, be used to fabricate wide bandgap, high charge carrier mobility, and optically transparent layers is copper halides of the formula $CuF_aCl_bBr_dI_e$, where a, b, d, and e are independently between 0 and 1, inclusive, and the sum of a, b, d, and e is 1. As used herein, the term "copper halide layer" is understood to include compounds of formula $CuF_aCl_bBr_dI_e$, as defined above.

However, copper halides do not easily wet certain surfaces (e.g., metal oxides) and, thus, existing CuBr or CuI layers are not fully continuous across a given substrate and do not fully conform to the shape of that substrate. An example of a non-continuous copper halide layer is one that forms islands of copper halide at various locations on the surface.

Applicants have surprisingly found that using a substrate with a surface free energy that is matched to the surface free energy of the copper halide can enable copper halide layers that are continuous across at least a portion of the substrate and conform to its shape. In some embodiments, the substrate inherently has a surface free energy matched to that of the copper halide, thus the copper halide layer can be deposited directly on the substrate. In some embodiments, such as where the substrate does not inherently have a surface free energy matched to that of the copper halide, an adhesion layer can be provided on the substrate, where the surface free energy of the adhesion layer is matched to that of the copper halide. In some embodiments, the copper halide layer is deposited on the substrate, on the adhesion layer, or a combination thereof. In some embodiments, the resulting copper halide layers can be, for example, optically transparent in the visible range and p-type hole transport layers, and can have a high charge carrier mobility.

In some embodiments, the change in free energy resulting from bringing together a surface of material α and a surface of material β is $\Delta G_{\alpha\beta} = -2 \times ((\gamma_\alpha^d \gamma_\beta^d)^{0.5} + (\gamma_\alpha^p \gamma_\beta^p)^{0.5})$, where $\gamma_\alpha^d$ and $\gamma_\alpha^p$ are the dispersive and polar components, respectively, of the surface free energy of material α, and $\gamma_\beta^d$ and $\gamma_\beta^p$ are the dispersive and polar components, respectively, of the individual surface free energy of material β. In some embodiments, the material α is a copper halide layer and the material β is a substrate or adhesion layer, and vice versa. In some embodiments, the surface free energy of α (e.g., copper halide layer) and β (e.g., substrate or adhesion layer) are matched if $\gamma_{CuBr}^d$ is similar in value to $\gamma_s^d$ and $\gamma_{CuBr}^p$ is similar in value to $\gamma_s^p$. In some embodiments, $\gamma_{CuI}^d$ is about 30 mJ/m². In some embodiments, $\gamma_{CuI}^p$ is about 13 mJ/m². In some embodiments, $\gamma_{SiO2}^d$ is about 33 mJ/m². In some embodiments, $\gamma_{SiOs2}^p$ is about 29 mJ/m². In some embodiments, $\gamma_{CuI}^d$ is about 30 mJ/m², $\gamma_{CuI}^p$ is about 13 mJ/m², $\gamma_{SiO2}^d$ is about 33 mJ/m², and $\gamma_{SiO2}^p$ is about 29 mJ/m².

In some embodiments, the difference between the dispersive and polar components of the surface free energies of the substrate and adhesion layer and the dispersive and polar components of the surface free energies of the copper halide layer can indicate the degree of surface free energy matching, or interfacial free energy matching, between the substrate/adhesion layer and the copper halide layer. In some embodiments, the surface free energy of the substrate or adhesion layer and the surface free energy of the copper halide layer are matched if, for example, the difference between the polar components of their respective surface free energies are less than or equal to about 55%. For example, in some embodiments, CuI may not wet SiO₂ well. In these embodiments, the dispersive values for CuI are (33-30)/33=9% different, but the polar values are (29-13)/29=55% different. In some embodiments, the observed discontinuity in CuI films on SiO₂ surfaces may result from the large difference between the polar component of the SiO₂ surface free energy and the polar component of the CuI surface free energy. Therefore, in some embodiments, the surface free energy of SiO₂ can be considered not well-matched to the surface free energy of CuI.

In some embodiments, the surface free energy of the substrate and the surface free energy of the copper halide are matched if continuous films of the copper halide can be grown on the substrate. In some embodiments, when the surface free energy of the substrate and the surface free energy of the copper halide are not matched, islanded regions of copper halide can result.

In one aspect, as shown in FIG. 1A, an article 100 includes a copper halide layer 102 on a substrate 104. In some embodiments, the substrate 104 has a surface free energy that matches the surface free energy of the copper halide, which enables the copper halide layer 102 to form continuously over a lateral dimension of the substrate 104. In some embodiments, the copper halide layer 102 conforms to the shape of the substrate 104.

Figure 1B:
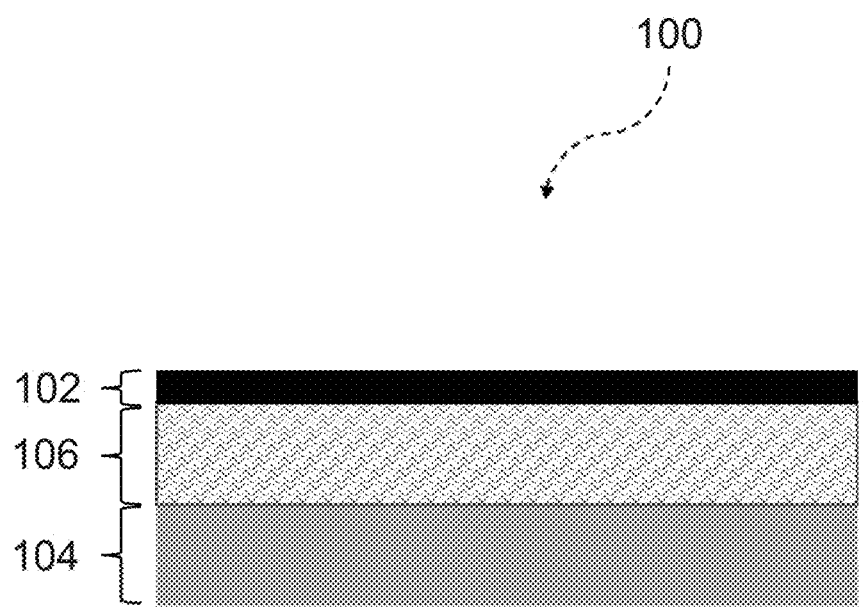
FIG. 1B shows an adhesion layer on a substrate and a copper halide layer deposited on the adhesion layer, according to one or more embodiments.

In some embodiments, as shown in FIG. 1B, the article 100 includes the substrate 104, the copper halide layer 102, and an adhesion layer 106 in-between the substrate 104 and the copper halide layer 102, where the adhesion layer 106 contacts at least a portion of the substrate 104 and the copper halide layer 102. In some embodiments, the adhesion layer 106 and/or substrate 104 has a surface free energy that matches the surface free energy of the copper halide, which enables the copper halide layer 102 to form continuously over the lateral dimension of the adhesion layer 106 and/or substrate 104. In some embodiments, the copper halide layer 102 conforms to the shape of the adhesion layer 106 and/or substrate 104.

In some embodiments, a method of fabricating the article 100 includes providing a substrate 104 and depositing a copper halide layer 102 on the substrate using, for example, a CVD process. In some embodiments, the CVD process is a pulsed-CVD ("pCVD") process. In some embodiments, the substrate 104 has a surface free energy that matches the surface free energy of the copper halide, which enables the copper halide layer 102 to form continuously over a lateral dimension of the substrate 104. In some embodiments, the copper halide layer 102 conforms to the shape of the substrate 104.

In some embodiments, the method of fabricating the article 100 includes providing the substrate 104 and providing the adhesion layer 106 on one or more surfaces of the substrate 104. In some embodiments, the copper halide layer 102 is deposited on the adhesion layer 106 using, for example, a CVD or pCVD process. In some embodiments, the adhesion layer 106 and/or substrate 104 has a surface free energy that matches the surface free energy of the copper halide, which enables the copper halide layer 102 to form continuously over a lateral dimension of the adhesion layer 106 and/or substrate 104. In some embodiments, the copper halide layer 102 conforms to the shape of the adhesion layer 106 and/or adhesion layer 104. In some embodiments, the copper halide layer 102 and the adhesion layer 106 together conform to the shape of the substrate 104.

In some embodiments, the copper halide layer is free of discontinuations of greater than about 5 nm² in size across its surface area. In some embodiments, the copper halide layer is free of discontinuations of greater than about 5 nm² in size across the surface of the substrate 104 and/or adhesion layer 106. In some embodiments, the copper halide layer is free of discontinuations of greater than about 5 nm² in size across about 99% of its surface area. In some embodiments, the copper halide layer is free of discontinuations of greater than about 5 nm² in size across about 99% of the substrate 104 and/or adhesion layer 106. In some embodiments, the copper halide layer is free of discontinuations of greater than about 5 nm² in size across a 1 μm² area of its surface. In some embodiments, the copper halide layer is free of discontinuities of greater than about 5 nm² in size across a 1 µm² area of the substrate 104 and/or adhesion layer 106.

Copper Halide

In some embodiments, the copper halide is described by formula $CuF_aCl_bBr_dI_e$, where a, b, d, and e are independently between 0 and 1, inclusive, and the sum of a, b, d, and e is 1. In some embodiments, the copper halide includes CuF, CuCl, CuBr, CuI, or a combination thereof. In some embodiments, the copper halide is CuF. In some embodiments, the copper halide is CuCl. In some embodiments, the copper halide is CuBr. In some embodiments, the copper halide is CuI.

Substrate

In some embodiments, the substrate 104 is selected from the group consisting of a metal, a metalloid, a metal halide, a metal oxide, a metal nitride, glassy carbon, a semiconductor wafer, plastic, glass, and a combination thereof.

In some embodiments, the substrate includes a metal. Non-limiting examples of metals include platinum, titanium, gold, and a combination thereof. In some embodiments, the substrate includes platinum. In some embodiments, the substrate includes titanium. In some embodiments, the substrate includes gold. In some embodiments, the substrate includes a metalloid. In some embodiments, the metalloid includes silicon. In some embodiments, the substrate includes silicon.

In some embodiments, the substrate includes a metal halide. Non-limiting examples of metal halides include NaCl and a perovskite. In some embodiments, the perovskite includes methylammonium tin trishalide, methylammonium lead trishalide, cesium tin trishalide, cesium lead trishalide, formamidinium tin trishalide, formamidinium lead trishalide, or a combination thereof.

In some embodiments, the substrate includes a metal oxide. Non-limiting examples of metal oxides include $SiO_2$, $Al_2O_3$, $TiO_2$, quartz, and a combination thereof. In some embodiments, the substrate includes $SiO_2$. In some embodiments, the substrate includes $Al_2O_3$. In some embodiments, the substrate includes $TiO_2$. In some embodiments, the substrate includes quartz.

In some embodiments, the substrate includes a metal nitride. Non-limiting examples of metal nitrides include SiN, manganese nitride, and a combination thereof. In some embodiments, the substrate is SiN. In some embodiments, the substrate is manganese nitride. In some embodiments, the SiN is represented by the formula $SiN_X$, where X is an integer from 0.9 to 1.1. In some embodiments, the surface of the SiN includes silicon oxynitride.

In some embodiments, the substrate includes a semiconductor wafer. Non-limiting examples of semiconductor wafers include silicon, a mixture of silicon and $SiO_2$, GaAs, silicon carbide, and gallium nitride.

In some embodiments, the substrate includes a single monolithic material, e.g., a pure silicon wafer, a glassy carbon planchet, or a thin sample of quartz. In some embodiments, the substrate includes a two-layer material, e.g., a $SiO_2$/Si wafer. In some embodiments, the substrate includes thin fibers or nanowires of any of the materials described herein.

In some embodiments, the substrate includes glassy carbon or polished carbon. In some embodiments, the substrate includes plastic. In some embodiments, the substrate includes glass.

The substrate can have any thickness that supports a copper halide layer as described herein. In some embodiments, the substrate has a thickness of between about 1 nm and about 1 cm. In some embodiments, the substrate has a thickness of between about 1 nm and about 1 mm. In some embodiments, the substrate has a thickness of between about 1 nm and 1 µm.

Adhesion Layer

In some embodiments, the adhesion layer 106 is selected from the group consisting of a metal, a metalloid, a metal halide, a metal oxide, a metal nitride, glassy carbon, a semiconductor wafer, plastic, glass, and a combination thereof.

In some embodiments, the adhesion layer includes a metal. Non-limiting examples of metals include platinum, titanium, gold, and a combination thereof. In some embodiments, the adhesion layer includes platinum. In some embodiments, the adhesion layer includes titanium. In some embodiments, the adhesion layer includes gold. In some embodiments, the adhesion layer includes a metalloid. In some embodiments, the metalloid includes silicon. In some embodiments, the adhesion layer includes silicon.

In some embodiments, the adhesion layer includes a metal halide. Non-limiting examples of metal halides include NaCl and a perovskite. In some embodiments, the perovskite includes methylammonium tin trishalide, methylammonium lead trishalide, cesium tin trishalide, cesium lead trishalide, formamidinium tin trishalide, formamidinium lead trishalide, or a combination thereof.

In some embodiments, the adhesion layer includes a metal oxide. Non-limiting examples of metal oxides include $SiO_2$, $Al_2O_3$, $TiO_2$, quartz, and a combination thereof. In some embodiments, the adhesion layer includes $SiO_2$. In some embodiments, the adhesion layer includes $Al_2O_3$. In some embodiments, the adhesion layer includes $TiO_2$. In some embodiments, the adhesion layer includes quartz.

In some embodiments, the adhesion layer includes a metal nitride. Non-limiting examples of metal nitrides include SiN, manganese nitride, and a combination thereof. In some embodiments, the adhesion layer is SiN. In some embodiments, the adhesion layer is manganese nitride. In some embodiments, the SiN is represented by the formula $SiN_X$, where X is from 0.9 to 1.1. In some embodiments, the surface of the SiN includes silicon oxynitride.

In some embodiments, the adhesion layer includes a semiconductor wafer. Non-limiting examples of semiconductor wafers include silicon wafers, wafers including a mixture of silicon and $SiO_2$, or GaAs wafers.

In some embodiments, the adhesion layer includes a single monolithic material, e.g., a pure silicon wafer, a glassy carbon planchet, or a thin sample of quartz. In some embodiments, the adhesion layer includes a two-layer material, e.g., a $SiO_2$/Si wafer. In some embodiments, the adhesion layer includes thin fibers or nanowires of any of the materials described herein.

In some embodiments, the adhesion layer includes glassy carbon or polished carbon. In some embodiments, the adhesion layer includes plastic. In some embodiments, the adhesion layer includes glass.

The adhesion layer may have any thickness that supports a copper halide layer as described herein. In some embodiments, the adhesion layer has a thickness of between about 1 nm and about 1 cm. In some embodiments, the adhesion layer has a thickness of between about 1 nm and about 1 mm. In some embodiments, the adhesion layer has a thickness of between about 1 nm and 1 µm. In some embodiments, the adhesion layer has a thickness of about 1, 10, 50, 100, 200, 300, 400, 500, 600, 700, 800, 900, or 1000 nm. In some embodiments, the adhesion layer has a thickness of between about 40 nm and about 300 nm. In some embodiments, the adhesion layer has a thickness of about 40 nm. In some embodiments, the adhesion layer has a thickness of about 300 nm.

Surface Free Energy

In some embodiments, the surface free energies of the copper halide layer, the substrate, or the adhesion layer can be obtained using, for example, wetting angle experiments to measure the polar and dispersive components of the surface free energies. See, for example, Girifalco et al. (1957), "A Theory for the Estimation of Surface and Interfacial Energies. I. Derivation and Application to Interfacial Tension," J. Phys. Chem., Vol. 61, pp. 904-909; and Heasley et al. (2018), "Vapor Deposition of Transparent, p-Type Cuprous Iodide Via a Two-Step Conversion Process," *ACS Appl. Energy Mater.*, Vol. 1, pp. 6953-6963. In some embodiments, the surface free energies can be used to quantify the degree of matching between the copper halide layer and the substrate or adhesion layer. In some embodiments, the surface free energy of the copper halide layer, substrate, or adhesion layer is between about 0 mJ/m$^2$ to about 50 mJ/m$^2$. In some embodiments where the copper halide layer 102 is CuBr, the surface free energy is about 37 mJ/m$^2$ for the dispersive component and about 0 mJ/m$^2$ for the polar component. In some embodiments where the copper halide layer 102 is CuI, the surface free energy is about 30 mJ/m$^2$ for the dispersive component and about 12 mJ/m$^2$ for the polar component.

Copper Halide Layer

In some embodiments, the copper halide layer has a thickness of about 50 to about 1000 nm. In some embodiments, the copper halide layer has a thickness of about 50 to about 200 nm. In some embodiments, the copper halide layer has a thickness of about 70 nm to about 120 nm. In some embodiments, the copper halide layer has a thickness of about 50, 60, 70, 80, 90, 100, 120, 200, 300, 400, 500, 600, 700, 800, 900, or 1000 nm.

In some embodiments, the copper halide layer is smooth across at least a portion of its surface area.

In some embodiments, the copper halide layer is continuous. In some embodiments the copper halide layer may be composed of copper halide grains that are tightly packed, such that there are few to no voids between the grains. In some embodiments, the copper halide layer may be composed of amorphous dense copper halide material that is monolithic, i.e., without well-defined grains.

In some embodiments, "continuous," as it relates to the morphology of the copper halide layer, includes a film that has no discontinuities (e.g., pin-holes, holes, pores, gaps, or voids) or that covers the entire surface of the substrate or adhesion layer. In certain embodiments, a copper halide layer that is 99% continuous includes discontinuities (e.g., holes or pin-holes) over about 1% of the surface of the substrate or adhesion layer, when viewed top-down.

In some embodiments, continuity is a function of the distance of the substrate or adhesion layer from the reactor inlet of the tube furnace (see FIG. 2B) during CVD. In some embodiments, a continuous copper halide layer is obtained when the substrate or adhesion layer is placed at a distance of 0.5 in away from the reactor inlet. In some embodiments, a discontinuous copper halide layer is obtained with the substrate or adhesion layer is placed at a distance of 12 in away from the reactor inlet. Without wishing to be bound by any one theory, as the distance from the reactor inlet increases, the gas stream becomes more depleted of precursor material, thus leading to uneven deposition of said precursors on a substrate or adhesion layer that is, for example, 12 in away from the inlet.

In some embodiments, continuity can be assessed via SEM. In some embodiments, discontinuations in the copper halide layer can be visible as, for example, holes through the layer in a manner that depends upon the detector mode of the scanning electron microscope. For example, in some embodiments, secondary electron images capture the topographical elements of the copper halide layer. As another example, in some embodiments, back-scattered electron images will capture the difference in the nuclear charge across the copper halide layer (i.e., Z-contrast). In other embodiments, other types of detectors, and combinations thereof, can capture these and additional elements of the copper halide layer. In some embodiments, discontinuations can be detected via SEM images if the discontinuations are on the order of the resolution of the microscope or larger. In these embodiments, the resolution can depend upon the instrument and the imaging voltage, and can be, for example, 10 nm, 2 nm, 1 nm, or sub-nm resolution. In some embodiments, SEM can be used to measure the dimensions of the discontinuations.

In some embodiments, continuity can be assessed by XPS surface scans, because at least some discontinuations in the copper halide layer may give rise to signals from the substrate or adhesion layer below the copper halide layer. In these embodiments, such discontinuations can include about 1% of the surface area of the copper halide layer when viewed top-down. In some embodiments, continuity can be assessed by energy-dispersive X-ray spectroscopy ("EDX"). In some embodiments, EDX can penetrate deeper into the sample than XPS.

In some embodiments, continuity can be assessed by electrical characterization techniques if the copper halide layer is a semiconductor (e.g., CuF, CuCl, CuBr, and CuI). In some embodiments, semiconductor copper halide layers may conduct current only when at least partially continuous. In some embodiments, a "percolation path" may be present between two or more electrical connections attached to the copper halide layer. In some embodiments, if no current is detected across two or more electrical connections attached to the copper halide layer, then the copper halide layer may be discontinuous. In some embodiments, if current is detected across the two or more electrical connections attached to the copper halide layer, and the substrate or adhesion layer is a well-insulating insulator (e.g., ≥30 nm-thick SiN), then the detected current may have been passed through the copper halide layer. In some embodiments, the well-insulating insulator does not allow current leakage through to the substrate at the voltage tested. Another example of a well-insulating insulator is ≥20 nm of $Al_2O_3$ at low voltages (e.g., 2 V).

In some embodiments, the copper halide layer is 99 to 99.5% continuous. In some embodiments, the copper halide layer is 99, 99.1, 99.2, 99.3, 99.4, or 99.5% continuous.

In some embodiments, the copper halide layer is continuous over a lateral dimension of the substrate or the adhesion layer of at least 1 in×1 in, at least 1 cm×1 cm, at least 1 mm×1 mm, or at least 1 μm×1 μm. In some embodiments, the copper halide layer is free of pin-holes of sizes of about 5 nm$^2$ or greater. In some embodiments, the copper halide layer includes copper halide crystallites. In some embodiments, the copper halide crystallites are about 1 to about 100 nm in diameter.

In some embodiments, the continuity of the copper halide layer can be measured by chemical etching. In these embodiments, chemical etching includes applying a chemical to the article, where the chemical can dissolve the substrate or adhesion layer but not the copper halide layer. In some embodiments, if the substrate or adhesion layer are not dissolved, in whole or in part, by the chemical, then the copper halide layer is continuous.

In some embodiments, the continuity of the copper halide layer can be measured by SEM, XPS, RBS, EDX, or a combination thereof. In some embodiments, the substrate or adhesion layer can produce a spectroscopic signal that is distinct from that of the copper halide layer. In some embodiments, if subjecting the article to SEM, XPS, EDX, or a combination thereof does not produce an image or spectroscopic signal corresponding to the chemical composition of the substrate or adhesion layer, then the copper halide layer is continuous.

In some embodiments, the copper halide layer conforms to the shape of the substrate or the adhesion layer. In some embodiments, the copper halide layer conforms to the surface contours of the substrate or the adhesion layer.

In some embodiments, conformality describes the shape of the copper halide layer with respect to the substrate or adhesion layer. In some embodiments, conformality is a measure of the ability of the copper halide layer deposition process to coat the surfaces of, for example, undercut recesses and top and side wall surfaces of the substrate or adhesion layer. In some embodiments, the deposition methods described herein, e.g., pCVD, enable the coating of copper halide layers onto substrates or adhesion layers of arbitrary geometry. By contrast, in some embodiments, non-conformal deposition methods, including, for example, line-of-sight methods like sputtering, thermal evaporation, and electron-beam evaporation deposit the copper halide layer in a straight line and do not move around in order to access undercuts, side walls, or deep recesses.

In some embodiments, conformality can be assessed by using the deposition method (e.g., pCVD) to deposit the materials on high-aspect ratio structures, such as trenches. In some embodiments, conformality can be assessed as a ratio of the thickness of the copper halide layer at the top of the trench to the thickness of the copper halide layer at the bottom of the trench. For example, there are structures (e.g., silicon trenches) that are 50 nm on one side and 500 nm deep, with vertical side walls (such a structure would have an aspect ratio of 500:50 or 10:1). In some embodiments, the structures can exist up to an aspect ratio of 50:1 or greater. In these embodiments, the conformality of the deposition method can be assessed by the highest aspect ratio trench structure on which conformal coatings are produced—that is, the thickness of the film is nonzero (and, ideally, uniformly thick) along the entire surface of the substrate, including the bottom of the trench, sidewalls of the trench, and top surfaces between the trenches.

In some embodiments, the stoichiometry of the CuBr layer is $Cu_{1.00}Br_{1.00\pm0.02}$.

CVD

In some embodiments, the chemical vapor deposition is a pCVD or an atomic layer deposition ("ALD"). In some embodiments, the chemical vapor deposition is a pCVD. In some embodiments, the pCVD includes reaction of a compound of general formula $Q_mL_nX_y$ with a Cu(I) precursor compound to form a copper halide layer, where Q is a metal or carbon, L is hydrogen, alkyl, cycloalkyl, aryl, heteroalkyl, heterocycloalkyl, heteroaryl, a metal ligand, or a combination thereof, X is a halogen, and m, n, and y are each independently 0 or an integer.

Non-limiting examples of L, where L is a metal ligand, include oxygen, chloride, iodide, bromide, sulfide, thiocyanate, nitrate, azide, fluoride, hydroxide, oxalate, water, nitrite, isothiocyanate, acetonitrile, pyridine, ammonia, ethylenediamine, 2,2'-bipyridine, 1,10-phenanthroline, nitrite, triphenylphosphine, cyanide, carbon monoxide, acetylacetonate, alkene, aminopolycarboxylic acid (1,2-bis(O-aminophenoxy)ethane-N,N,N',N'-tetraacetic acid, benzene, 1,2-bis (diphenylphosphino)ethane, 1,2-bis(diphenylphosphino) methane, corroles, 2,2,2-cryptand, cryptates, cyclopentadienyl, diethylenetriamine, dimethylglyoximate, 1,4,7,10-tetraazacyclodecane-1,4,7,10-tetraacetic acid, diethylenetriaminepentaacetic acid, ethylenediaminetetraacetic acid, ethylenediaminetriacetate, ethyleneglycolbis (oxyethylenenitrilo)tetraacetate, fura-2, glycinate, porphyrins, iminodiacetic acid, nicotinamide, nitrosyl, nitrilotriacetic acid, oxo, pyrazine, scorpionate ligand, sulfite, 2,2'; 6',2"-terpyridine, triazacyclononane, tricyclohexylphosphine, triethylenetetramine, trimethylphosphine, tris(o-tolyl)phosphine, tris(2-aminoethyl)amine, tris(2-aminoethyl)amine, tris(2-diphenylphosphineethyl)amine, tropylium, carbon dioxide, phosphorous trihalide, hexafluoroacetylacetonate, trifluoroacetylacetonate, and 2,2,6,6-tetramethyl-3,5-heptanedionate.

In some embodiments, the copper halide layer includes a compound of formula $CuF_aCl_bBr_dI_e$, where a, b, d, and e are independently between 0 and 1, inclusive, and the sum of a, b, d, and e is 1. In some embodiments, the copper halide layer includes CuF, CuCl, CuBr, CuI, or a combination thereof. In some embodiments, the copper halide layer is CuF. In some embodiments, the copper halide layer is CuCl. In some embodiments, the copper halide layer is CuBr. In some embodiments, the copper halide layer is CuI.

In some embodiments, the compound of formula $Q_mL_nX_y$ is a hydrogen halide, where m is 0, n and y are both 1, L is hydrogen, and X is a halogen. Non-limiting examples of hydrogen halides include HF, HCl, HBr, and HI. In some embodiments, the compound of formula $Q_mL_nX_y$ is HF. In some embodiments, the compound of formula $Q_mL_nX_y$ is HCl. In some embodiments, the compound of formula $Q_mL_nX_y$ is HBr. In some embodiments, the compound of formula $Q_mL_nX_y$ is HI.

In some embodiments, the compound of formula $Q_mL_nX_y$ is an alkyl halide of formula $C_mH_nX_y$, where m, n, and y are integers, X is F, Cl, Br, or I, and C along with the carbon atoms to which it is attached can optionally form a ring. In some embodiments, m and y are 1 and n is 3. Non-limiting examples of alkyl halides of formula $C_mH_nX_y$ include bromomethane, chloromethane, iodomethane, and fluoromethane.

In some embodiments, the compound of formula $Q_mL_nX_y$ is a metal halide, where Q is a metal, m and y are integers, and n is 0. In some embodiments, the metal halide is preferably volatile and reacts with the Cu(I) precursor compound such that any byproducts that are formed are volatile or at least do not contaminate the copper halide layer. In some embodiments, the metal halide is volatile if, for example, if its sublimation rate as measured by thermogravimetric analysis exceeds about 0.1 mg/min at the temperature of the pCVD reaction. Non-limiting examples of metals include Li, Be, Mg, Ca, Sr, Ba, Sc, Y, La, Ti, Zr, Hf, V, Nb, Ta, Cr, Mo, W, Mn, Re, Fe, Ru, Os, Co, Rh, Ir, Ni, Pd, Pt, Cu, Ag, Zn, Cd, Hg, B, Al, Ga, In, Ge, Sn, Pb, As, Sb, Bi, Te, Ce, Pr, Nd, Sm, Eu, Gd, Tb, Dy, Ho, Er, Tm, Yb, and Lu. In some embodiments, the metal halide is $TiCl_4$. Additional examples of metal halides can be found in, for example, Igumenov et al. (2011) "Volatile Precursors for Films Deposition: Vapor Pressure, Structure and Thermodynamics, Application of Thermodynamics to Biological and Materials Science," Tadashi, M., Ed., *IntechOpen*, pp.

521-546, doi: 10.5772/13356; and Sievers et al. (1978) "Volatile Metal Complexes," Science, Vol. 201, pp. 217-223.

In some embodiments, the compound of formula $Q_mL_nX_y$ is $V(O)Cl_2$.

Figure 2A:
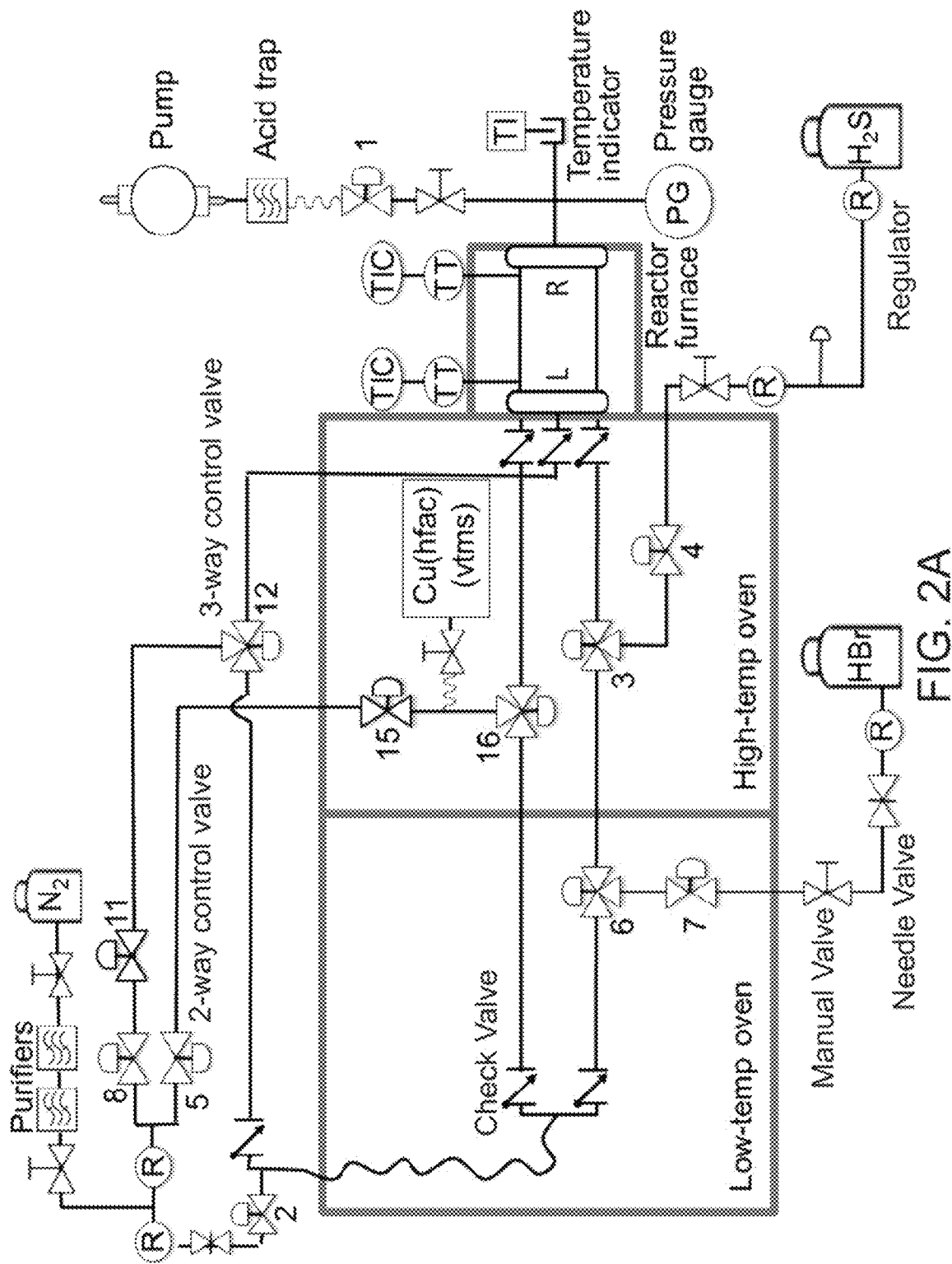
FIG. 2A shows a schematic diagram of a hot-walled reactor for chemical vapor deposition ("CVD") of a copper halide layer, according to one or more embodiments.
Figure 2B:
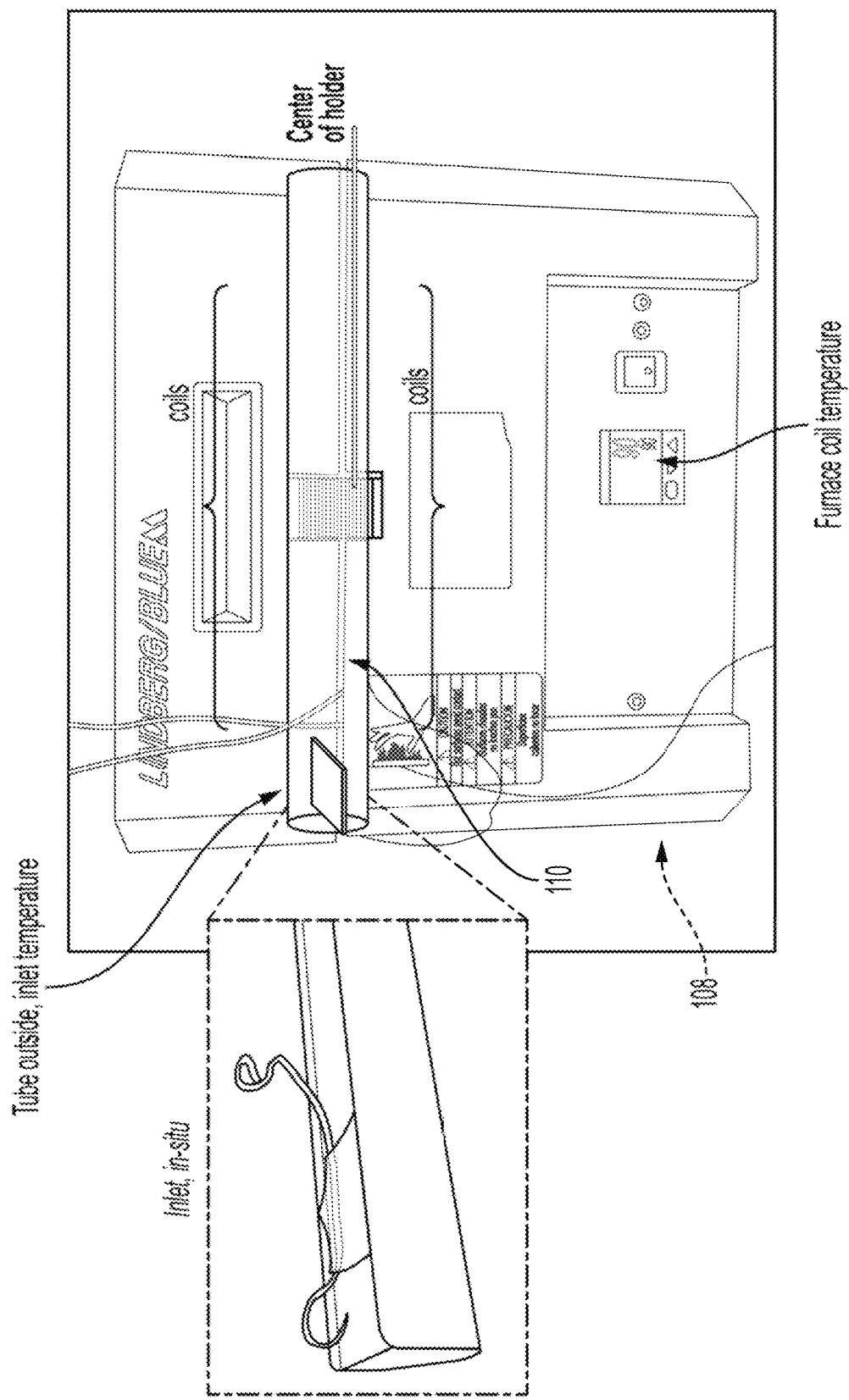
FIG. 2B shows a photograph of a reactor tube furnace for CVD of a copper halide layer, according to one or more embodiments.

In some embodiments, as shown in FIG. 2B, the CVD uses a reactor 108 including a reaction chamber 110. In some embodiments, one cycle of the pCVD includes (i) evacuation of the chamber 110, (ii) a first pulse of Cu(I) precursor compound with a carrier gas into the chamber 110, (iii) a second pulse of hydrogen halide into the chamber 110, (iv) delay time, and (v) nitrogen purge of the reaction chamber 110. In some embodiments, the first and second pulses are about 1 second at a pressure of about 1 torr. In some embodiments, the nitrogen purge is about 10 seconds at a pressure of about 0.7 torr. In some embodiments, the delay time allows reaction between the Cu(I) precursor compound and the hydrogen halide to occur. In some embodiments, the delay time is about 0.1 seconds ("accelerated pCVD") to about 5 seconds. In some embodiments, the delay time is about 0.1 seconds. In some embodiments, the delay time is about 5 seconds. In some embodiments, about 100 to about 5000 cycles of the pCVD reaction are performed. In some embodiments, about 300 to about 2000 cycles of the pCVD reaction are performed. In some embodiments about 500, 600, or 1000 cycles of the pCVD reaction are performed. In some embodiments, about 600 cycles of the pCVD reaction are performed. In some embodiments, the growth rate of the copper halide layer 102 is about 1 Å/cycle.

Copper (I) Precursor Compound

In some embodiments, the Cu(I) precursor compound is a compound of formula Cu(A)(L), where A is a ligand and B is a Lewis base. In some embodiments, A is a β-diketonate. Non-limiting examples of β-diketonates include hexafluoroacetylacetonate, acetylacetonate, trifluoroacetylacetonate, or 2,2,6,6-tetramethyl-3,5-heptanedionate.

In some embodiments, B is unsaturated. In some embodiments, B includes $C_1$-$C_8$ alkyl groups, $C_1$-$C_8$ alkoxy groups, silyl groups, or a combination thereof. Non-limiting examples of alkyl or alkoxy groups include ethyl, propyl, butyl, pentyl, hexyl, octyl, aryl, ethoxy, propoxy, butoxy, pentyloxy, hexyloxy, heptyloxy, octyloxy, aryloxy, groups, and a combination thereof. In some embodiments, the B comprises bis(trimethylsilyl)acetylene, vinyltrimethylsilane, 1,5-cyclo-octadiene, 2-butyne, 2-methyl-1-hexen-3-yne, hex-3-yn-1-ene, or a combination thereof.

In some embodiments, B is provided as a mixture with hexafluoroacetylacetone, hexafluoroacetylacetone dihydrate, water, or a combination thereof. In some embodiments, the mixture can modulate deposition rate, precursor stability, reaction conditions, or a combination thereof.

In some embodiments, the Cu (I) precursor compound is vinyltrimethylsilane(hexafluoroacetylacetonato)copper(I) ("Cu(hfac)(vtms)").

In some embodiments, the pCVD reaction includes the reactions y Cu(hfac)(vtms)+$Q_mL_nX_y$→y CuX+$Q_m$(hfac)$_y$+vtms, where Q is a metal, X is a halogen, n is 0, and m and y are integers; or y Cu(hfac)(vtms)+$Q_mL_nX_y$→y CuX+$Q_mL_n$(hfac)$_y$+vtms, where Q is a metal, X is a halogen, and m, n, and y are integers.

In some embodiments, the pCVD reaction includes the reaction
4 Cu(hfac)(vtms)+$QX_4$→4 CuX+Q(hfac)$_4$+vtms, where Q is a metal and X is a halogen.

In some embodiments, the pulsed chemical vapor deposition reaction includes the reaction
4 Cu(hfac)(vtms)+$TiCl_4$→4 CuCl+Ti(hfac)$_4$+vtms.

In some embodiments, the pulsed chemical vapor deposition reaction includes the reaction Cu(hfac)(vtms)+HBr→CuBr+Hhfac+vtms.

In some embodiments, the pulsed chemical vapor deposition reaction includes the reaction steps:
(i) 2 Cu(hfac)(vtms)→Cu+Cu(hfac)$_2$+2 vtms; and
(ii) 2 Cu+2 HBr→2 CuBr+$H_2$.

Temperature

In some embodiments, the copper halide layer is deposited on the substrate or adhesion layer at a temperature from about 60° C. to about 200° C. In some embodiments, the copper halide layer is deposited on the substrate or adhesion layer at a temperature of about 65, 65.8, 75, 83.4, 85, 87.0, 87.1 95, 105, 109.9, 115, 125, 135, 136.4, 145, 155, 162.8, 165, 175, 185, 189.3, 195, or 200° C. In some embodiments, the copper halide layer is deposited on the substrate or adhesion layer at a temperature of about 65.8, 83.4, 87.0, 87.1, 109.9, or 136.4, 162.8, or 189.3° C. In some embodiments, the copper halide layer is deposited on the substrate or adhesion layer at a temperature of about 83.4° C.

Properties of the Article

In some embodiments, the article is optically transparent. In some embodiments, the article has a transmittance of over 50% over the wavelength range from about 400 nm to about 800 nm. In some embodiments, the article has a transmittance of about 80% over the wavelength range from about 400 nm to about 800 nm. In some embodiments, the article has a transmittance of about 100% over the wavelength range from about 400 nm to about 800 nm.

In some embodiments, the article is electrically conductive. In some embodiments, electrical conductivity can be defined by the sheet resistance ($R_s$), resistivity (ρ), hole concentration (P), or mobility (μ), as determined by 4-point probe or Hall measurements. In some embodiments, the resistivity of the article is between about 0.0375 Ω·cm and about 20 Ω·cm. In some embodiments, the sheet resistance of the article is between about $2.5 \times 10^2$ Ω·sq$^{-1}$ and about $2 \times 10^6$ Ω·sq$^{-1}$. In some embodiments, the hole concentration of the article is between about $1 \times 10^{17}$ cm$^{-3}$ and about $1 \times 10^{19}$ cm$^{-3}$. In some embodiments, the mobility of the article is between about 0.07 cm$^2$V$^{-1}$ s$^{-1}$ and about 10 cm$^2$V$^{-1}$ s$^{-1}$. In some embodiments, the electrical conductivity of the article is p-type.

In some embodiments, adjusting the amounts (i.e., values of a, b, d, and e) of each halide in the compound of formula $CuF_aCl_bBr_dI_e$ can tune the electrical properties (e.g., bandgap and band positions) of the resulting copper halide layer.

Optoelectronic Devices

In some embodiments, an optoelectronic device includes an article according to one or more embodiments. Non-limiting examples of optoelectronic devices include perovskite solar cells, dye-sensitized solar cells, photonic emitters, electrooptic modulators, optical fibers, four-wave mixing devices, thin-film transistors, flat-panel displays, and a combination thereof. Additional non-limiting examples of optoelectronic devices can be found in Christians et al. (2014), "An Inorganic Hole Conductor for Organo-Lead Halide Perovskite Solar Cells. Improved Hole Conductivity with Copper Iodide," J. Am. Chem. Soc., Vol. 136, pp. 758-764; Soga et al. (2004), "Copper Iodide Thin Films as a p-Type Electrical Conductivity in Dye-Sensitized p-CuI|Dye|n-TiO$_2$Heterojunction Solid State Solar Cells," Surface Review and Letters, Vol. 11, pp. 577-583; Grundmann et al. (2013), A p-Type Transparent Semiconductor, History, and Novel Applications: Cuprous Iodide," Phys. Status Solidi. A, Vol. 210, pp. 1671-1703; Mitra et al. (2008), "Optical Properties of CuCl Films on Silicon Substrates,"

Phys. Status Solidi. B, Vol. 245, pp. 2808-2814; Ambacher (1998), "Growth and Applications of Group III-Nitrides," *J. Phys. D: Appl. Phys.*, Vol. 31, p. 2653; Gomes et al. (1990), "Time-Resolved Four-Wave Mixing Experiments in CuCl," *Phys. Status Solidi. B*, Vol. 159, pp. 101-106; Liu et al. (2018), "Room-Temperature Solution-Synthesized p-Type Copper(I) Iodide Semiconductors for Transparent Thin-Film Transistors and Complementary Electronics," *Adv. Mater.*, Vol. 30, doi: 10.1002/adma.201802379; and Zhu et al. (2019), "Transparent Inorganic Copper Bromide (CuBr) p-Channel Transistors Synthesized From Solution at Room Temperature," *IEEE Electron Device Letters*, Vol. 40, pp. 769-772.

In some embodiments, a perovskite solar cell includes an article. In some embodiments, the perovskite solar cell in n-type semiconductor layer—intrinsically doped perovskite layer—p-type semiconductor layer (N—I—P) configuration can include a glass substrate upon which can be deposited a thin layer of a transparent conducting oxide. In some embodiments, a titania nanoparticle layer (or other n-type doped semiconductor material) can be deposited on the transparent conducting oxide, followed by a perovskite layer on the titania nanoparticle layer (or other n-type doped semiconductor material). In some embodiments, the copper halide layer can be deposited on the perovskite layer. In some embodiments, one or more encapsulation layers can be deposited on the copper halide layer to complete the solar cell. In some embodiments, encapsulation layers include, for example, alumina, titania, metal oxides (e.g., indium tin oxides), 2-dimensional perovskites, $PbI_2$, glass, epoxy resin, and polymers.

In some embodiments, a perovskite solar cell in p-type semiconductor layer— intrinsically doped perovskite layer—n-type semiconductor layer (P—I—N) configuration can include a glass substrate upon which can be deposited a thin layer of a transparent conducting oxide. In some embodiments, the copper halide layer can be deposited on the transparent conducting oxide layer. In some embodiments, the perovskite layer can then be deposited on the copper halide layer. In some embodiments, an n-type semiconductor material (e.g., phenyl-$C_{61}$-butyric acid methyl ester (PCBM)) can then be deposited on top of the perovskite layer. In some embodiments, one or more encapsulation layers can be added on the n-type semiconductor material layer to complete the solar cell. In some embodiments, encapsulation layers include, for example, alumina, titania, metal oxides (e.g., indium tin oxide), 2-dimensional perovskites, $PbI_2$, glass, epoxy resin, and polymers.

EXAMPLES

Articles composed of transparent conductive layers can be useful for optoelectronic devices, including, for example, photovoltaics, flat-panel displays, and other photonic devices requiring wide-bandgap semiconductors. In these applications, n-type electron-transport layers may be more readily available (e.g., transparent conducting oxides). However, there are fewer p-type hole-transport layers available. In some embodiments, transparent conductive layers can be evaluated by their figure of merit, which is the ratio of conductivity to the absorption coefficient, $\sigma/\alpha$. In some embodiments of electron-transport layers, $\sigma/\alpha$ values can exceed $1\ \Omega^{-1}$. However, in some embodiments, $\sigma/\alpha$ values can be two to three orders of magnitude lower than available hole transport layers. Therefore, the preparation of high-quality, high-performance hole-transport layers may be useful for a variety of device applications.

In some embodiments, the class of semiconductors CuX (X=Br, I) may be useful high-mobility transparent hole-transport layers. For example, CuI has a bandgap of 3.1 eV and hole mobility ranging from 2 to 12 $cm^2V^{-1}\ s^{-1}$ in polycrystalline CuI, and CuBr has a bandgap of 2.9 eV and a hole mobility of 0.4 $cm^2V^{-1}\ s^{-1}$. In some embodiments, physical vapor deposition methods can be used to fabricate CuX layers, including, for example, doctor-blading, spin-coating, vacuum and thermal evaporation, molecular beam epitaxy, r.f. sputtering, laser-assisted molecular beam deposition, pulsed laser deposition, and solid or vapor iodination of Cu metal or $Cu_3N$. However, when using such techniques, deposition methods for CuI and CuBr provide rough layers. Smooth, continuous CuBr and CuI layers with low roughness values may be desirable. In some embodiments, even high-quality, continuous CuI layers made by sputtering can dewet into islands if sputtered at high substrate temperatures. These deficiencies in CuX layer fabrication underscore the need for alternative methods for production of smooth, continuous layers, and also underscore the importance that surface free energy matching may play in the production of such layers.

In some embodiments, CVD can enable fabrication of CuX layers. CVD is a technique that can be useful in industry to fabricate hole-transport layers and electron-transport layers of the quality (e.g., smoothness, thinness, purity, etc.) useful for device applications. In some embodiments, CVD is advantageous because of the molecular-level control of the fabrication process. In some embodiments, CVD-based processes can be used to prepare CuX layers, where X can be Cl, Br, or I. In some embodiments, the CVD method has two steps: (i) layers of cuprous sulfides or oxides can be prepared by CVD and (ii) the cuprous sulfide or oxide layers can be converted to, for example, CuBr (partial conversion) or CuI (complete conversion enabled by surfactants). In some embodiments, the use of surfactant-based conversion can enable control over CuX layer wetting on substrates to produce CuX layers. In some embodiments, using this surfactant-based conversion method, CuI layers can be produced with useful optical and electrical properties.

In some embodiments, manufacturing and process generality and uniformity can be improved by using a one-step deposition of CuX layers, rather than the two-step method of (i) CVD of cuprous sulfide or cuprous oxide layers then (ii) conversion to CuBr or CuI. However, a suitable method for direct CVD of uniform, continuous cuprous halide layers remains an unmet need. Various CVD methods have been attempted. For example, chemical vapor deposition of CuI from the reaction between cyclopentadienyl(triethylphosphino)copper(I) and ethyl iodide resulted in crystallized islands of CuI instead of continuous layers. In another example, ALD from the reaction between (bis(trimethylsilyl)acetylene)(hexafluoroacetylacetonato)-copper(I) and HCl or pyridine hydrochloride resulted in CuCl crystallite islands instead of continuous layers. In another example, ALD of CuBr from HBr vapor and the volatile compound bis(N,N'-di-sec-butylacetamidinato)dicopper(I) ("Cu(sBuAMD)$_2$"), resulted in weak adsorption of HBr to the substrate during the HBr half of the atomic layer deposition cycle, as evidenced by a lack of CuBr layer deposition under a variety of conditions. To circumvent the lack of strong adsorption of HBr, a pCVD variant was attempted, in which both precursor vapors were continuously supplied. Although the desired reaction to produce CuX (X=Br or I) layers succeeded, an acid-base side reaction between HX and the acetamidine yielded nonvolatile acetamidinium halide salts, and thus the copper halide layers were carbon- and nitrogencontaminated. Replacing the acetamidinato ligand with a less basic ligand may avoid this acid-base side reaction.

Therefore, in some embodiments, a Cu(I) precursor with a ligand whose neutral form is not easily protonated, the commercially available vinyltrimethylsilane(hexafluoroacetylacetonato)copper(I), Cu(hfac)(vtms), was used for direct CVD of fully continuous copper halide layers. In these embodiments, surface free energy matching between the substrate the copper halide layer is deposited on and the copper halide being deposited enables the direct CVD of fully continuous copper halide layers. In some embodiments, the surface free energy matching was accomplished by selecting a substrate material with a surface free energy matched to that of the copper halide or adding an adhesion layer to the substrate, where the adhesion layer has a surface free energy matched to that of the copper halide.

Screen of Substrates for Deposition

As shown in FIGS. 2A-2B, CuBr layers were grown in a custom-built, hot-walled ALD reactor, in which a bubbler was installed containing the Cu(hfac)(vtms) precursor. In FIG. 2A, ⊠ represents a 2-way control valve, ⊠ represents a 3-way control valve, ⊠ represents a manual valve, ⊠ represents a needle valve, ⓡ represents a regulator, ⋈ represents a check valve, L represents the far-left position of the reactor, R represents the far-right position of the reactor, TIC represents a temperature indicator controller, TT represents a temperature transmitter, TI represents a temperature indicator, and PG represents a pressure gauge. In FIG. 2A, the valves, including 2-way and 3-way control valves, are numbered 1-16. In some embodiments, the pCVD reactions take place within a tube furnace that is 16 in long. In some embodiments, reactants are introduced to the chamber at the far-left position (L). In some embodiments, the substrate holder is 0.5 in away from the inlet to the chamber, and the substrate holder is 11.5 in long. Thus, in some embodiments, samples can be placed between 0.5 in and 12 in away from the inlet. In some embodiments, to achieve the highest precursor utilization, the substrates are placed at the leftmost position, about 0.5 in away from where gases enter the chamber. Layers of CuBr were deposited via pCVD using different exposures to Cu(hfac)(vtms) and HBr. In some embodiments, the reactor tube furnace includes four temperature readings: (i) the furnace heating coil temperature reading displayed on the front of the reactor; (ii) the substrate holder contains a thermocouple at its center (white line in FIG. 2B); (iii) a thermocouple attached directly to the outside of the tube at the far left of the furnace using Kapton tape (outside edge of the dark grey tube in FIG. 2B); and (iv) a thermocouple attached directly to the substrate holder using Kapton tape (the end of the thermocouple was bent so that it contacted the holder surface where the substrates sit (light gray trapezoid in FIG. 2B).

Figure 2C:
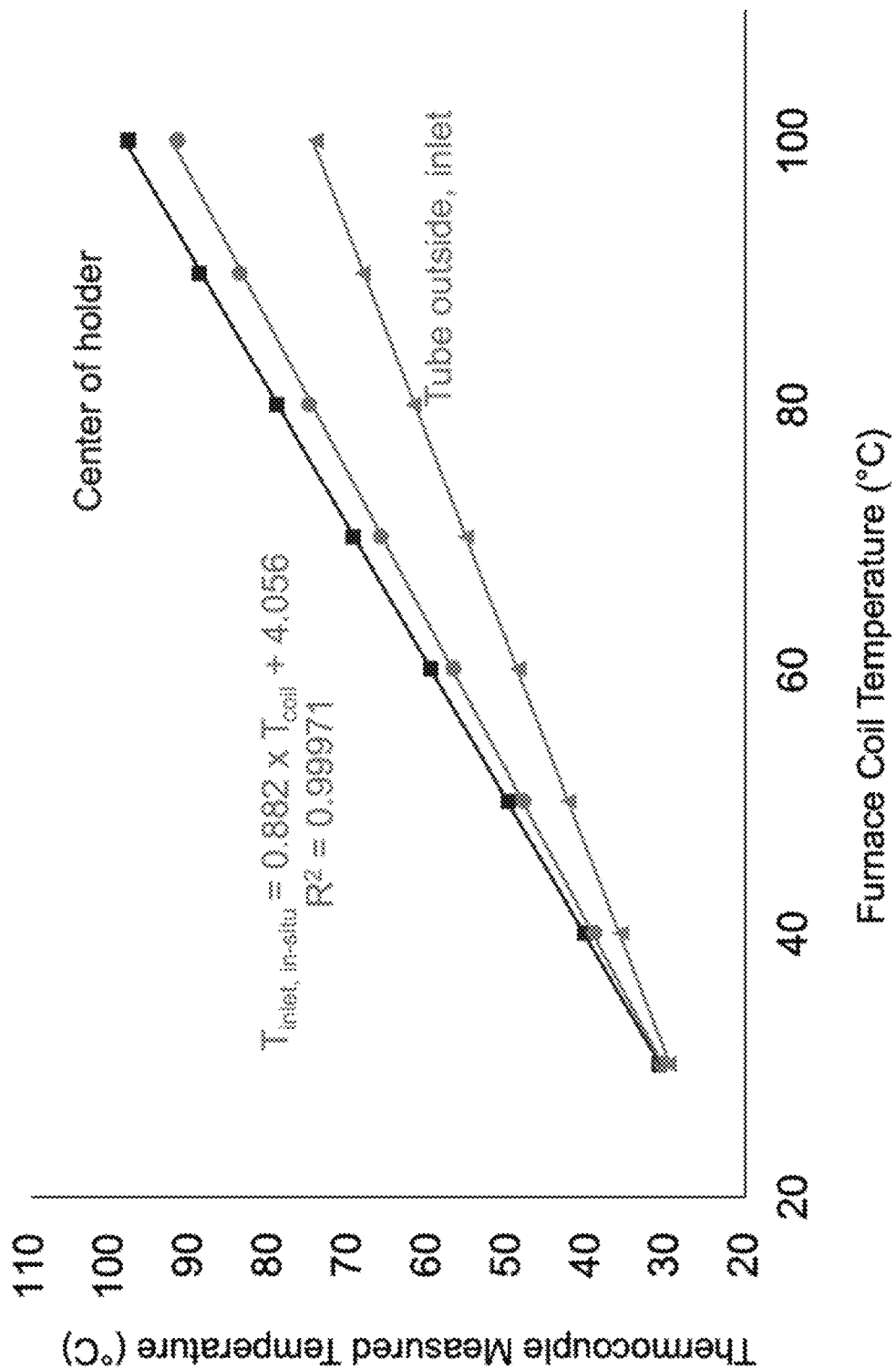
FIG. 2C shows a calibration curve for measured temperatures in the reactor tube furnace of FIG. 2A or 2B, according to one or more embodiments.
Figure 2D:
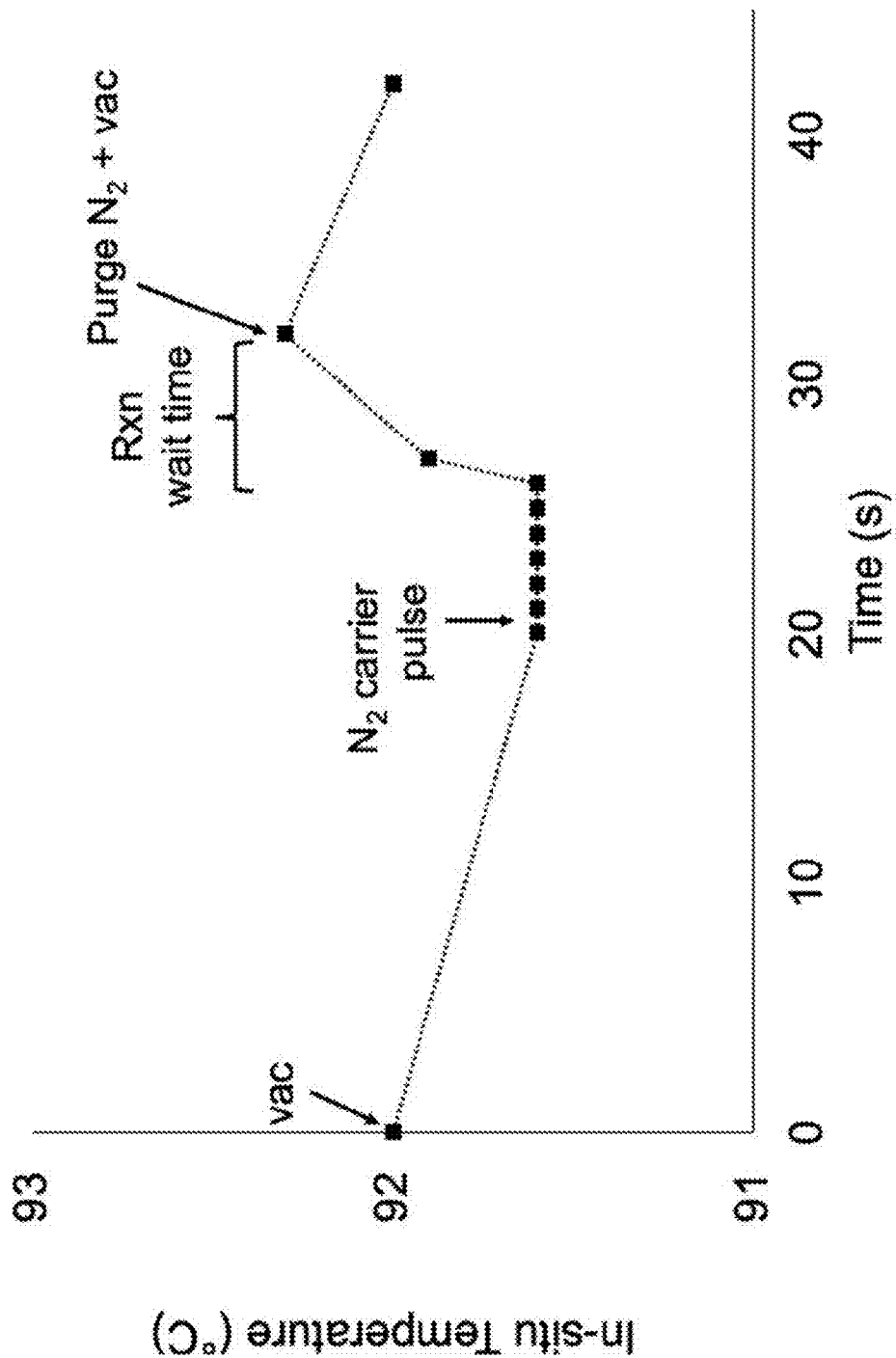
FIG. 2D shows in situ temperature on the substrate during a pulsed-CVD ("pCVD") sequence, according to one or more embodiments.
Figure 3A:
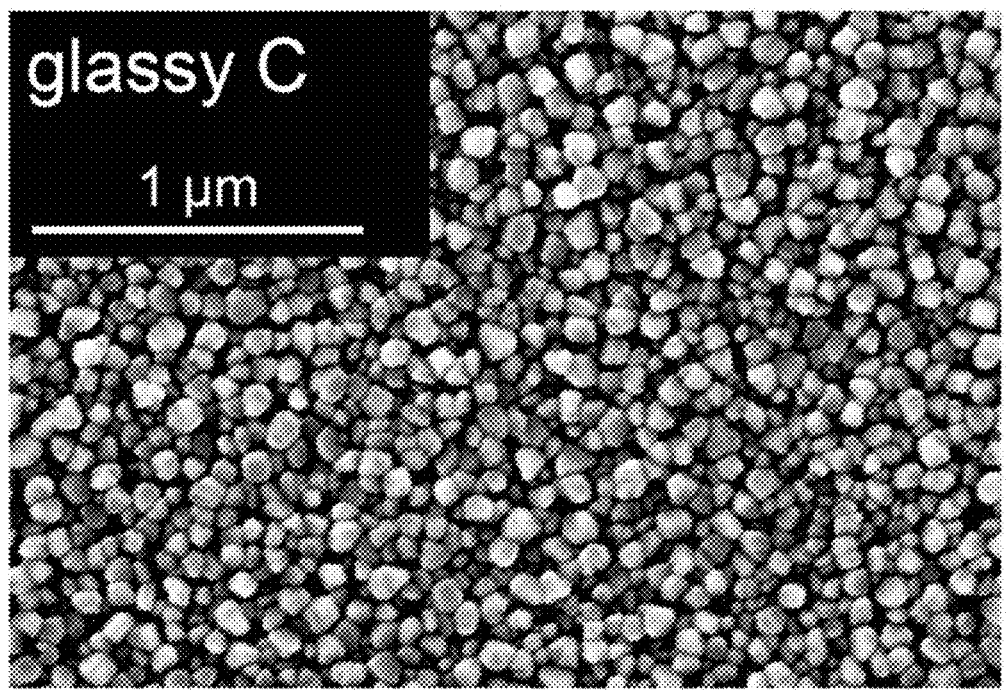
FIG. 3A shows a scanning electron microscopy ("SEM") image of CuBr grown on glassy carbon at 83.4° C., according to one or more embodiments.
Figure 3B:
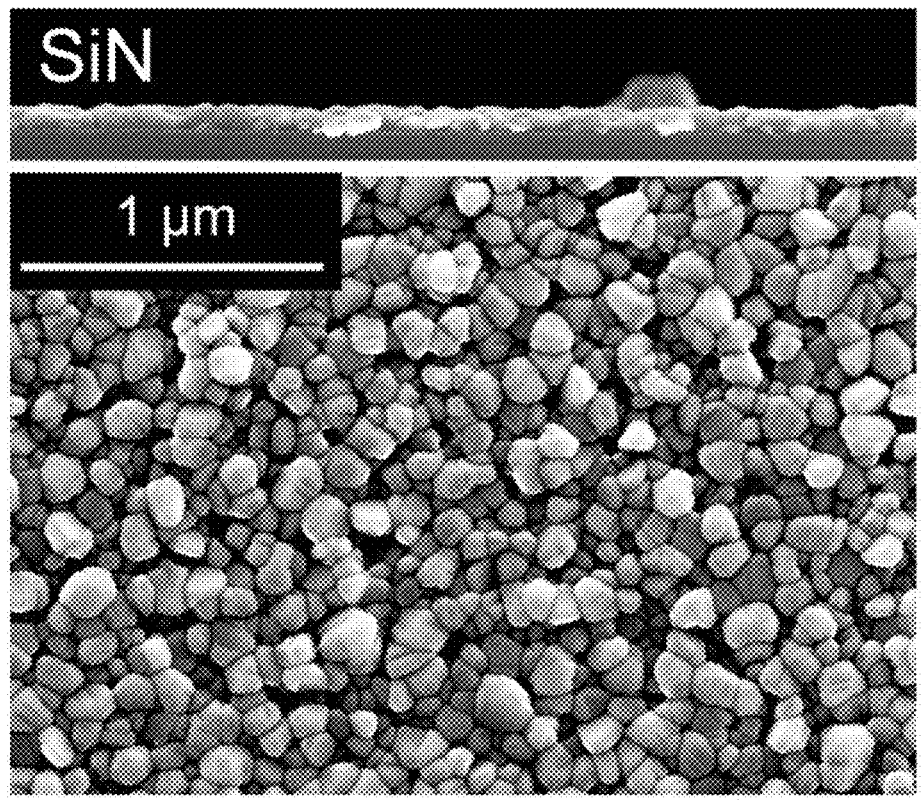
FIG. 3B shows a SEM image of CuBr grown on silicon nitride ("SiN") at 83.4° C., according to one or more embodiments.
Figure 3C:
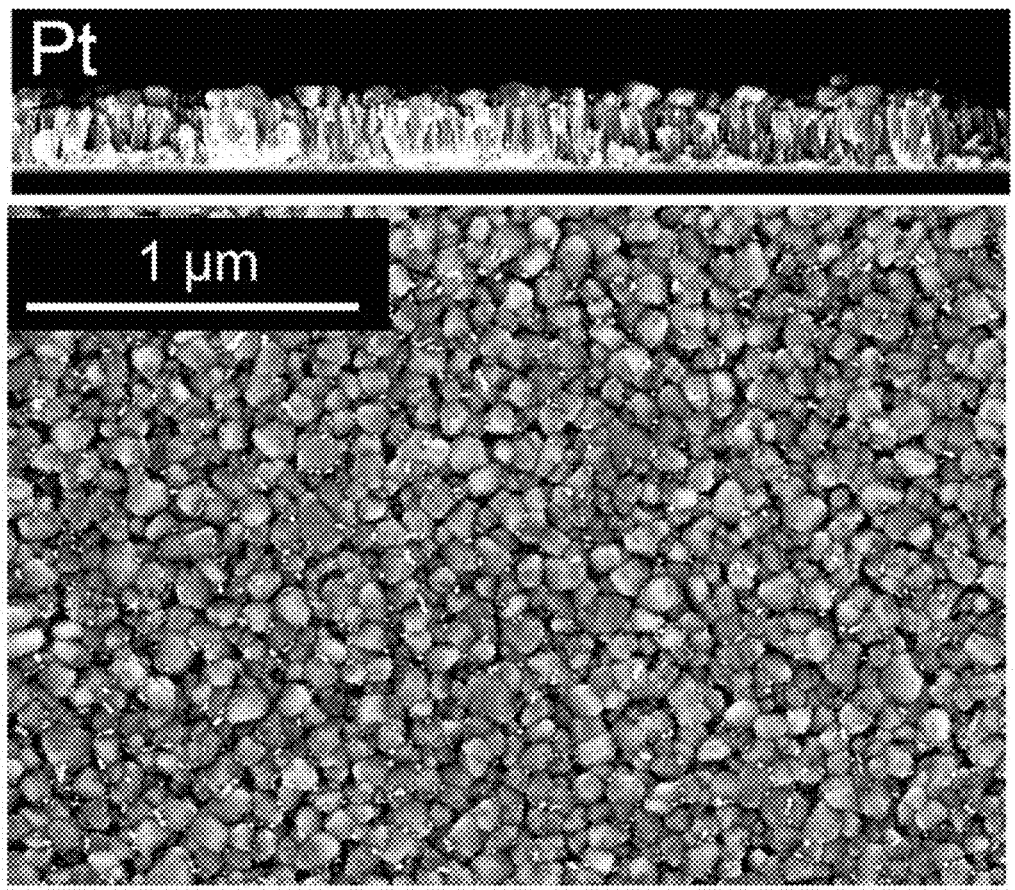
FIG. 3C shows a SEM image of CuBr grown on platinum at 83.4° C., according to one or more embodiments.
Figure 3D:
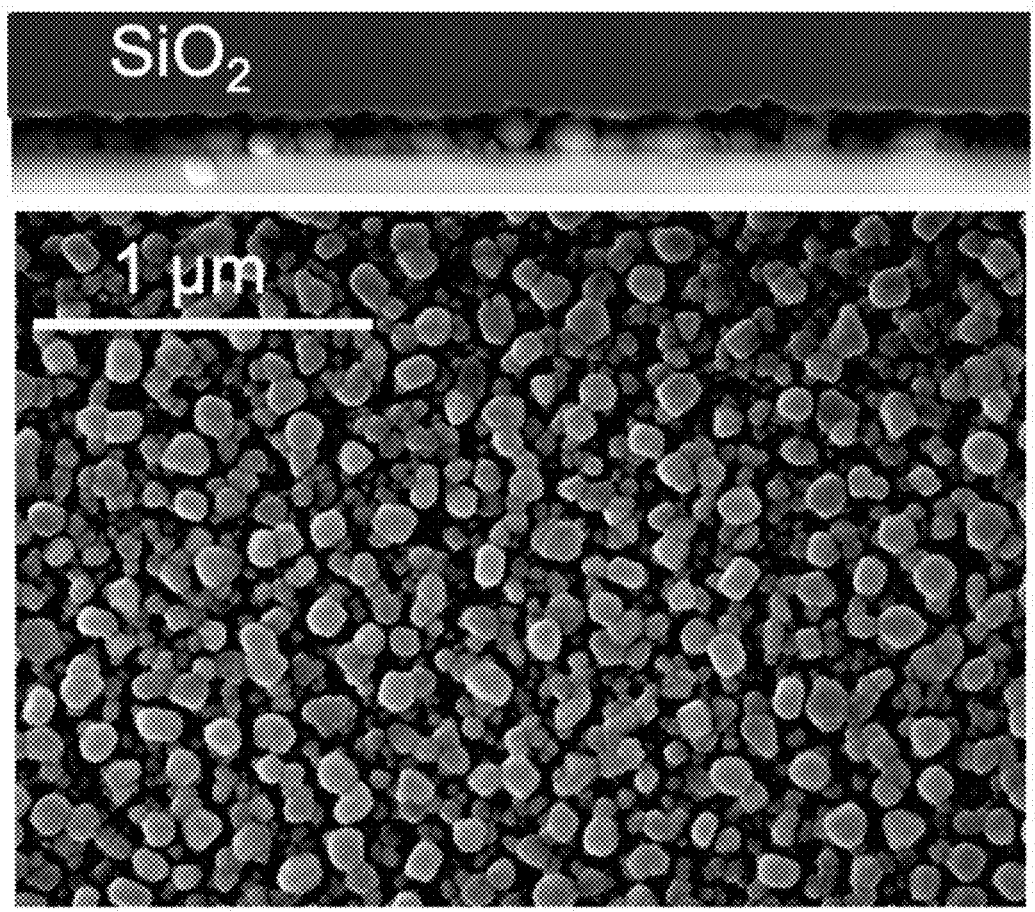
FIG. 3D shows a SEM image of CuBr grown on $SiO_2$ at 83.4° C., according to one or more embodiments.
Figure 4A:
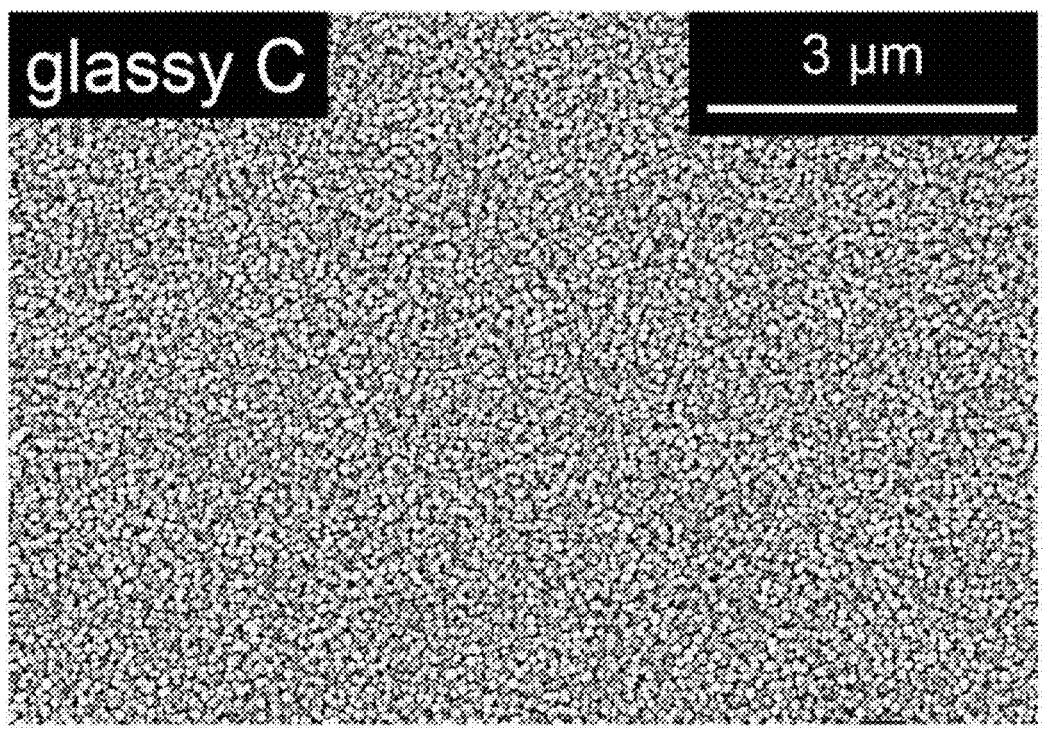
FIG. 4A shows a zoomed-out view of the CuBr layer shown in FIG. 3A, according to one or more embodiments.
Figure 4B:
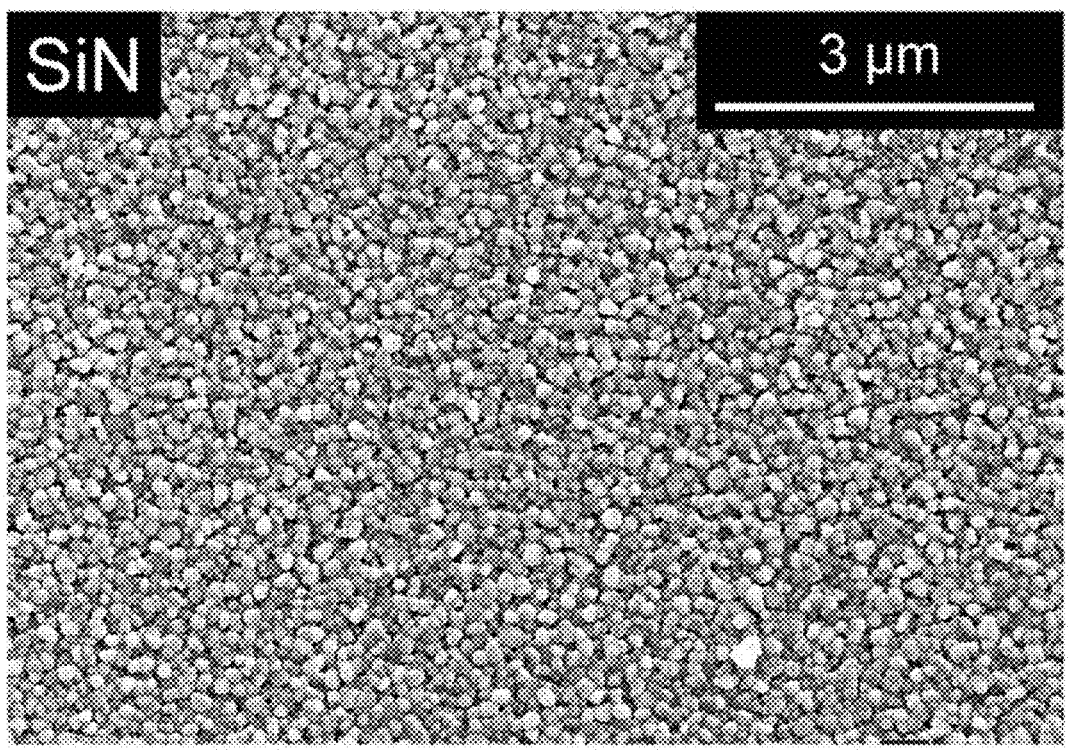
FIG. 4B shows a zoomed-out view of the CuBr layer shown in FIG. 3B, according to one or more embodiments.
Figure 4C:
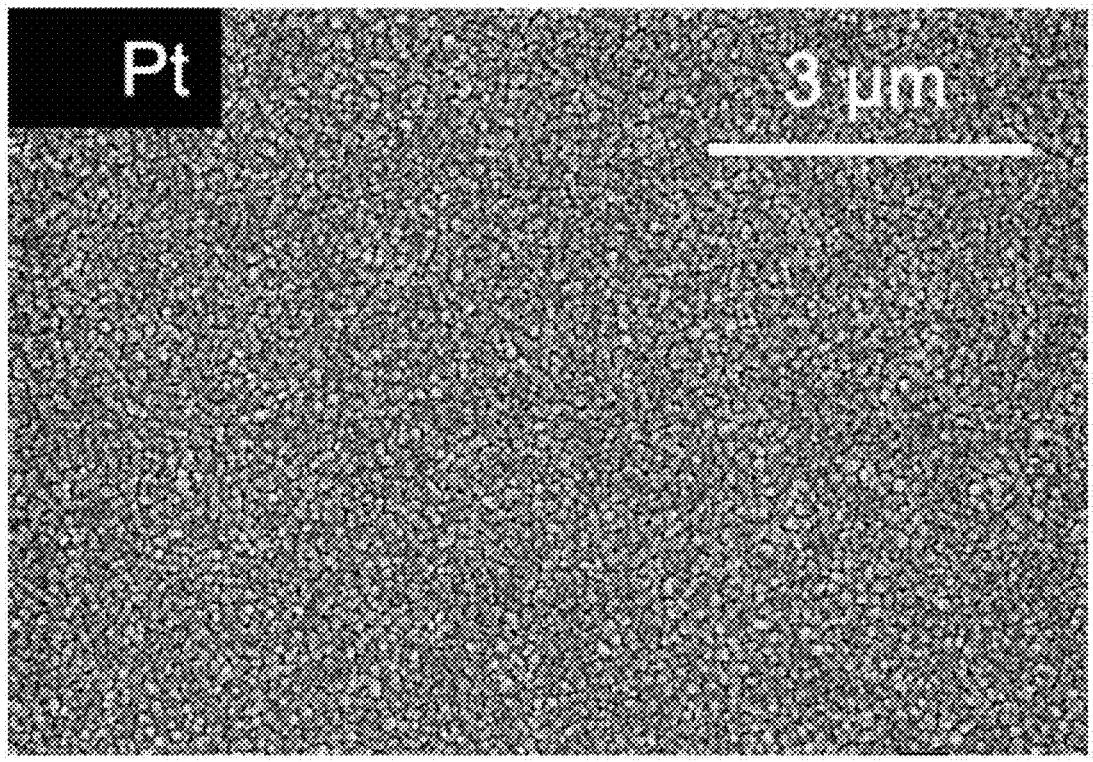
FIG. 4C shows a zoomed-out view of the CuBr layer shown in FIG. 3C, according to one or more embodiments.
Figure 4D:
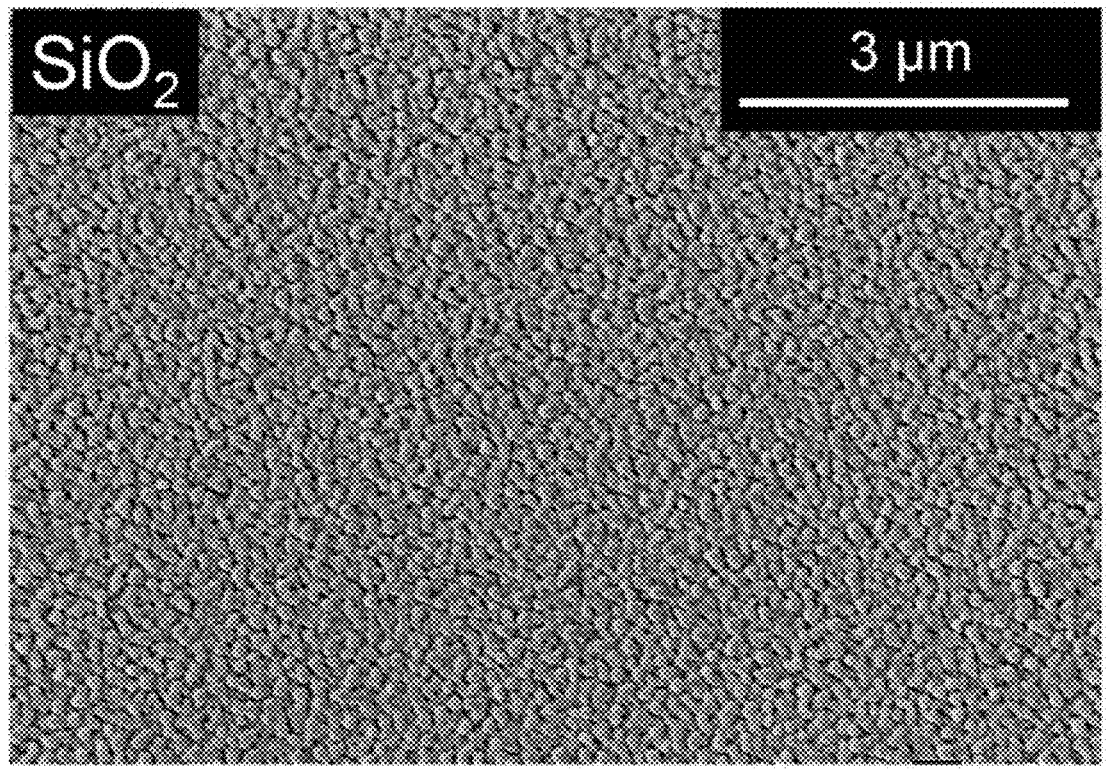
FIG. 4D shows a zoomed-out view of the CuBr layer shown in FIG. 3D, according to one or more embodiments.

In the hot-walled ALD reactor, pCVD occurs within a tube furnace, in some embodiments. It was suspected that, when a silicon wafer substrate was placed inside the tube furnace and heat applied until the temperature display stabilized, the true temperature may not be the same as that displayed. For example, the furnace may be out of calibration, the temperature of the tube and the coils may differ (e.g., since thermal contact may be imperfect and the insulation material may have aged and chipped away), or the top surface of the silicon may be exposed to a low pressure of gas. In some embodiments, if left for a few hours, the gas may reach thermal equilibrium with the walls. However, during a CVD reaction according to some embodiments, new gas aliquots are pulsed in on the order of seconds. In some embodiments, these gases are at lower temperatures than the tube furnace initially, so they may cause instantaneous cooling. Therefore, in some embodiments, as shown in FIG. 2C, the thermocouple-measured temperature was calibrated to the furnace coil temperature. As shown in FIG. 2D, the in situ temperature on the substrate during the pCVD sequence was also measured over time. During one pCVD cycle, the in situ temperature decreased about 0.5° C. in response to a $N_2$ purge and evacuation steps.

In some embodiments, the morphology of copper halide layers grown by pCVD may be dependent on the surface free energy match between the deposited material and the surface material. In some embodiments, cuprous halides do not easily wet metal oxides. For example, vapor-converted CuBr formed islands on $SiO_2$ and CuI formed islands on $Cu_2O$, unless the interfacial free energy was altered (e.g., by a wetting agent). Also, for example, CuI formed islands when grown on $Al_2O_3$, $SiO_2$, Si, and GaAs. Accordingly, the direct CVD process was evaluated on $SiO_2$ (for comparison), as well as on alternative substrates that may, in some embodiments, allow formation of densely packed, continuous copper halide layers instead of sparse islands.

Four substrates were selected for initial analysis, based on availability, surface free energy considerations, and compatibility with certain analytical techniques: glassy carbon, SiN, platinum, and silica. As shown in FIGS. 3A-3D, when pCVD was performed at 83.4° C., apparent crystallites of approximately 100 nm in diameter were observed on each of 4 substrate surfaces: glassy carbon, SiN, platinum, and $SiO_2$. All CuBr layers shown in FIG. 3A-3D were deposited using 600 cycles of pCVD. These layers were uniform across the 1 in ×1 in substrates (FIGS. 4A-4D). The micrographs in FIGS. 4A-4D show uniformity across 10 microns of CuBr layer length (zoom=10 microns). CuBr grains on $SiO_2$ were somewhat islanded, with $SiO_2$ substrate visible in the planview SEM images. In contrast, the approximately 70 nm-thick CuBr layers grown on glassy carbon, SiN, and platinum were continuous at the 83.4° C. growth temperature.

CuBr layer thickness increased with cycle number. The CuBr layer thickness grew approximately 1 Å per cycle, as estimated from 75 nm-thick layers deposited via 600 cycles on SiN substrates.

Cu(hfac)(vtms) disproportionated to form the nonproductive $Cu^0$ and $Cu(hfac)_2$ over time and with heating. In some embodiments, this reaction may take place over timescales relevant to the pCVD process, when the Cu(hfac)(vtms) precursor was heated to 35° C. However, in some embodiments, no significant difference between CuBr layers grown immediately after Cu(hfac)(vtms) was loaded and layers grown 5 months thereafter (the timescale of re-loading the precursor) were observed.

Substrate Oxidation Assessment

In some embodiments, the SiN substrate may oxidize over time. In some embodiments, oxidation of the substrate may occur with exposure to ambient oxygen or moisture, such as during transfer from the CVD instrument or during storage (while, in some embodiments, the substrates are stored in a container under positive $N_2$ pressure, opening of this storage container may introduce oxygen or moisture).

In some embodiments, SiN may react with water vapor to form a surface layer of silica:

$$Si_3N_4 \text{ (s)} + 6H_2O \text{ (g)} \rightarrow 3SiO_2 \text{ (s)} + 4NH_3 \text{ (g)}.$$

If, for example, ΔH$_{rxn}$ does not vary with temperature, this reaction is highly exothermic, with ΔG$_{rxn}$=−620.55 kJ/mol at 25° C.

In some embodiments, SiN may react with O$_2$ to form a surface layer of SiO$_2$:

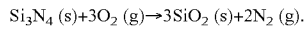

$Si_3N_4$ (s)+3$O_2$ (g)→3$SiO_2$ (s)+2$N_2$ (g).

If, for example, ΔH$_{rxn}$ does not vary with temperature, this reaction is highly exothermic, with ΔG$_{rxn}$=−1926 kJ/mol at 25° C.

The above ΔG$_{rxn}$ calculations may be suggestive of formation of a surface layer of SiO$_2$ atop the SiN substrate. However, these ΔG$_{rxn}$ calculations may not account for the activation barrier to their associated reactions, which may be high.

Figure 5A:
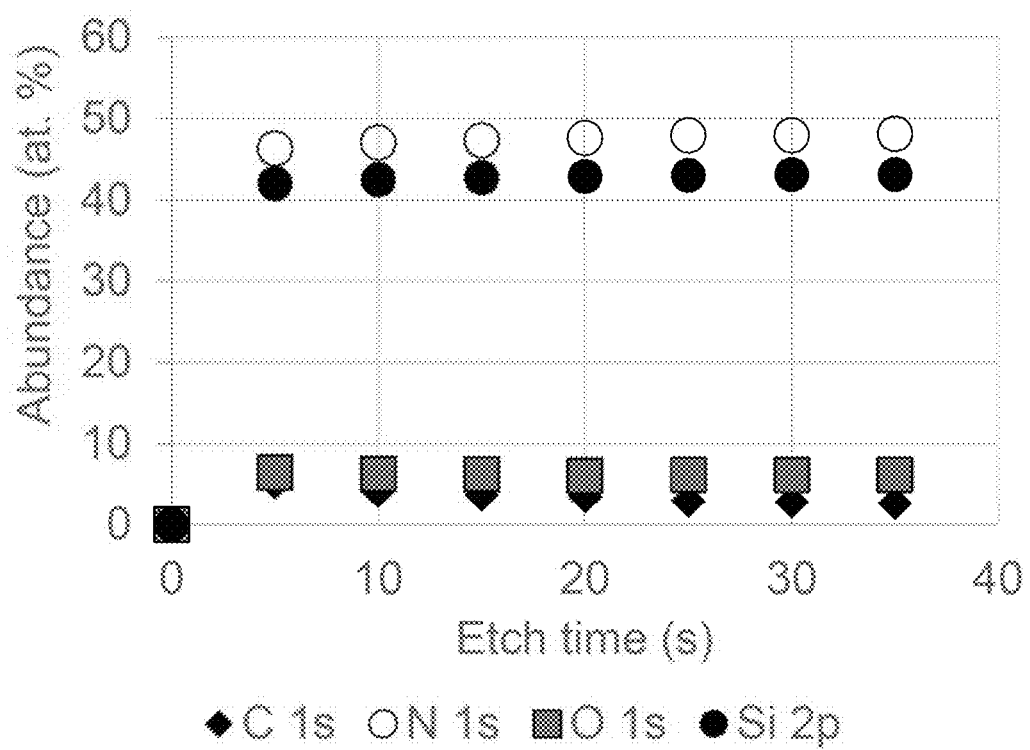
FIG. 5A shows an X-ray photoelectron spectroscopy ("XPS") depth profile of a SiN substrate after 18 days of storage in a partially sealed container under a $N_2$ atmosphere, according one or more embodiments.
Figure 5B:
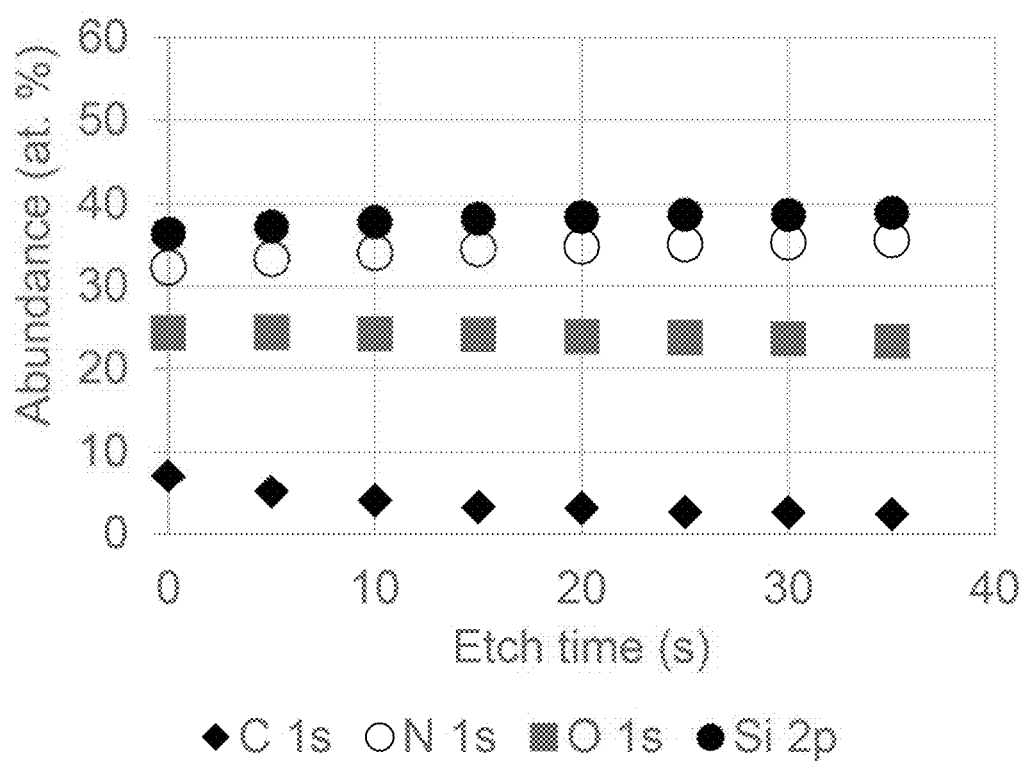
FIG. 5B shows an XPS depth profile of a SiN substrate after 5 months of storage in a partially sealed container under a $N_2$ atmosphere, according one or more embodiments.

To understand the oxidation of SiN substrates, XPS depth profiling was used to assess the elemental composition of the substrate surface of samples that were aged either 18 days or 5 months. As shown in FIGS. 5A-5B, the 18-day-old sample had some surface carbon and oxygen (2-5% C, 5% O, 43% Si, 48% N) whereas the 5-month-old sample had some surface carbon but much more surface oxygen (2-5% C, 23% O, 38% Si, 35% N). For FIGS. 5A-5B, high-resolution (atomic) scans were obtained using cluster sputtering at 4000 eV ion energy.

Figure 5C:
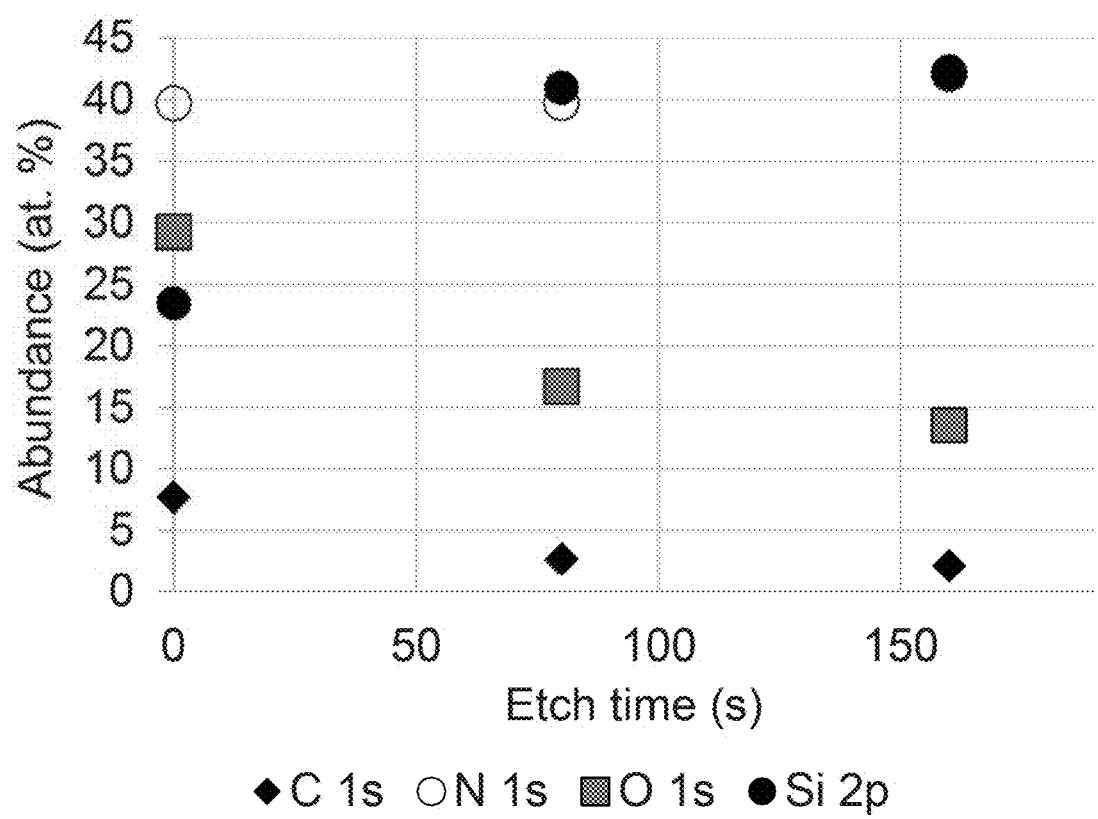
FIG. 5C shows an XPS depth profile of a SiN substrate after 4 days of storage in a partially sealed container under a $N_2$ atmosphere, according one or more embodiments.

To understand whether the SiN oxidation occurs just at the surface of the film or extends deeper into the film, XPS depth profiling was conducted in which a deep etch was formed into a SiN film aged for 4 months. As shown in FIG. 5C, even relatively deep into the bulk of the film after 160 seconds of sputtering, the atomic percentage of oxygen is 14%. For FIG. 5C, high-resolution (atomic) scans were obtained using monatomic sputtering at 500 eV ion energy.

In some embodiments, exposing the SiN adhesion layer to ambient air may affect the nucleation of CuBr on SiN. To understand the potential effects of ambient oxidation of SiN on CuBr growth, CuBr was deposited on several substrates in the same deposition experiment, including both freshly-deposited SiN substrates and older SiN substrates that had been exposed to air for 4 months. On average, there was no appreciable difference between the CuBr films grown on these two substrate types.

Based on the above oxidation assessment experiments, the SiN films retained an appreciable nitrogen fraction on their surface after 4 months of some form of exposure to ambient conditions. This nitrogen content rendered the SiN substrates different enough from SiO$_2$ such that, even though the CuBr deposition process reported herein formed uncoalesced CuBr islands on SiO$_2$, it formed dense CuBr films on SiN substrates. SiN substrates used for CuBr depositions were aged for ≤about four months.

Copper Halide Layer Composition Characterization

Figure 6A:
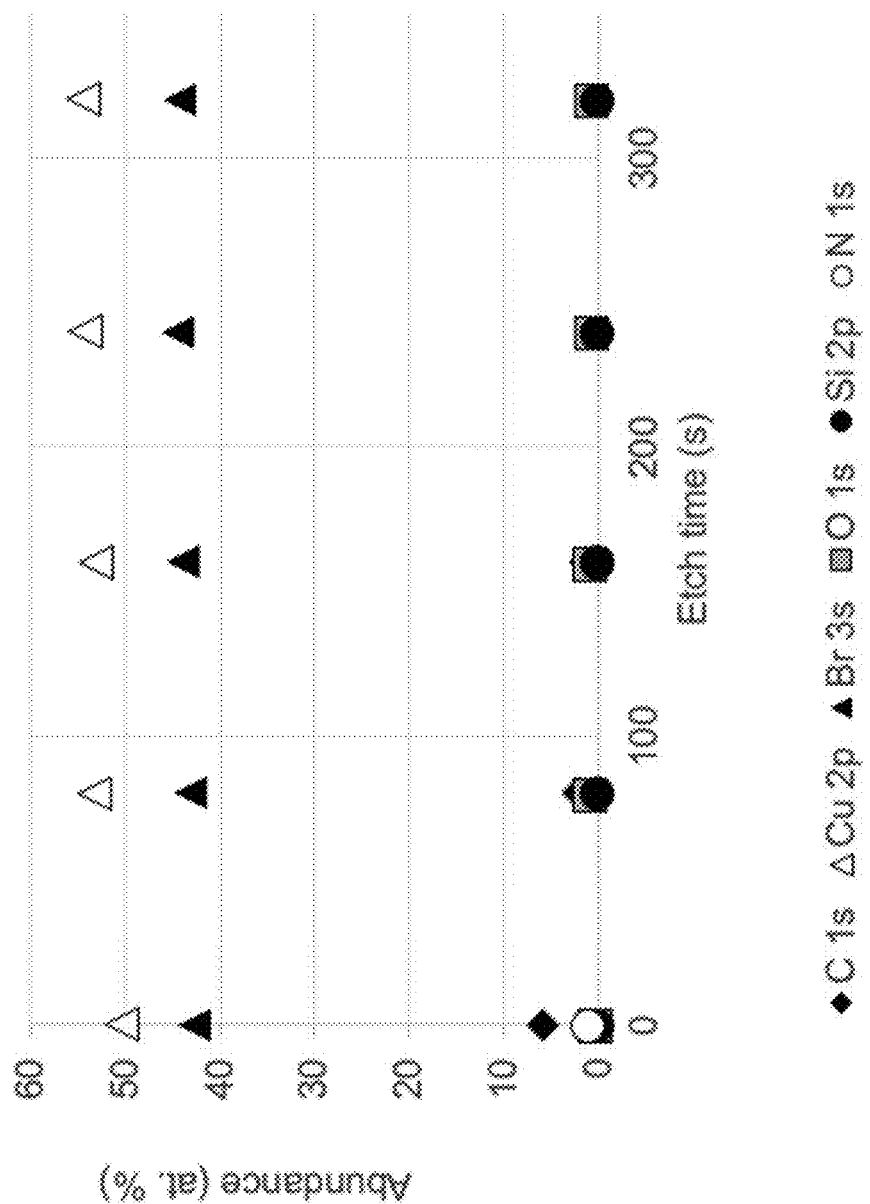
FIG. 6A shows an XPS depth profile of CuBr deposited on SiN by pCVD, according one or more embodiments.
Figure 6B:
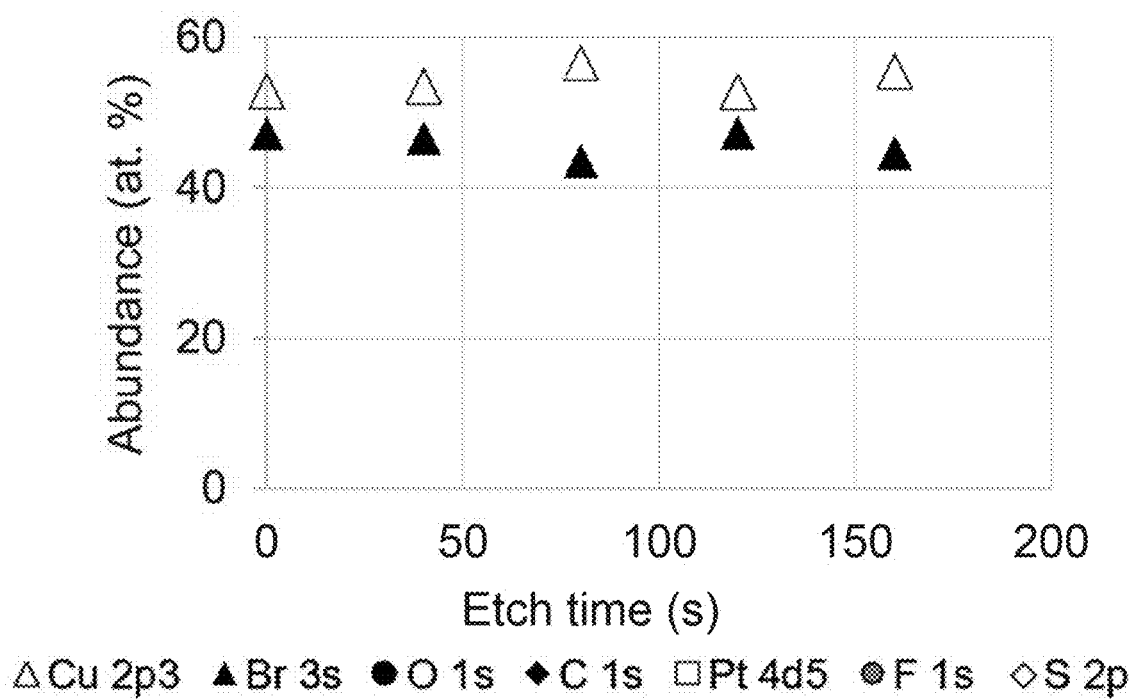
FIG. 6B shows an XPS depth profile of CuBr deposited on platinum at 65.8° C. by pCVD, according one or more embodiments.
Figure 6C:
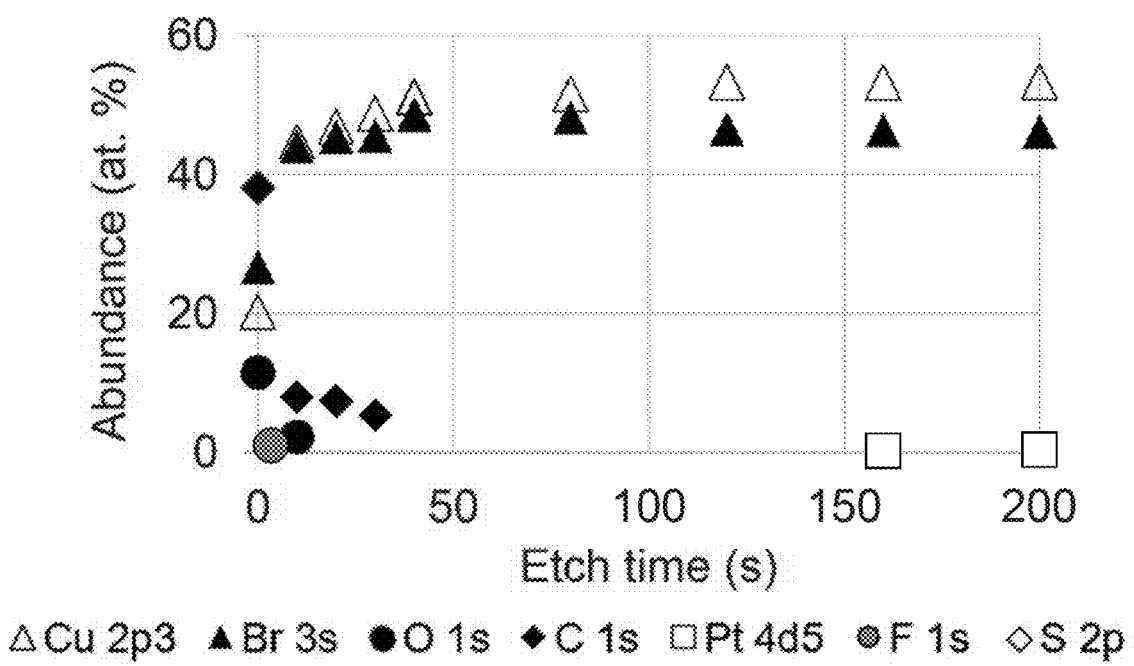
FIG. 6C shows an XPS depth profile of CuBr deposited on platinum at 83.4° C. by pCVD, according one or more embodiments.
Figure 6D:
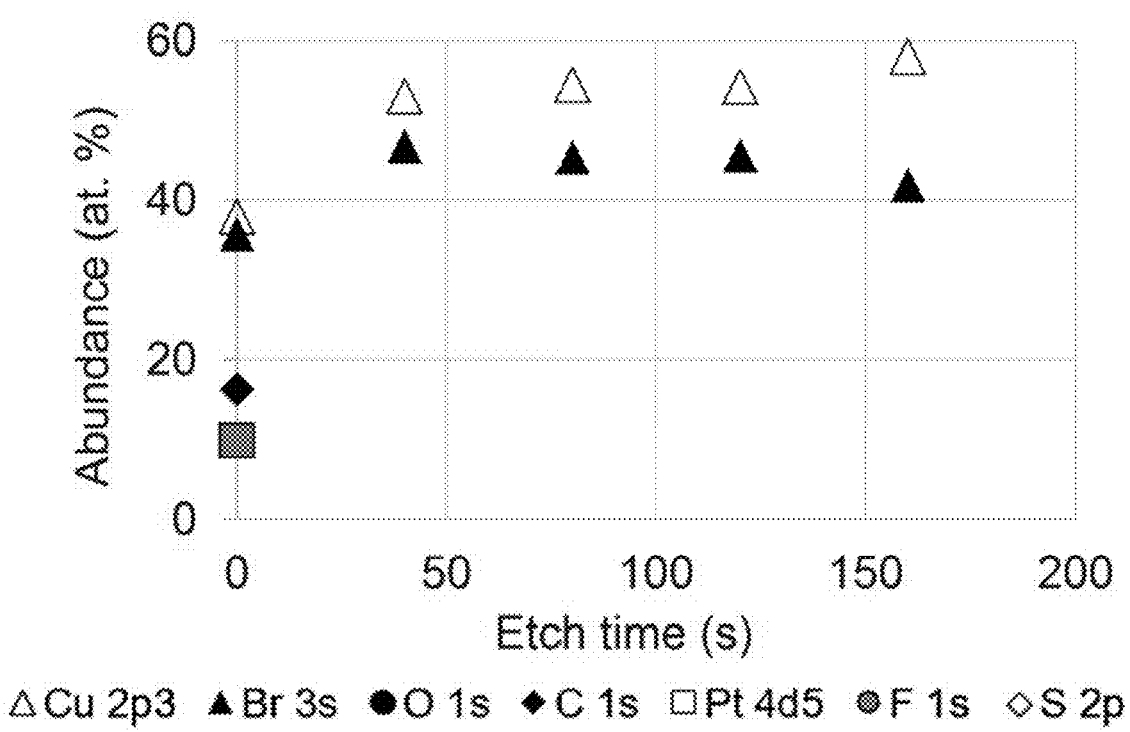
FIG. 6D shows an XPS depth profile of CuBr deposited on platinum at 162.8° C. by pCVD, according one or more embodiments.
Figure 6E:
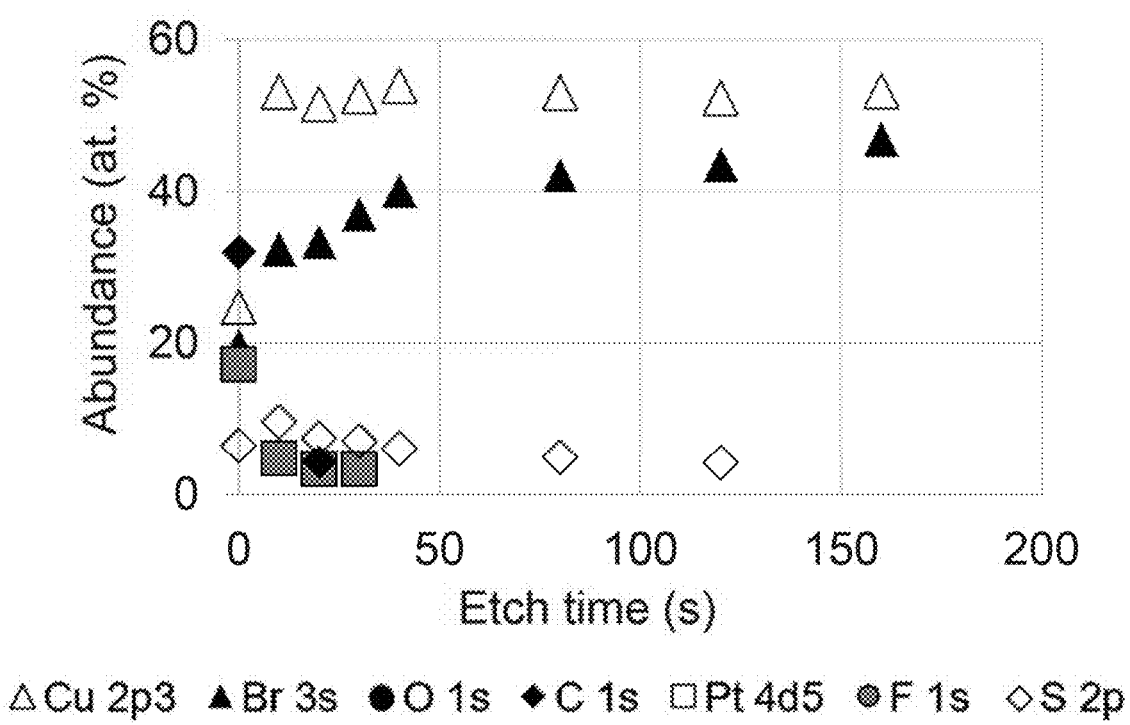
FIG. 6E shows an XPS depth profile of CuBr deposited on platinum at 189.3° C. by pCVD, according one or more embodiments.

Two methods were used to evaluate the elemental composition of the deposited CuBr layers. First, XPS was used. As shown in FIG. 6A, the composition of the layer grown on SiN was 55% Cu and 45% Br by XPS. In FIG. 6A, the XPS depth profile of CuBr deposited on SiN at 83.4° C. using a pCVD process is shown, according to some embodiments. After any surface contamination was sputtered away, the elemental composition of the CuBr layer was measured. FIGS. 6B-5E show the XPS depth profile of CuBr deposited on platinum at 65.8° C., 83.4° C., 162.8° C., and 189.3° C., respectively, using a pCVD process, according to some embodiments. As shown in FIGS. 6B-5E, the composition of the layer grown on platinum was 55% Cu and 45% Br.

Figure 7:
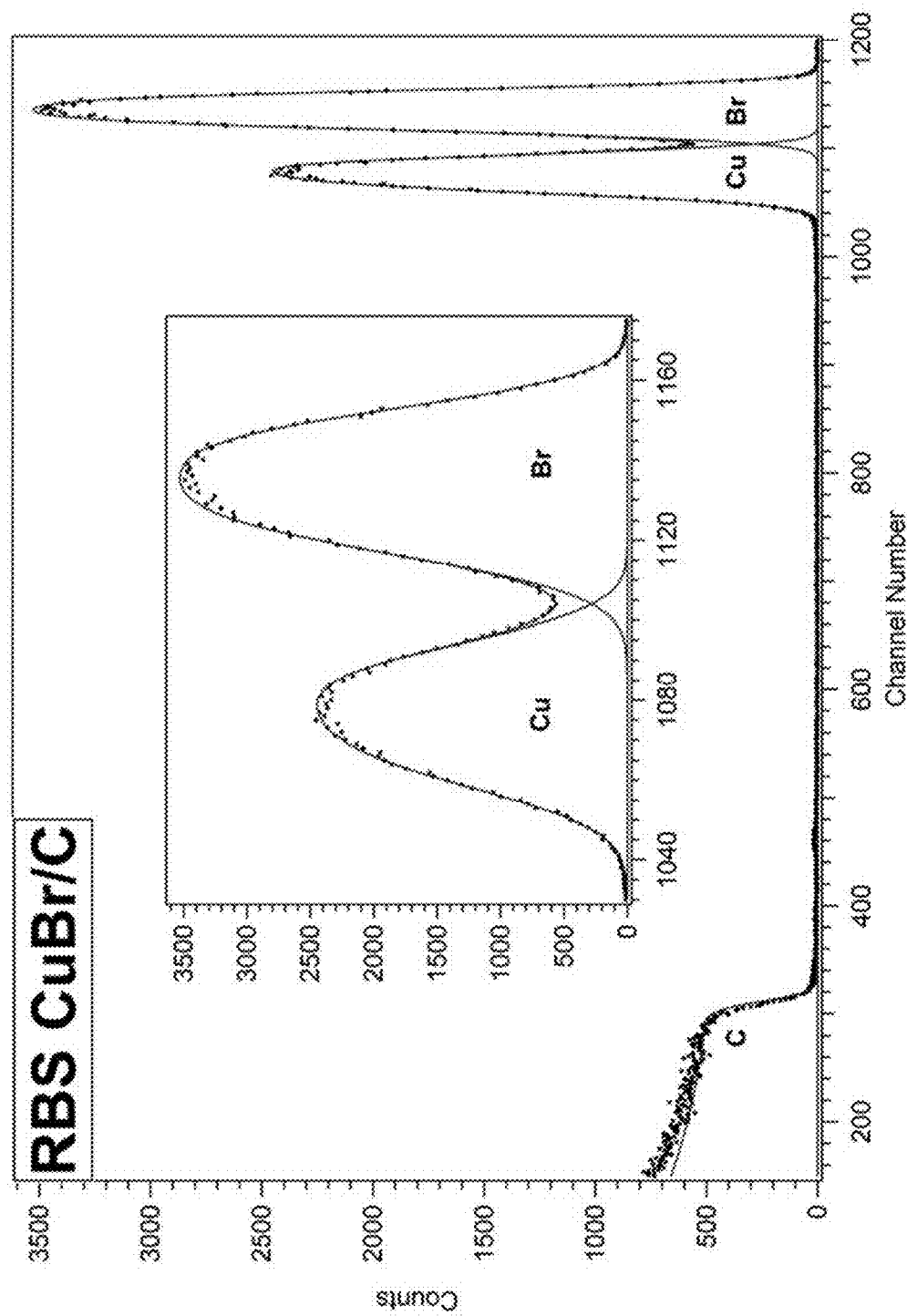
FIG. 7 shows Rutherford backscattering spectrum ("RBS") fits for CuBr grown on glassy carbon, according to one or more embodiments.

In some embodiments, matrix effects can alter the detection efficiency of photoelectrons, and there is no a priori reason to expect the uncalibrated XPS values to be quantitative. Given the deviation from the expected 50/50 ratio of Cu to Br and these matrix effects, the XPS composition was calibrated with RBS. In some embodiments, RBS is used to detect, in a layer, elements that are heavier than elements comprising the substrate. The CuBr layer grown on glassy carbon was subjected to RBS analysis, allowing a search for impurities of N, O, etc., to the ~1% level. The areal density of Cu and Br were each 184±3×10$^{15}$ atoms/cm$^2$ as revealed by RBS, giving a stoichiometry of $Cu_{1.00}Br_{1.00\pm0.02}$. No other elements heavier than carbon were detected by RBS. Further, as shown in FIG. 7, the peak shapes of the RBS spectra indicated compositional uniformity throughout the CuBr layer. The RBS fits shown in FIG. 7 indicated that identical counts of Cu and Br atoms were found in the CuBr layer, and that no other elements were detected. The peak shapes indicated compositional uniformity throughout the CuBr layer.

Figure 8:
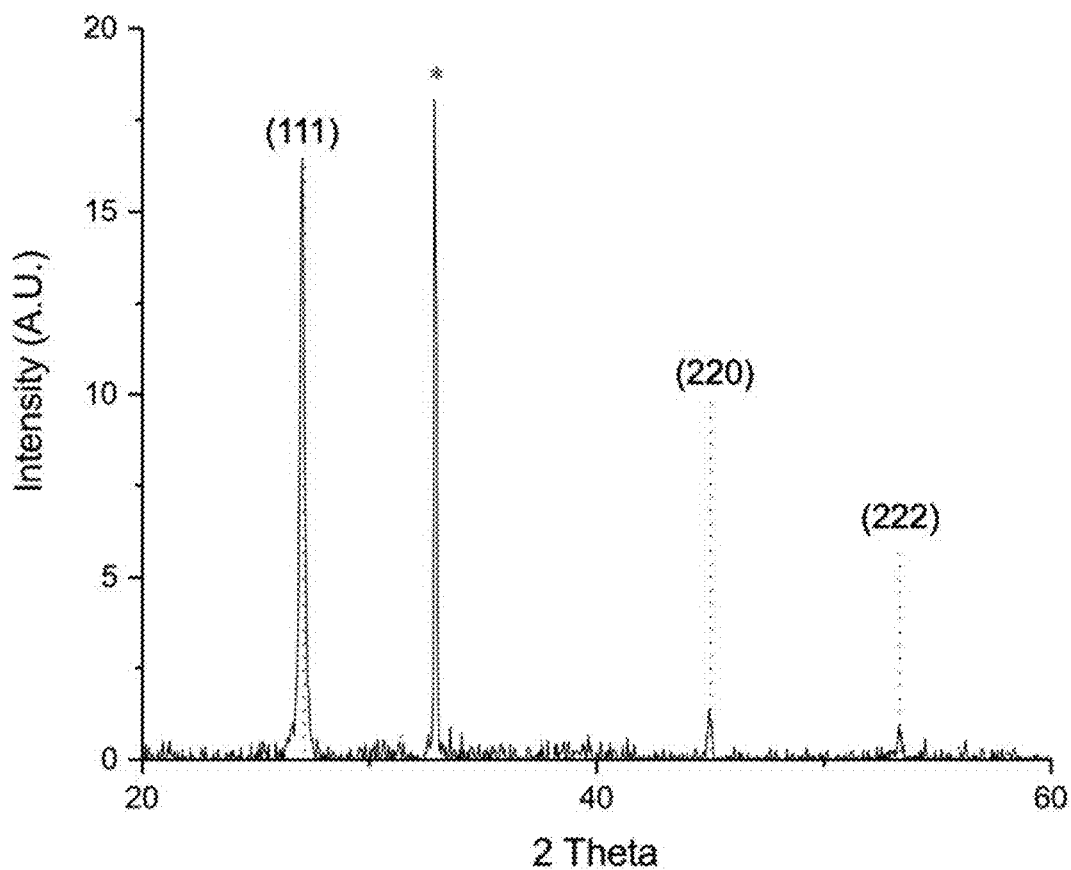
FIG. 8 shows an X-ray diffraction ("XRD") pattern of CuBr deposited on SiN, according to one or more embodiments.

It was further shown that the layers were composed of CuBr via X-ray powder diffraction. As shown in FIG. 8, the CuBr layers were crystalline and highly oriented in the direction. The experimental pattern matched PDF 006-0292 for γ-CuBr. Using the Scherrer equation, a value of 43 nm was calculated for τ, the mean size of the ordered (crystalline) domains. This value of τ was smaller than the apparent grain size by microscopy, which was between 50-200 nm for the same film. FIG. 8 shows the XRD pattern of CuBr deposited on SiN via 600 cycles of pCVD. In FIG. 8, the dotted lines are PDF 006-0292, for γ-CuBr. In FIG. 8, the asterisk (*) denotes a background peak associated with the X-ray powder diffraction instrument.

Deposition Temperature Study

Figure 9A:
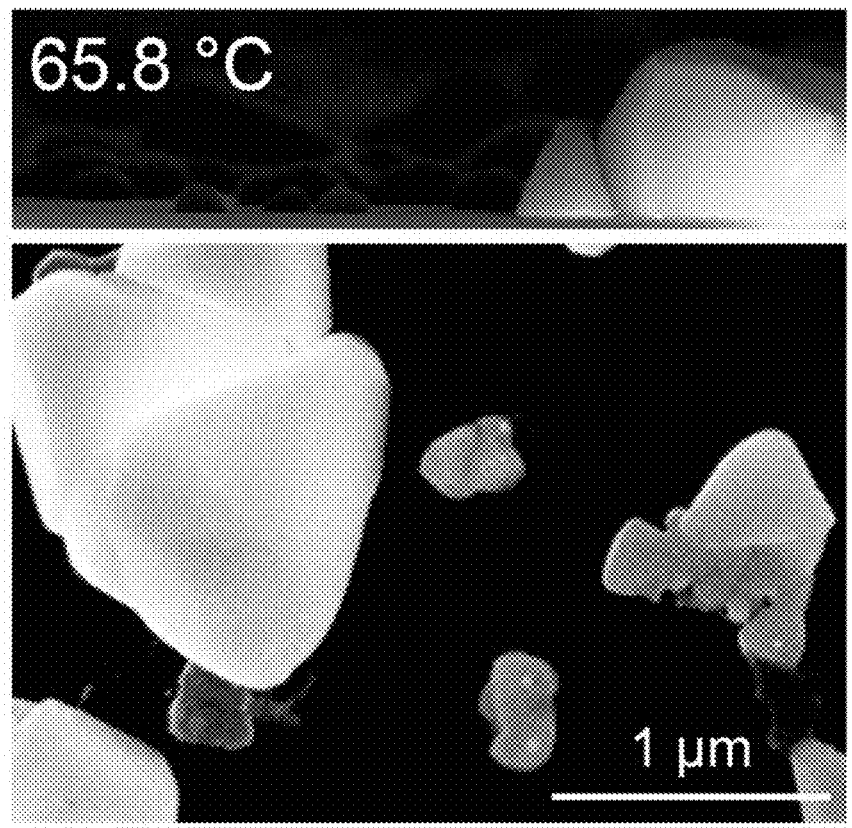
FIG. 9A shows a SEM image of CuBr grown on SiN at 65.8° C., according to one or more embodiments.
Figure 9B:
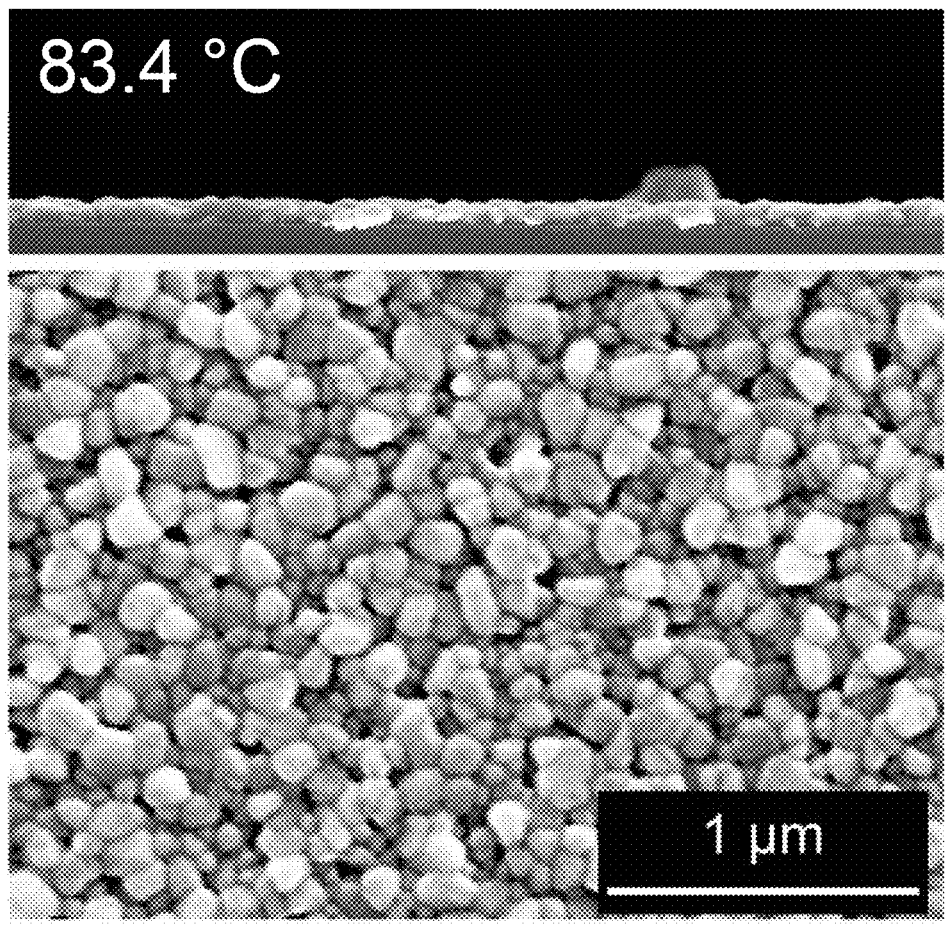
FIG. 9B shows a SEM image of CuBr grown on SiN at 83.4° C., according to one or more embodiments.
Figure 9C:
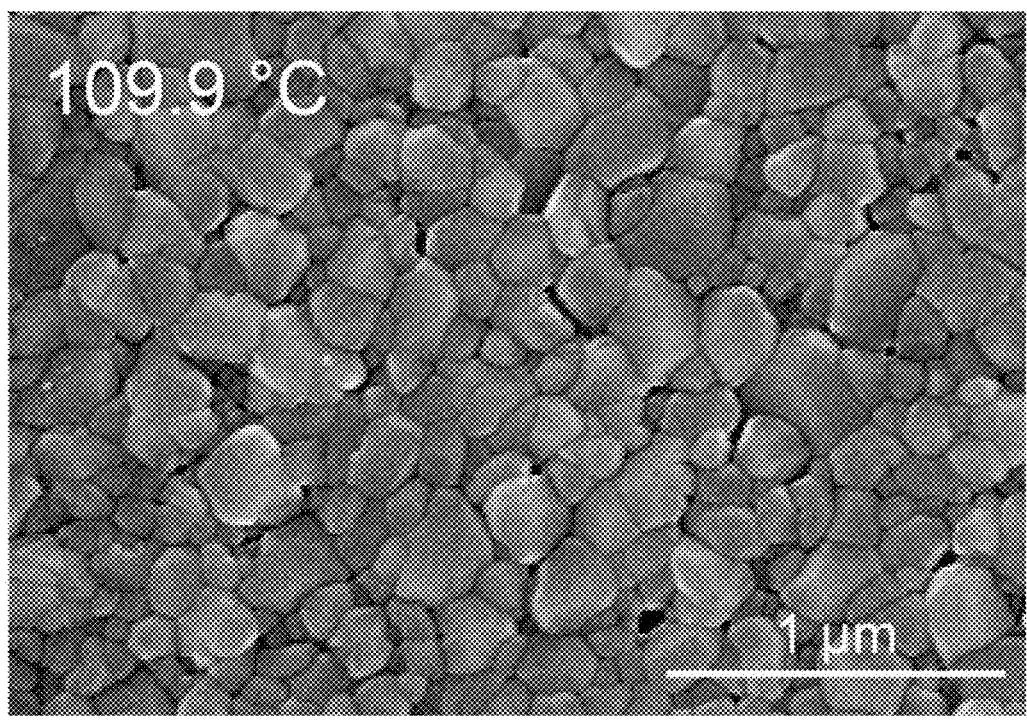
FIG. 9C shows a SEM image of CuBr grown on SiN at 109.9° C., according to one or more embodiments.
Figure 9D:
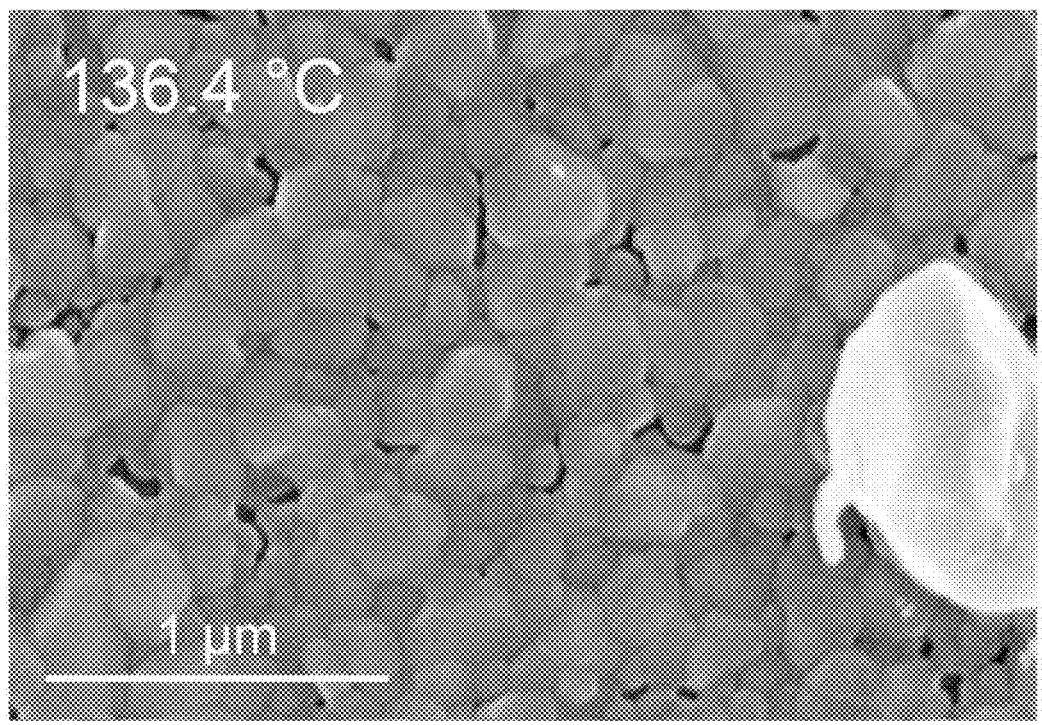
FIG. 9D shows a SEM image of CuBr grown on SiN at 136.4° C., according to one or more embodiments.
Figure 10A:
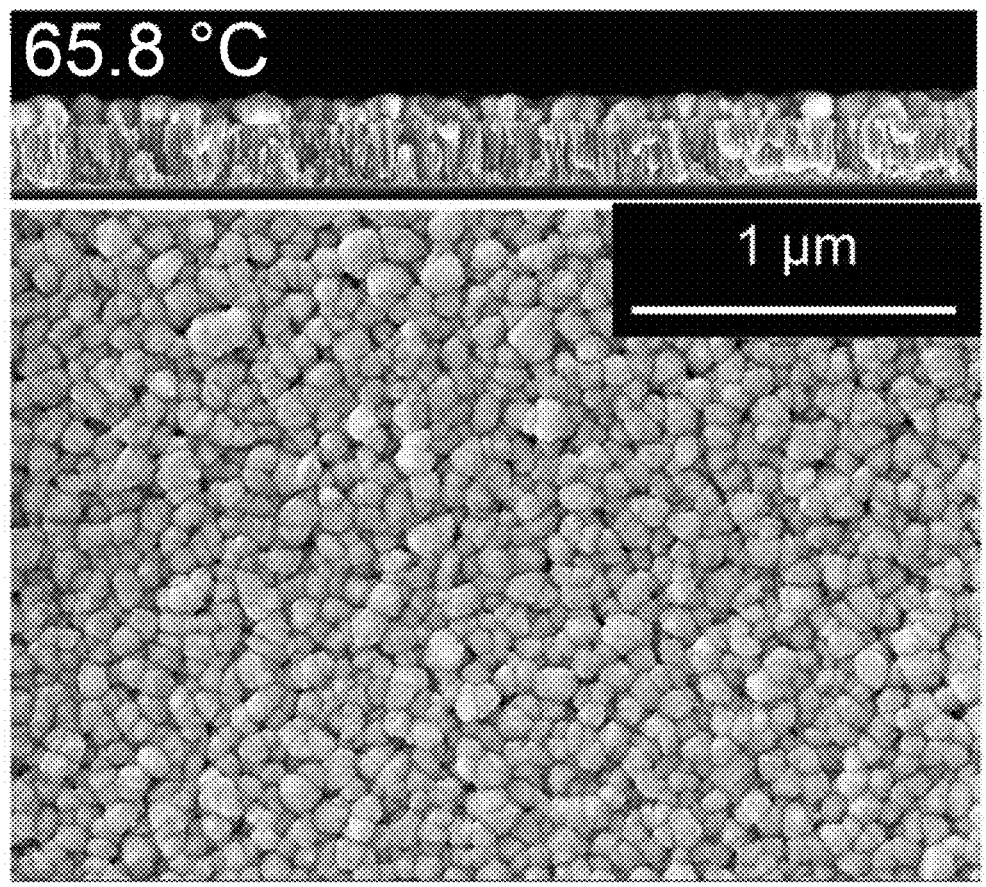
FIG. 10A shows a SEM image of CuBr deposited on platinum using pCVD at 65.8° C., according to one or more embodiments.
Figure 10B:
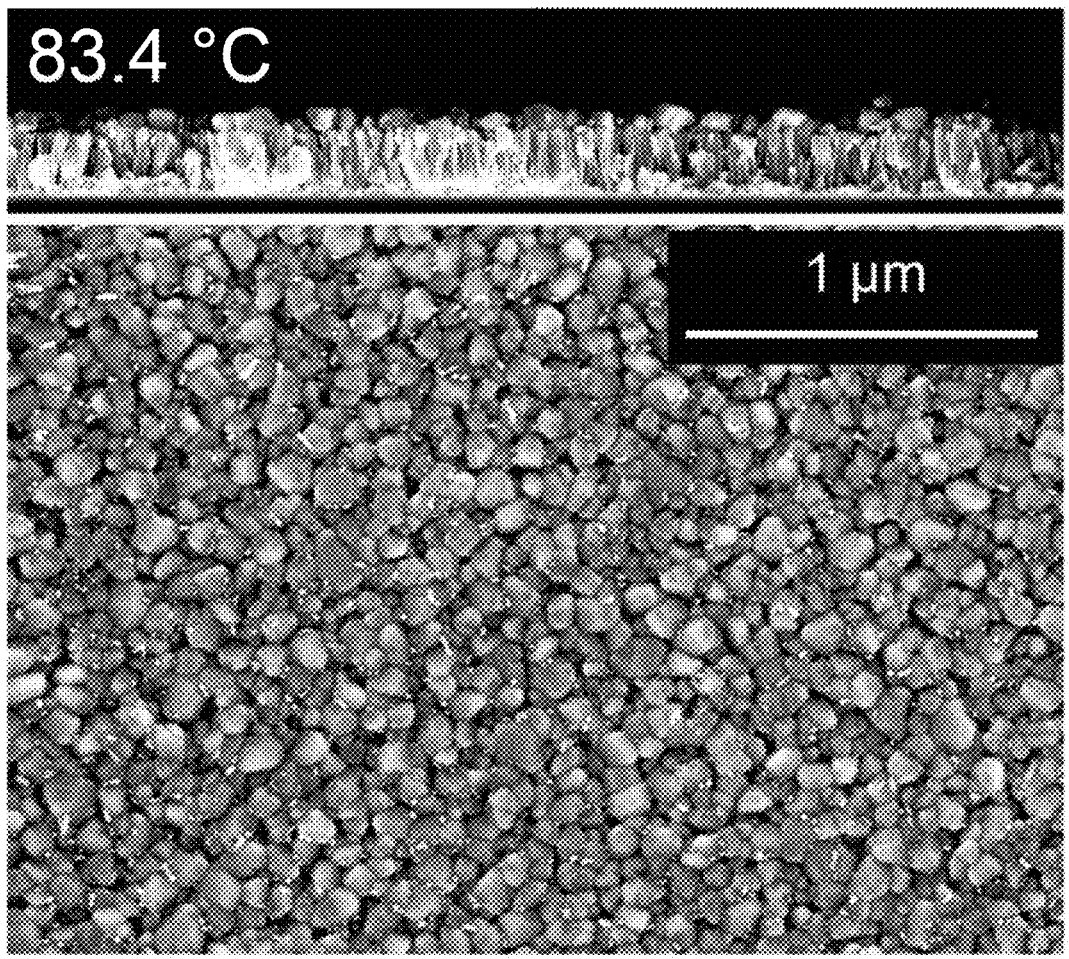
FIG. 10B shows a SEM image of CuBr deposited on platinum using pCVD at 83.4° C., according to one or more embodiments.
Figure 10C:
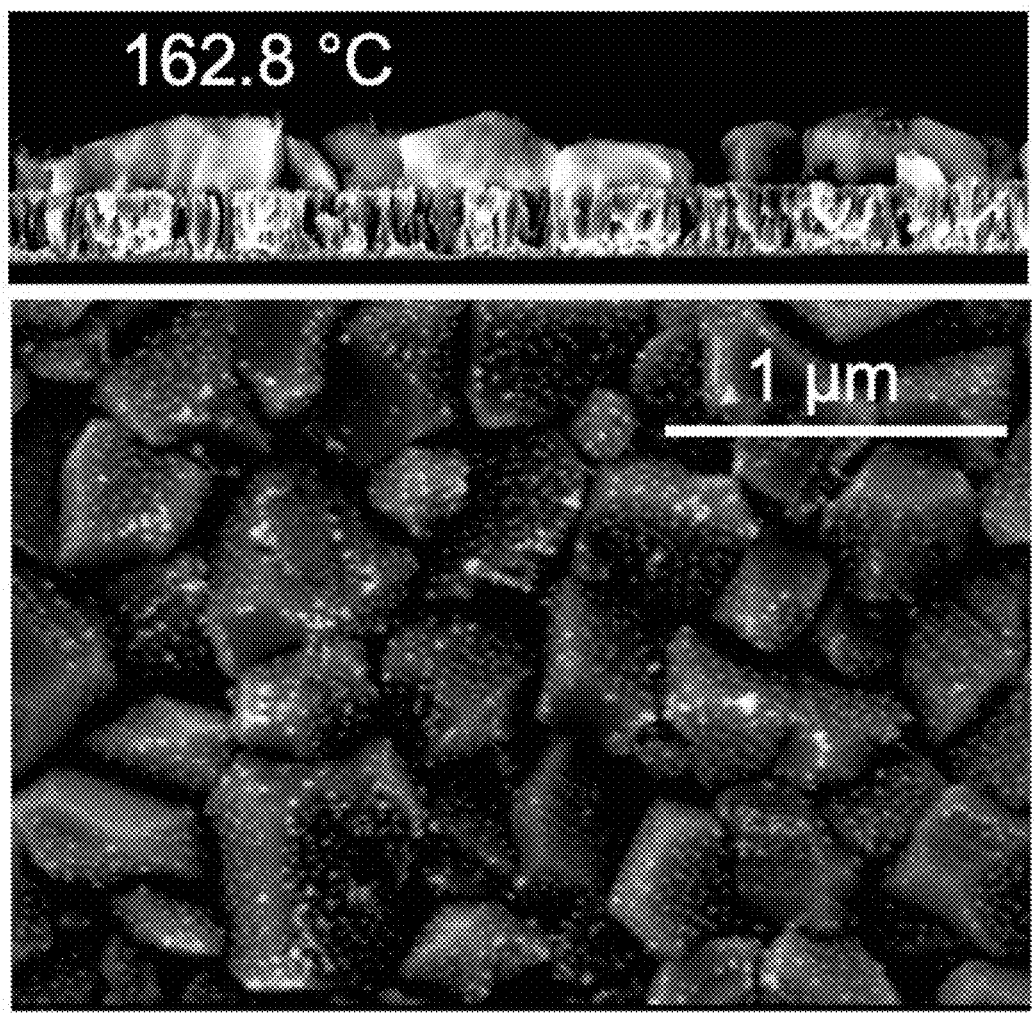
FIG. 10C shows a SEM image of CuBr deposited on platinum using pCVD at 162.8° C., according to one or more embodiments.
Figure 10D:
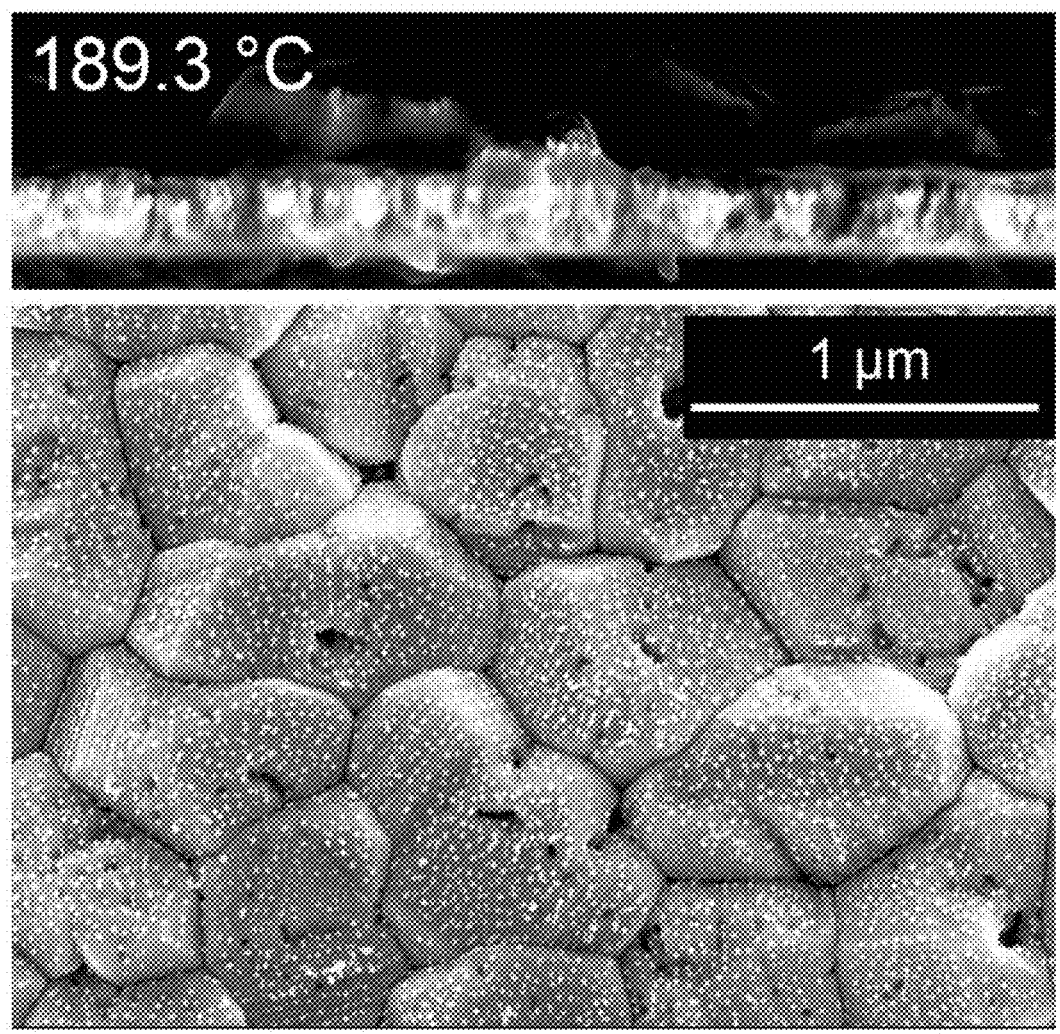
FIG. 10D shows a SEM image of CuBr deposited on platinum using pCVD at 189.3° C., according to one or more embodiments.

Based on the results of the substrate screen, the deposition characteristics on SiN and platinum substrates were further studied. CuBr was deposited using pCVD at a range of temperatures between 65° C. and 200° C. When grown on both SiN and platinum substrates above 80° C., CuBr grains increased in size as a function of temperature, as shown in FIGS. 9A-9D on SiN and in FIGS. 10A-10D on platinum. In FIG. 9A, the scale bar is 1 micron.

When CuBr was grown on SiN at 65.8° C., the CuBr grains were islands, the sizes of which varied an order of magnitude, from 100 nm to 2 microns in diameter. In some embodiments, these observations may suggest that the rate of nucleation of CuBr on SiN increases with temperature.

FIGS. 10A-10D show SEM images of CuBr deposited on platinum at 65.8° C., 83.4° C., 162.8° C., and 189.3° C., respectively, with average CuBr layer thicknesses, determined via cross-sectional SEM image analysis, of 75±5 nm, 75±5 nm, 170±60 nm, and 450±200 nm, respectively.

FIGS. 11A-11E show SEM images of CuBr grown on SiN at 65.8° C., 65.8° C., 83.4° C., 109.9° C., and 136.4° C., respectively.

Figure 11A:
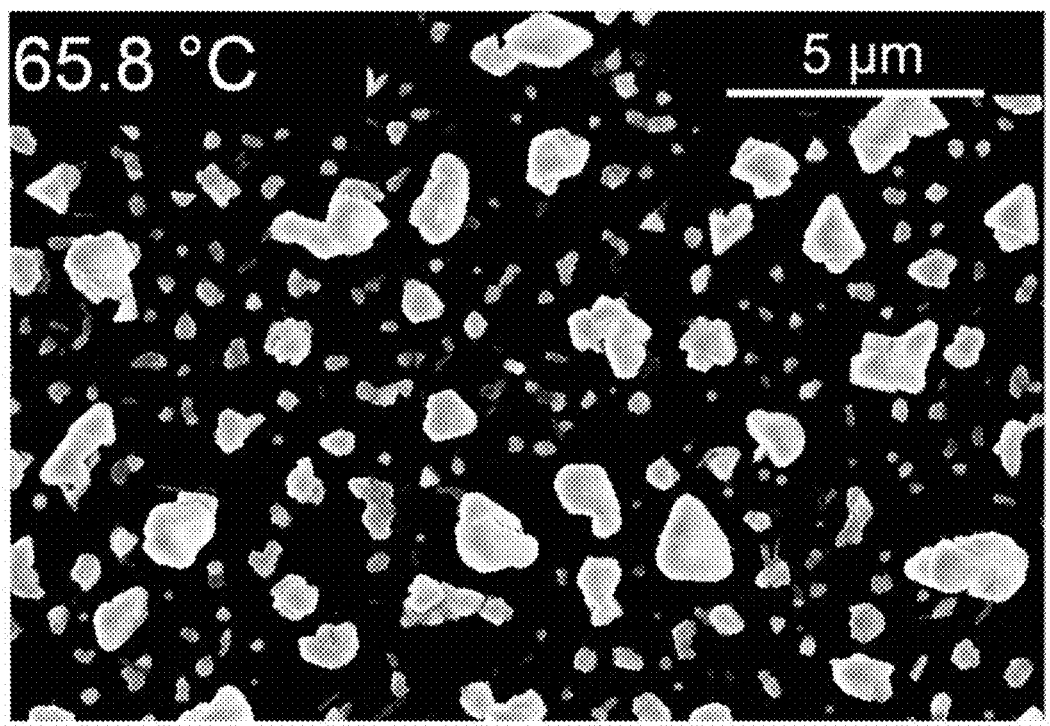
FIG. 11A shows a SEM image of CuBr grown on SiN at 65.8° C., according to one or more embodiments.
Figure 11B:
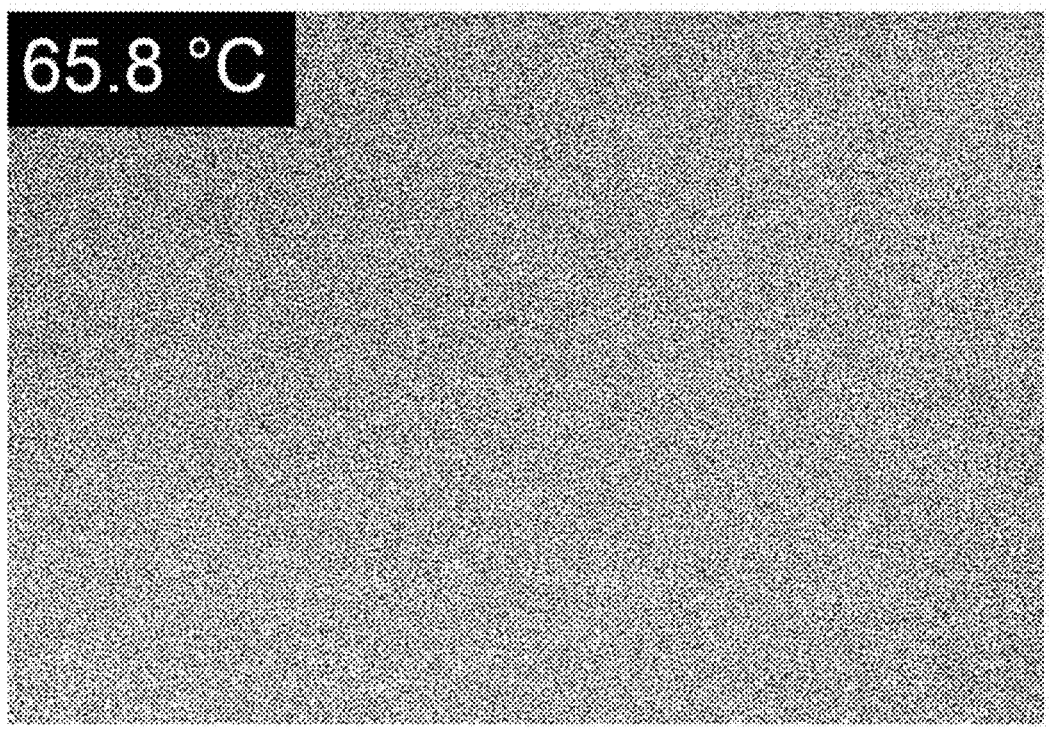
FIG. 11B shows a SEM image of CuBr grown on SiN at 65.8° C., according to one or more embodiments.
Figure 11C:
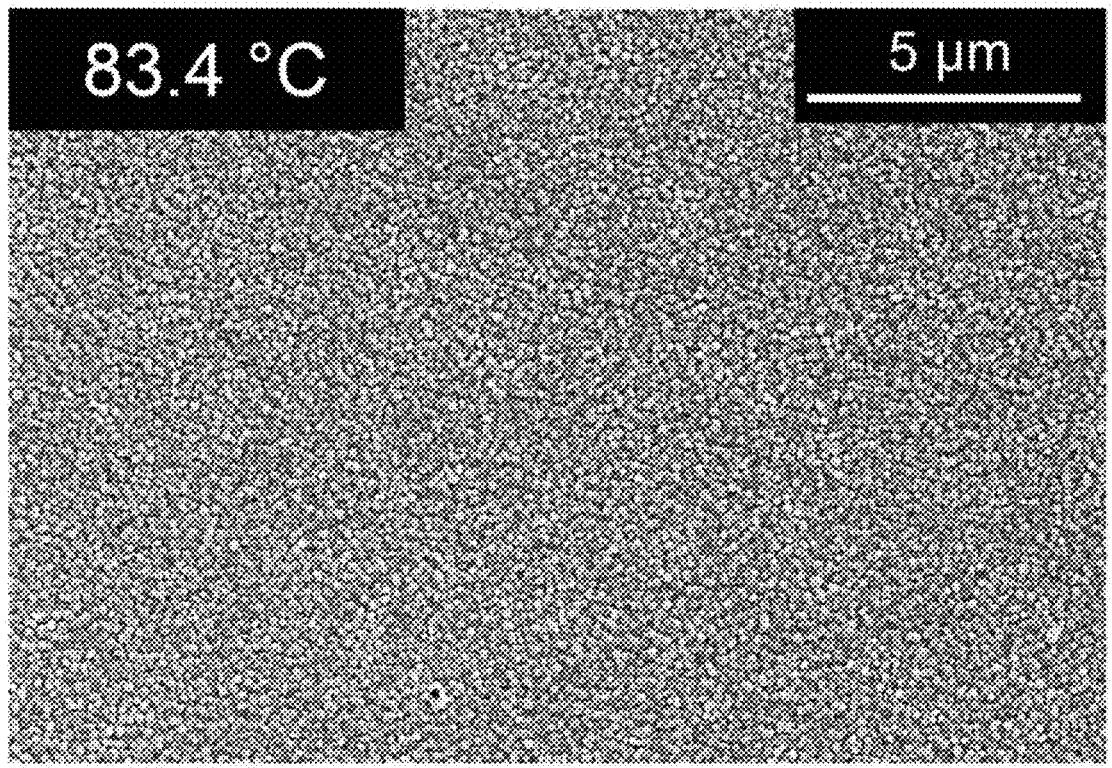
FIG. 11C shows a SEM image of CuBr grown on SiN at 83.4° C., according to one or more embodiments.
Figure 11D:
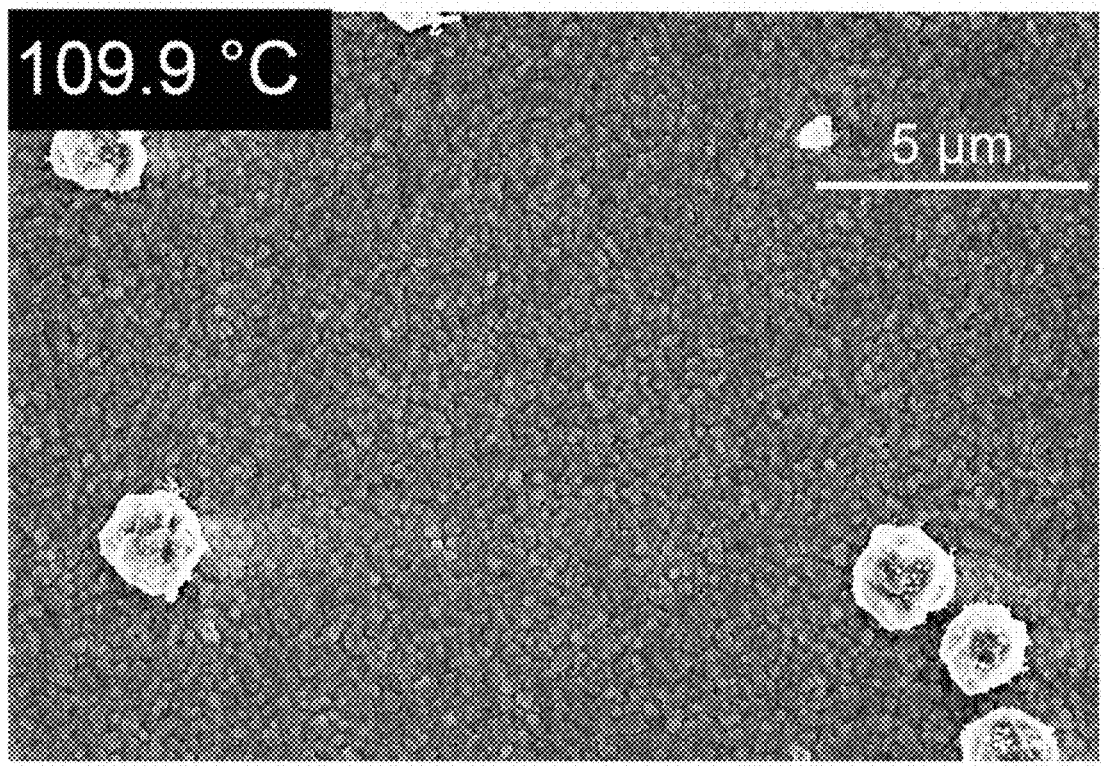
FIG. 11D shows a SEM image of CuBr grown on SiN at 109.9° C., according to one or more embodiments.
Figure 11E:
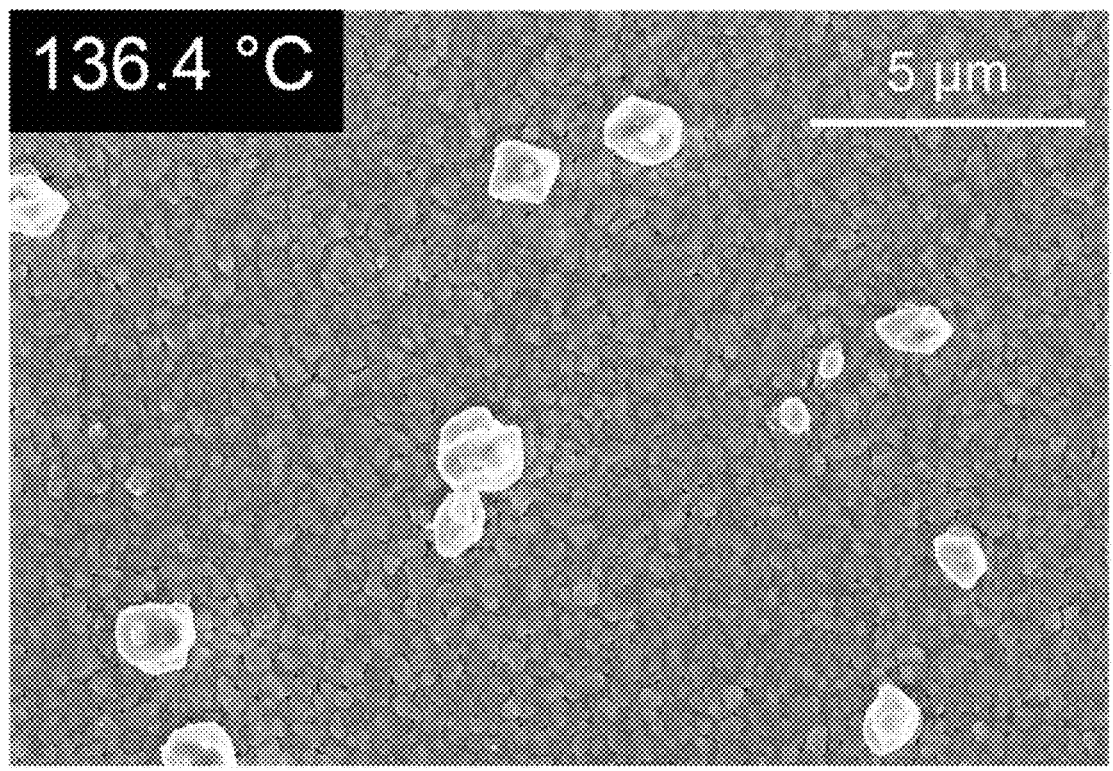
FIG. 11E shows a SEM image of CuBr grown on SiN at 136.4° C., according to one or more embodiments.

As shown in FIGS. 11A-11E, at the high end of the temperature range, 136.4° C., a dense layer of 50-100 nm CuBr grains and scattered ~1 μm CuBr particles were observed. The scale bar in FIG. 11C is 5 microns. At 109.9° C. and above, particles were observed, the areal density of which increased with deposition temperature. These particles were large enough to scatter light, such that the CuBr layer grown at 136.4° C. appeared cloudy to the eye, as opposed to the transparent CuBr layers grown at or below 83.4° C. The apparent film haziness increased with substrate temperature: the film grown at 136° C. was hazier than the film grown at 110° C. In some embodiments, the deposition of large particles at high deposition temperatures is not uncommon in CVD reactions. In some embodiments, the deposition of large particles can result from gas-phase reactions, which can produce solid particles or "powder" on the substrate. A different morphology-temperature profile for CuBr grown on platinum was observed, which, in some embodiments, may be due in part to the complication that the Cu(hfac)(vtms) precursor disproportionates to form $Cu^0$, a process that can be accelerated by increasing temperature.

Figure 12A:
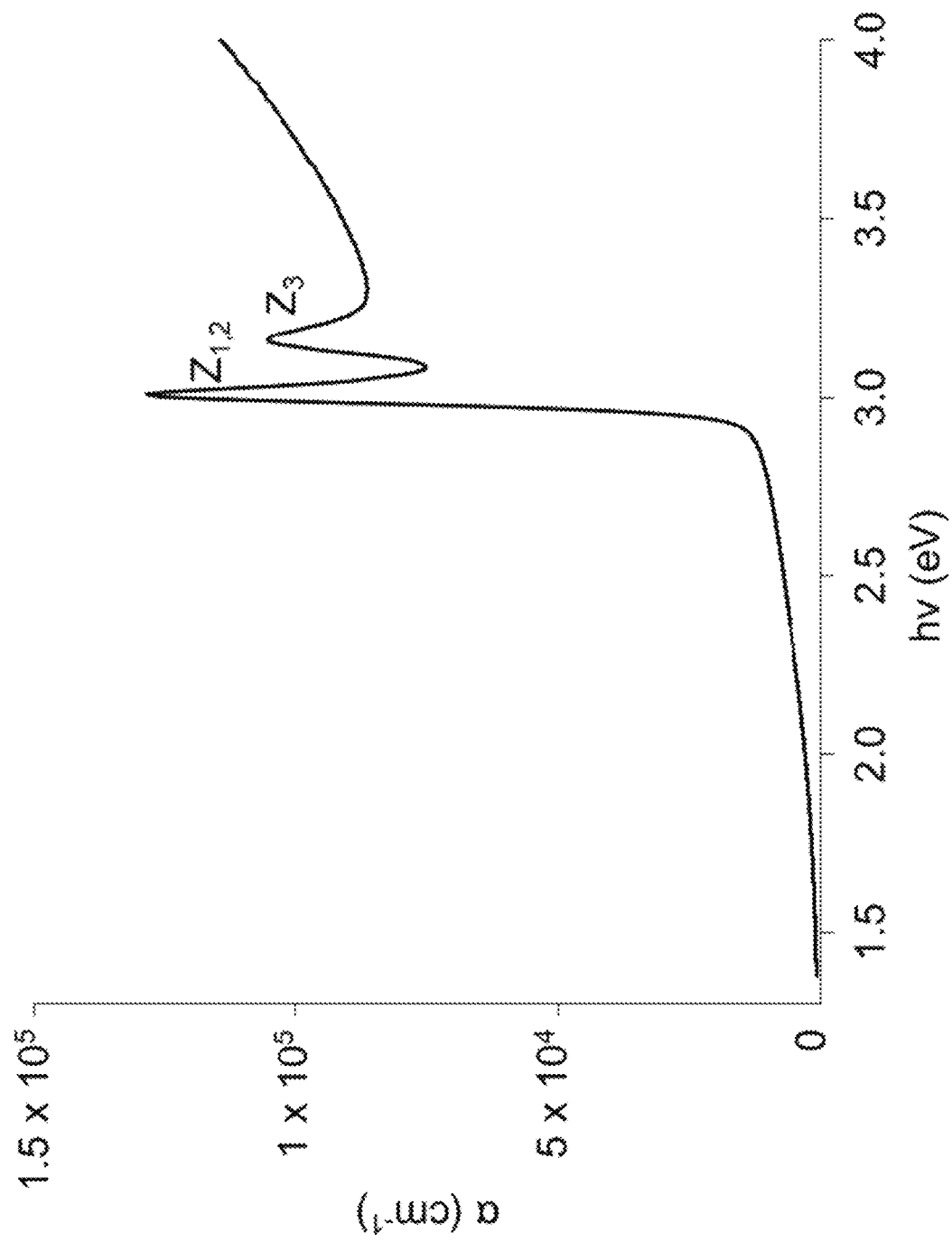
FIG. 12A shows a plot of absorption coefficient versus photon energy for CuBr on 40 nm SiN on quartz, deposited at 83.4° C., according to one or more embodiments.
Figure 12B:
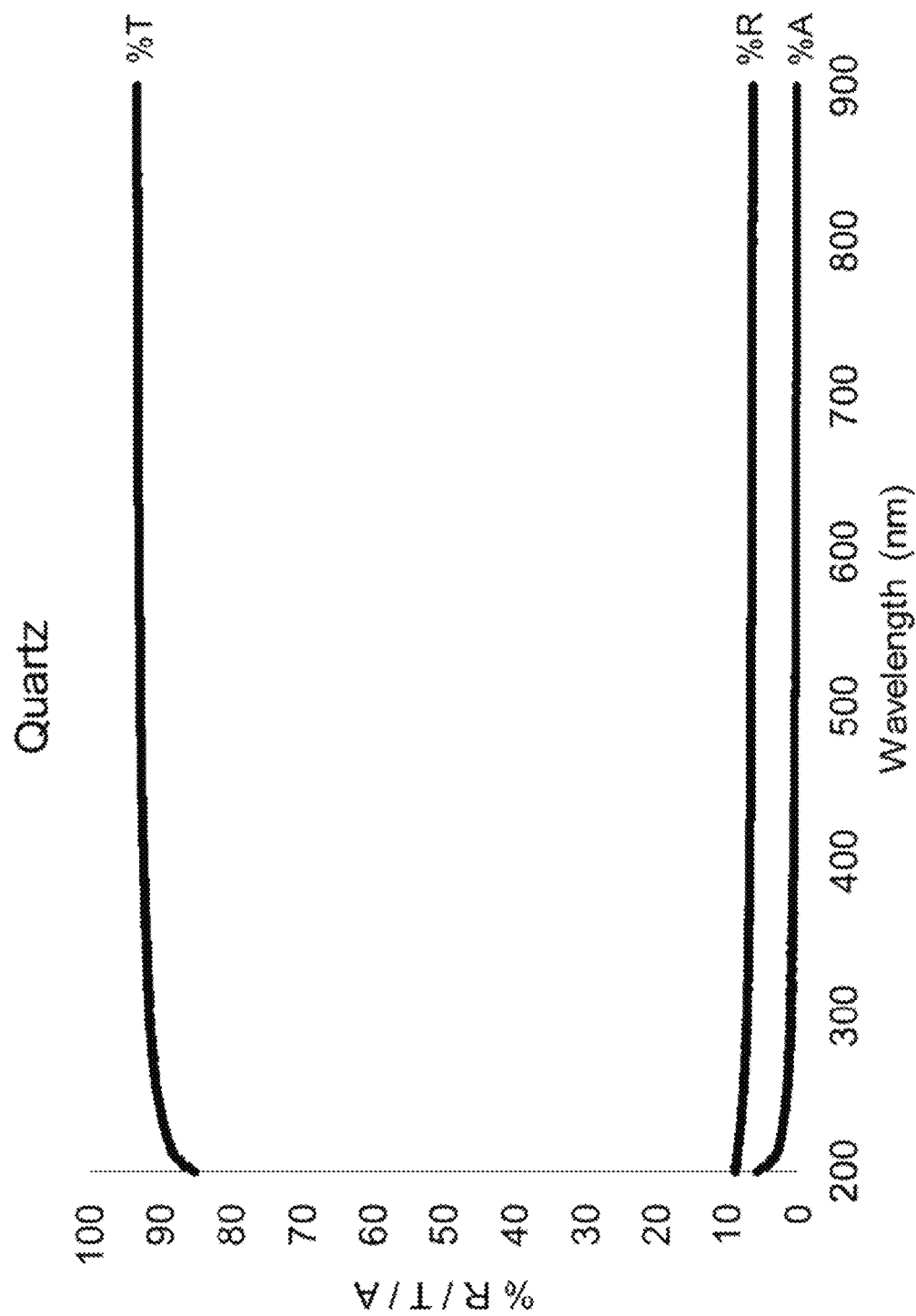
FIG. 12B shows a UV-Vis spectrum of quartz, according to one or more embodiments.
Figure 12C:
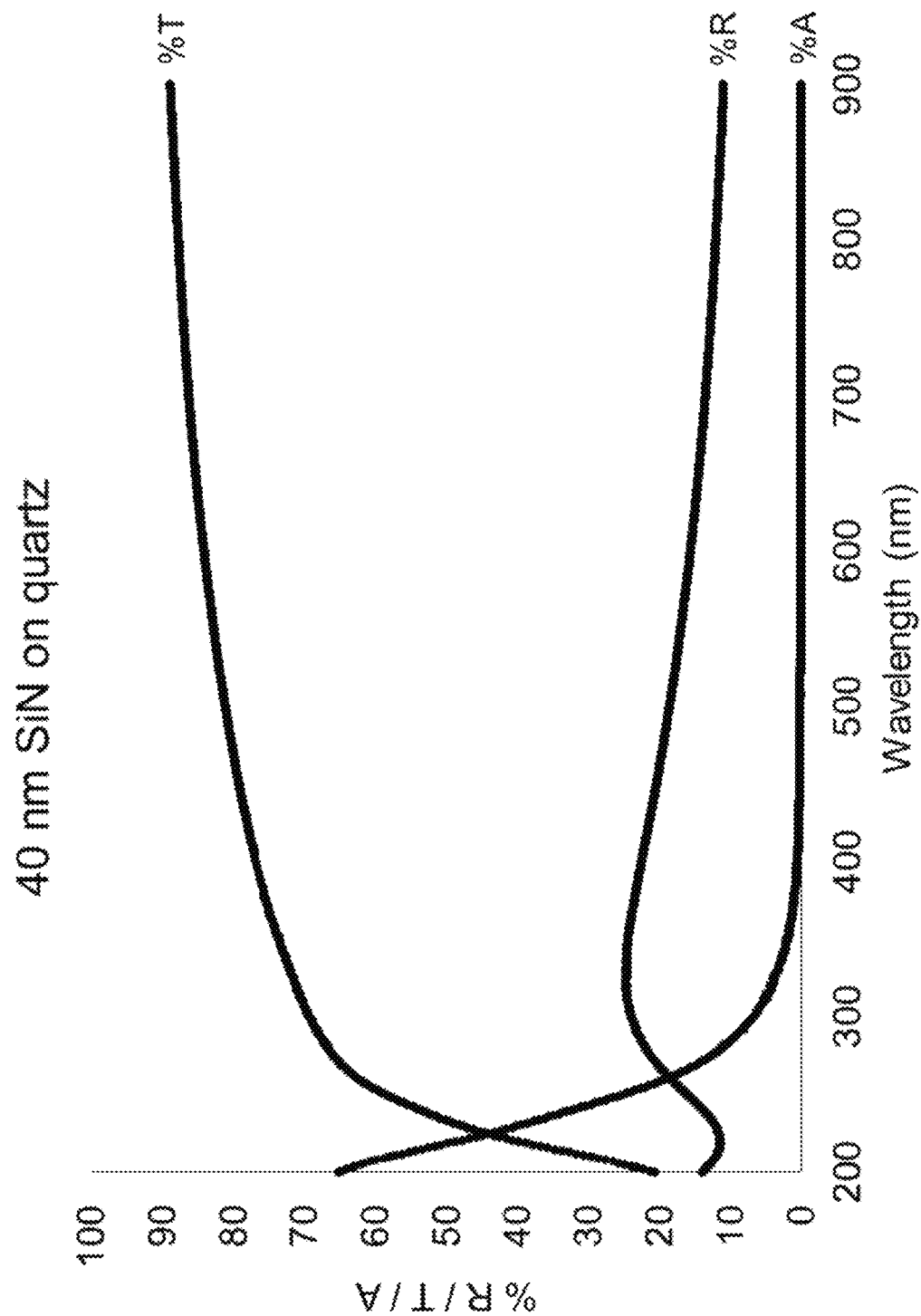
FIG. 12C shows a UV-Vis spectrum of 40 nm SiN on quartz, according to one or more embodiments.
Figure 12D:
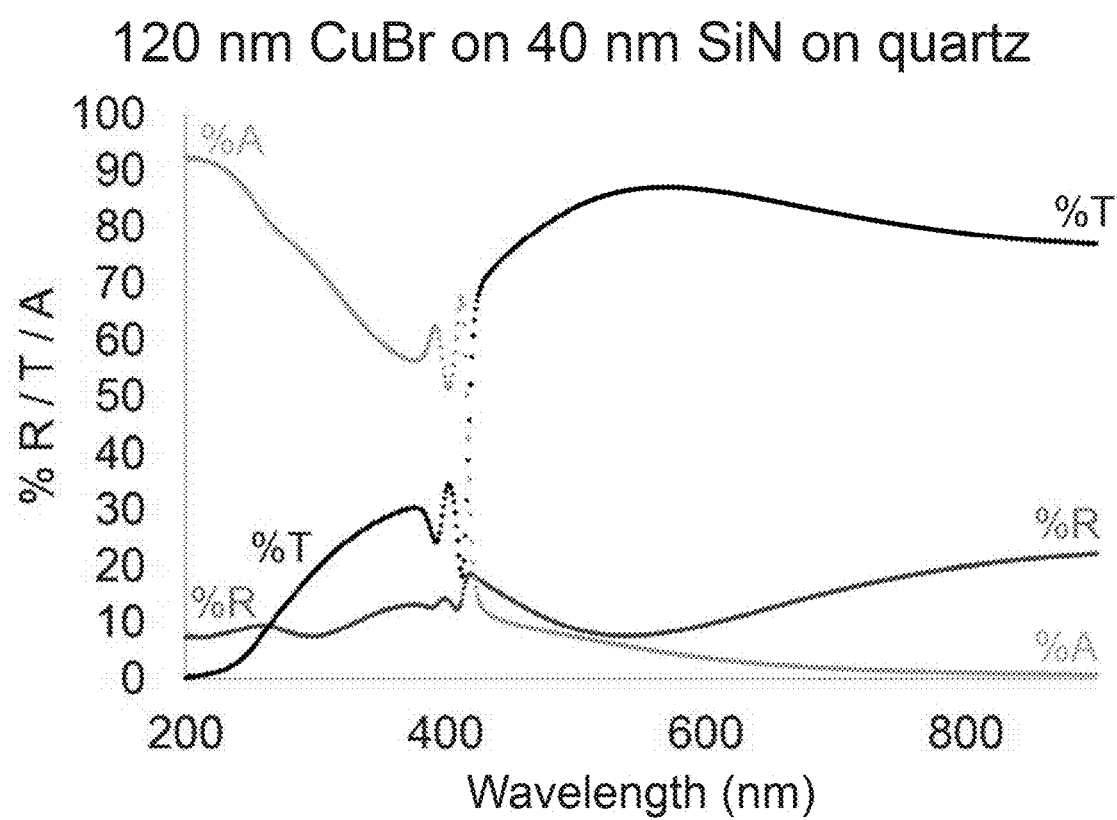
FIG. 12D shows a UV-Vis spectrum of 120 nm CuBr on 40 nm SiN on quartz, according to one or more embodiments.
Figure 13:
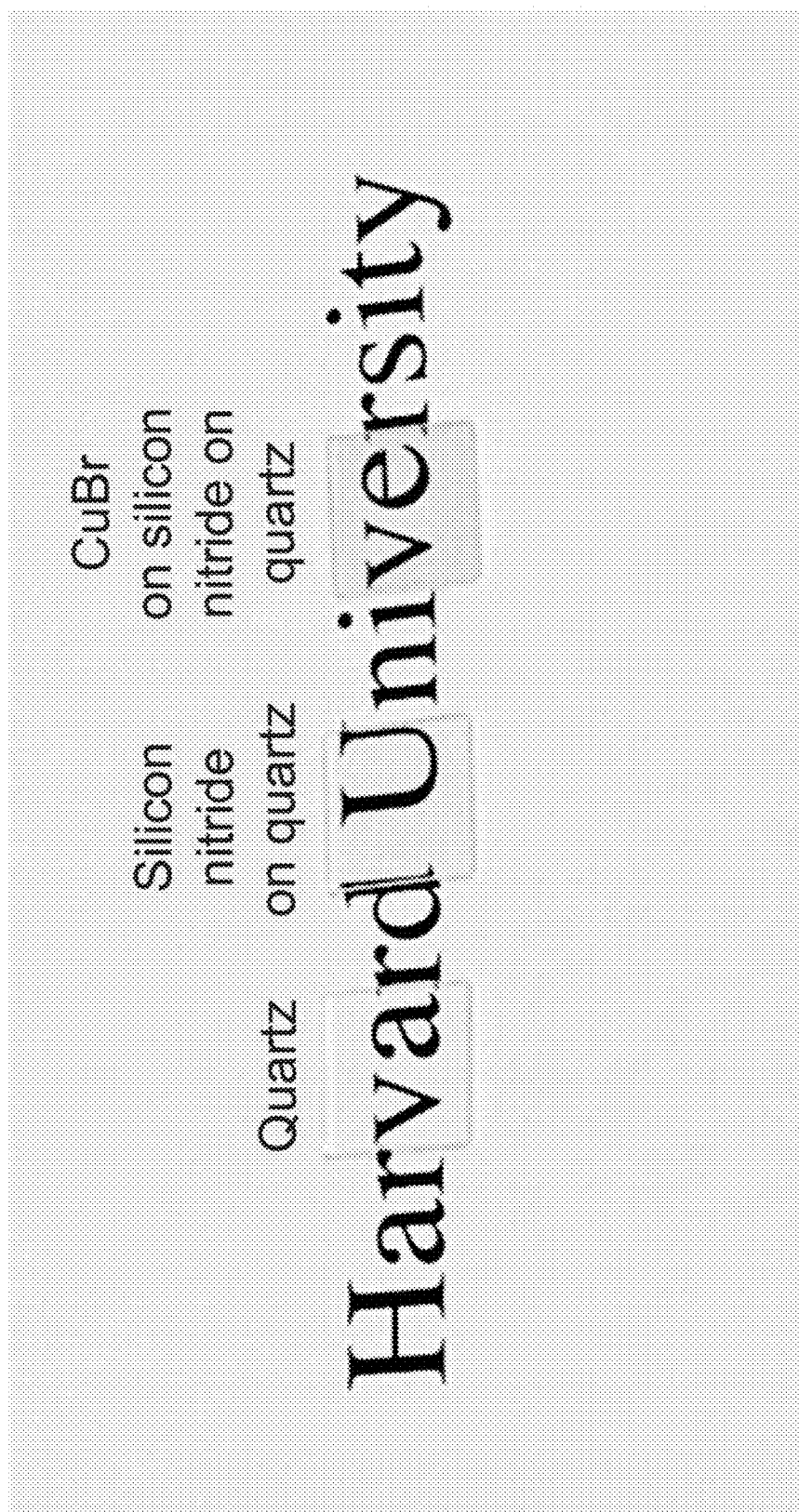
FIG. 13 shows a photograph of quartz, 40 nm SiN on quartz, and 200 nm CuBr on 40 nm SiN on quartz, according to one or more embodiments.

Optical Characterization 120 nm of CuBr was deposited over 1200 cycles using pCVD at a substrate temperature of 83.4° C. on a 40 nm SiN adhesion layer on a quartz substrate. As shown in the absorption coefficient plot (FIG. 12A), UV-Vis spectra (FIGS. 12B-12D), and photographs (FIG. 13), this sample was transparent in the range of visible light, about 400-800 nm. The average transmittance in this region was 79.7% (82.6% below the bandgap ~2.9 eV). In FIGS. 12B-12D, T represents transmittance, R represents reflectance, and A represents absorbance. The excitonic peaks are visible at 2.963 eV ($Z_1$), 2.972 eV ($Z_2$), and 3.119 ($Z_3$). In FIG. 12B, the transmission through quartz is about 93% in the visible region.

Electrical Characterization

Electrical characterization of the CuBr layers was carried out. A CuBr sample was characterized using a 4-point probe, and the measured resistivity was 0.00375 Ω·cm. Another, thinner CuBr layer sample was characterized using Hall effect measurements. The charge carrier type was found to be holes, and the hole mobility was measured at 3.0±0.2 $cm^2$ $V^{-1}$ $s^{-1}$. Electrical characterization according to one or more embodiments is shown in Table 1.

collected in a Straus flask, which was stoppered and removed from the glovebox. The pentane/Cu(hfac)(vtms) was submerged in a 0° C. ice bath and the pentane distilled off by vacuum distillation (e.g., evacuation of the mixture and collection of pentane in a liquid $N_2$ cold trap on a Schlenk line). The mixture was ~1% pentane via $^1$H NMR by quantifying all pentane protons and the vinyl protons of Cu(hfac)(vtms). This 99% Cu(hfac)(vtms) mixture was used directly as the precursor for CuBr vapor deposition. In some embodiments, purification can be performed on large batches, and the purified precursor stored under $N_2$ at −20° C. did not disproportionate appreciably over at least 8 months.

In some embodiments, the pCVD protocol is: 20 seconds to evacuate the chamber, 1 second pulse of Cu(hfac)(vtms) with carrier gas into the chamber, 1 second pulse of HBr from trap volume into the chamber, 5 second wait time for reaction to occur, and 10 seconds to purge the chamber with nitrogen while evacuating. In some embodiments, the relevant pressures are 0.7 torr purge nitrogen pressure and 10 torr nitrogen carrier gas pressure. In some embodiments, the relevant pressures are 1 torr HBr exposure and 1 torr Cu(hfac)(vtms)/carrier gas exposure. In some embodiments, these two reagents are in the reactor together for 5 seconds, resulting in an exposure value of 1 torr×5 seconds=5 torr-seconds each. In some embodiments, the full 5 seconds are not necessary to achieve the desired growth rate. In these embodiments, the 5 second wait time can be replaced by a 0.1 second wait time, and the growth rate is the same. This 0.1 second wait time is termed the "accelerated" pCVD deposition protocol.

TABLE 1

Electrical Characterization of CuBr Layers.

| Sample No. | Measurement Type | Thickness (nm) | Carrier Type | Sheet Resistance, $R_S$ (Ω/sq) | Resistivity, ρ (Ω/sq) | Hole Concentration, P ($10^{17}$ $cm^{-3}$) | Mobility, μ ($cm^2V^{-1}s^{-1}$) |
|---|---|---|---|---|---|---|---|
| 1 | 4-point probe | 150 | | 2.5 × $10^2$ | 0.00375 | | |
| 2 | Hall | 75 | Holes | 5 × $10^5$ | 3.7 ± 1.0 | 5.5 ± 1.5 | 3.0 ± 0.2 |

These measurements indicate that the CuBr layers described in one or more embodiments herein have p-type conductivity.

In some embodiments, using Cu(hfac)(vtms) and HBr as precursors, direct CVD of cuprous halide layers is possible. In some embodiments, by controlling the growth conditions and choice of substrate, pinhole-free layers of CuBr can be fabricated at temperatures from 83° C. to 110° C.

Chemical Vapor Deposition Growth of CuBr, According to Some Embodiments

Figure 14:
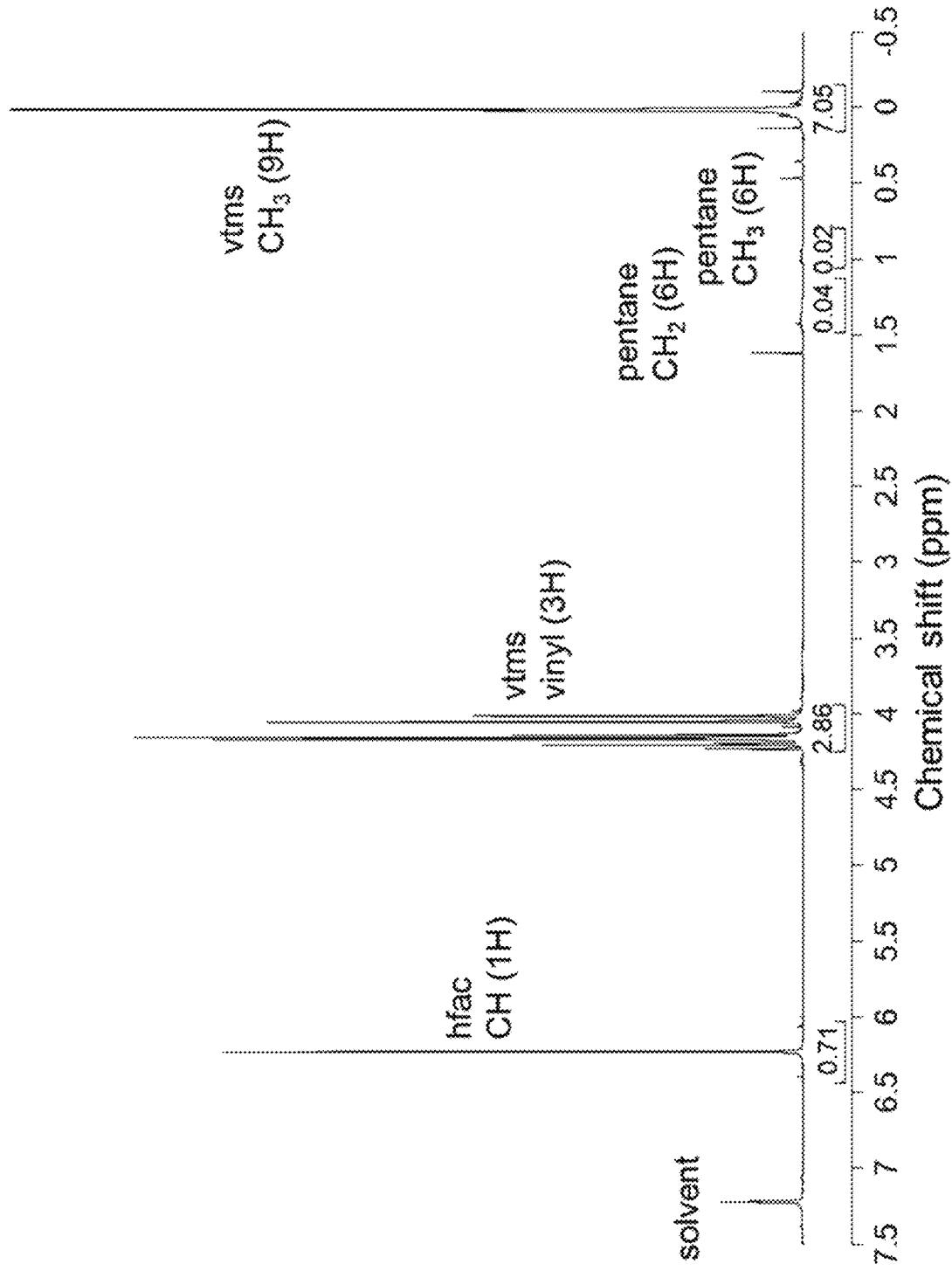
FIG. 14 shows a $^1$H NMR spectrum of Cu(hfac)(vtms) after purification procedure, according to one or more embodiments.

Layers of CuBr were deposited via pCVD using exposures to Cu(hfac)(vtms) (from Gelest) and HBr (from Matheson). HBr was used as received either at research purity grade (99.999%) or at chemical purity grade (99.8%), in a 1-pound lecture bottle pressurized to 320 psig. Owing to the materials used in the construction of the valves, these lecture bottles were not stored for more than approximately 6 months, to avoid corrosion of the valves due to HBr exposure. The Cu(hfac)(vtms) compound was received as a green liquid mixture of Cu(hfac)$_2$ and Cu(hfac)(vtms). To separate the two compounds, the as-received Cu(hfac)(vtms)/Cu(hfac)$_2$ mixture was run through a SiO$_2$ column with pentane as the eluent, in a $N_2$-filled glovebox. A dark green top band and a bottom bright yellow bottom band were observed. The yellow pentane/Cu(hfac)(vtms) solution was After separating Cu(hfac)(vtms) from the commercial mixture with Cu metal and Cu(hfac)$_2$ via SiO$_2$ column with pentane as the eluent, pentane was removed by vacuum distillation at 0° C., as described above. To quantify the proportion of pentane remaining in the solution, an aliquot of the solution was dissolved into deuterobenzene in an NMR tube. A positive pressure of $N_2$ gas was maintained in the headspace of the tube throughout the transfer to avoid oxidation of the Cu(I) complex, and a $^1$H NMR spectrum was immediately collected, as shown in FIG. 14. Peak assignments and integrals for pentane, Cu(hfac)(vtms) protons, and deuterobenzene solvent residuals are given in Table 2. To estimate the amount of pentane in the solution, the relative proportions of the molecules implied by the proton integrations were determined. Using the $CH_2$ protons, a relative molar amount of pentane (versus the 0.5% residual $C_6H_6$ in the $C_6D_6$) was calculated to be 0.0067, which was larger than the calculation from the $CH_3$ protons, at 0.0033. The relative molar amount of Cu(hfac)(vtms) was similarly calculated using the three types of protons present on this molecule, as shown in Table 2. The most conservative estimate of the amount of pentane in the solution was then calculated, by using the largest amount of pentane calculated (0.0067) and the smallest amount of Cu(hfac)(vtms) calculated (0.71). The maximum amount of pentane in solution was estimated to be 0.0067/(0.0067+0.71)=0.9 mol % pentane. This solution was stored in a freezer in a nitrogen glovebox, and ~5 mL aliquots were taken out and loaded into the reactor as needed for thin film deposition experiments.

TABLE 2

$^1$H NMR data corresponding to FIG. 14.

| Compound | Identity | Multi-plicity | Chemical Shift | Inte-gral | No. of Molecules (AU) |
|---|---|---|---|---|---|
| $C_6D_6$ solvent | CH | s | 7.16 (ref d) | n/a | n/a |
| n-pentane | $CH_3$ (6H) | t, 7 | 0.87 | 0.02 | 0.0033 pentanes |
| | $CH_2$ (6H) | m | 1.32 | 0.04 | 0.0067 pentanes |
| vtms | $SiCH_3$ (9H) | s | −0.05 | 7.05 | 0.78 Cu(hfac)(vtms) |
| | vinyl (3H) | m | 3.9-4.2 | 2.86 | 0.95 Cu(hfac)(vtms) |
| hfac | CH | s | 6.17 | 0.71 | 0.71 Cu(hfac)(vtms) |

Chemical Vapor Deposition Growth of CuBr, According to Some Embodiments

Thin films of CuBr were deposited via pCVD using exposures to Cu(hfac)(vtms) (Gelest, purified as described above) and HBr (Matheson). Cu(hfac)(vtms) was loaded into a vacuum bubbler under a $N_2$ atmosphere to prevent decomposition in air. HBr was used as received, either at research purity grade (99.999%) or at chemical purity grade (99.8%), in a 1-pound lecture bottle pressurized to 320 psig. Owing to the materials used in the construction of the valves, these lecture bottles were not stored for more than approximately 6 months, to avoid corrosion of the valves due to HBr exposure.

The Cu(hfac)(vtms) vapor was transferred to the reactor chamber by a purified (Entegris purifier model number CE500KFI4R) $N_2$ carrier gas held at a pressure of 10 torr in its trapped volume. Gaseous HBr was delivered using a trapped volume, without a carrier gas. Swagelok ALD valves operated by LABVIEW executed the pCVD protocol. In some embodiments, pCVD is similar to ALD, but omits the purging step between precursor doses. Protocols were programmed with either of two types of precursor delivery: "open-valve mode" and "closed-valve mode." In open-valve mode, the reactor chamber was constantly purged with a carrier gas that was being evacuated, such that the valve to the vacuum was never closed. In closed-valve mode, the reactor chamber was closed off from the vacuum at some point in the CVD cycle, typically in order to "trap" the precursors in the reactor chamber for a longer incubation time than would otherwise be possible if the valve to the vacuum were open. While closed-valve mode may, in some embodiments, provide higher precursor utilization and/or greater film coverage and uniformity throughout the reactor, it can be slower, because it requires separate steps for reaction and for purging/evacuation.

For closed-valve mode, the timing sequence used for the CuBr recipe can be expressed as $t_1$-$t_2$-$t_3$-$t_4$-$t_5$, where $t_1$ is the dosing time of the Cu(hfac)(vtms), $t_2$ is the dosing time of the HBr, $t_3$ is a waiting period during which all valves are closed and deposition occurs, $t_4$ is the time during which $N_2$ purge gas is flushed through the reactor, and $t_5$ is the chamber evacuation time, with all times given in seconds. In some cases, the timing sequence was 1-1-5-10-20. The purge $N_2$ pressure, measured while supplying $N_2$ under dynamic vacuum, was 0.7 torr. Measured in the same way, the pressure of the $N_2$ carrier gas was 10 torr, and the pressure of Cu(hfac)(vtms) alone was 0.04 torr.

The two precursors were in the reactor together for 5 seconds, resulting in exposure times of 6 seconds for HBr and 7 seconds for Cu(hfac)(vtms). To assess the exposure pressures of each precursor, several cycles of the pCVD protocol were performed. However, instead of opening and closing the valves for both precursors, the valves for only one precursor were opened during each cycle, with all other timing kept the same. The exposure pressure of each gas was adjusted until it was stable at 1 torr across several cycles. Therefore, the exposures had values of 1 torr×6 seconds=6 torr-seconds of HBr and 1 torr×7 seconds=7 torr-seconds of Cu(hfac)(vtms)/$N_2$. The partial pressure of Cu(hfac)(vtms) in this mixture with nitrogen was estimated to be between 0.004 and 0.04 torr; throughout this range, the HBr was present in excess. The exposure pressures were checked before each deposition but were not adjusted, except when new precursor supplies were installed or substantial protocol changes were implemented; typical values fell in the range of 0.1 to 10 torr, e.g., at about 2 torr.

In some cases, the full 5 seconds of "wait time" was not necessary to achieve the reported growth per cycle. In some embodiments, the 5-second wait time $t_3$ can be reduced to 0.1 second, without reducing the film growth per cycle. Thus, an "accelerated closed-valve pCVD recipe timing sequence was 1-1-0.1-10-20. The exposures of the two precursors therefore decreased from 6 torr-seconds to 1.1 torr-seconds for HBr, and from 7 torr-seconds to 2.1 torr-seconds for Cu(hfac)(vtms)/$N_2$.

In open-valve mode, a $N_2$ stream was constantly purging the reactor chamber and precursor manifold central lines, so both the house $N_2$ valve and the valve to the pump downstream of the reactor chamber were always open. In some embodiments, the timing sequence used for an open-valve CuBr recipe may be expressed as $t_a$-$t_b$-$t_c$, where $t_a$ is the dosing time of the Cu(hfac)(vtms)/carrier gas mixture, $t_b$ is the dosing time of the HBr, and $t_c$ is the wait time during which solely the $N_2$ and pump valves are open, with all times given in seconds. In some embodiments, this wait time was required in order to return the reactor pressure down to its steady-state $N_2$ flow, after HBr and Cu(hfac)(vtms)/carrier gas were dosed in, so that the reactor returned to the same pressure every time the cycle started. In some embodiments, the open-valve timing sequence was 0.5-0.5-8. The relevant pressures remained the same as for the closed-valve mode. The exposures of HBr and Cu(hfac)(vtms)/$N_2$ are, in some cases, harder to estimate in this recipe, but the exposure pressures remained set to 1 torr for each gas.

Control experiments to deposit Cu metal were conducted in closed-valve mode. The timing sequence used for the Cu protocol was the same as the closed-valve protocol, namely a timing sequence of 1-1-5-10-20, except that instead of a dose of HBr during the $t_2$ time, no valves were open during that time and, thus, HBr was not injected into the reactor.

Substrates

Films were deposited on several substrate types. 12.7 mm diameter highly polished (graphitic) carbon planchets and high purity vitreous carbon planchets were purchased from Ted Pella. 1 cm×1 cm quartz substrates were purchased from Electron Microscopy Sciences. 1 inch×1 inch Si substrates with a 300 nm surface layer of $SiO_2$ grown by wet oxidation were cleaved from larger wafers (University Wafer). In some embodiments, substrates described as silica or $SiO_2$ are of this type. Additional substrate types were prepared by adding surface layers to quartz and SiO$_2$/Si substrates. Platinum surface layers were prepared using a Denton e-beam evaporator: 5 nm of Ti adhesion layer were followed by 200 nm of Pt. Alumina surface layers were 38 nm thick, prepared using a Savannah 200 Thermal ALD reactor. SiN surface layers were prepared using an STS PECVD: 40 nm of SiN was deposited from 35 sccm SiH$_4$, 55 sccm NH$_3$, and 1960 sccm N$_2$ on high-frequency mode (13.56 MHz), with the power supply at 20 W.

The vitreous, or "glassy", and polished carbon planchets were used as received, without washing prior to CuBr deposition. Other substrate types were treated with solvent washes of semiconductor-grade acetone and isopropanol (BDH, ≥99%). Furthermore, both the Pt and the SiO$_2$/Si substrates were then treated with UV-ozone for 5 minutes, both to promote the formation of surface hydroxyl groups and, via oxidation, further remove any carbonaceous contamination from the surface. Substrates were stored either in ambient conditions but covered (carbon, SiO$_2$, platinum, and quartz) or in a box purged with N$_2$ (SiN).

When prepared for contact angle measurements, substrates were cleaned by ultrasonication in a solvent bath, rather than a solvent wash. SiO$_2$ and Pt were sonicated for 5 minutes in each of acetone and isopropanol, followed by 10 minutes of UV-ozone treatment. SiN was sonicated similarly but not treated with UV-ozone.

Layer Characterization

SEM was performed using a Zeiss Ultra Plus scanning electron microscope. XPS was performed on a Thermo Scientific K-Alpha spectrometer equipped with a monochromatized Al Kα X-ray source, 12 kV electron beam, and Ar$^+$ sputtering gun. Depth profiles were collected by sputtering at 500 eV for 80 seconds per level, unless otherwise stated. The XPS sputtering rate was determined by dividing the copper halide layer thickness as determined by SEM by the total sputtering time before the substrate elemental signals were detected. XRD patterns were recorded in a Bruker D$_2$ PHASER X-ray diffractometer using Cu Kα radiation (λ=1.542 Å) and a θ-2θ scan.

Optical transmittance and reflectance measurements were performed over a wavelength range of 200-800 nm using the small spot kit in the diffuse reflectance accessory of an Agilent Cary 7000 Universal Measurement Spectrophotometer. Reflectance measurements were made at 6° and transmission measurements at 180°. To determine the absorption coefficient of CuBr layers, transmittance and reflectance were measured for both a 40 nm SiN film on quartz (the "substrate" measurement), and a 120 nm CuBr film on 40 nm SiN on quartz (the "total" measurement). To extract out the CuBr film absorption coefficient, two data treatment steps were used. First, $\alpha_{sub}$ and $\alpha_{total}$ were calculated via the equation $\alpha=1/d_{sub} \times \ln((1-R)/T)$, where $d_{sub}$=thickness of quartz substrate (1 mm). Second, $\alpha_{CuBr}$ was estimated via the equation $\alpha_{film}=d_{sub}/d_{film} \times (\alpha_{total}-\alpha_{sub})$.

Electrical properties were assessed by Hall effect measurements using a high sensitivity rotating parallel dipole line system developed by IBM. To form electrical contacts for Hall measurements, 200 nm of Au and a 10 nm adhesion layer of Ti were deposited through a shadow mask by electron-beam evaporation in a Denton Explorer. The leads of the Hall system were adhered to the Au contacts using indium solder. A 2.0 MeV beam of $^4$He$^{++}$ ions was used for RBS, with an energy resolution of 20 keV. Four-point probe measurements were carried out on a ~150 nm thick CuBr sample deposited on a SiN adhesion layer atop a 1 inch×3 inch quartz slide. A 4-point probe measured 5 different points along the length of the slide, producing 5 independent measurements of the sheet resistance.

Contact angle measurements were performed via a sessile drop technique using a half angle method on a Tantec CAM-PLUS MICRO equipped with micrometer syringe and fiber-optic light source. Four contact angle test liquids (diiodomethane, thiodiglycol, ethylene glycol, and deionized water) were selected for their distinct and well-defined dispersive and polar components of surface free energy.

Figure 15:
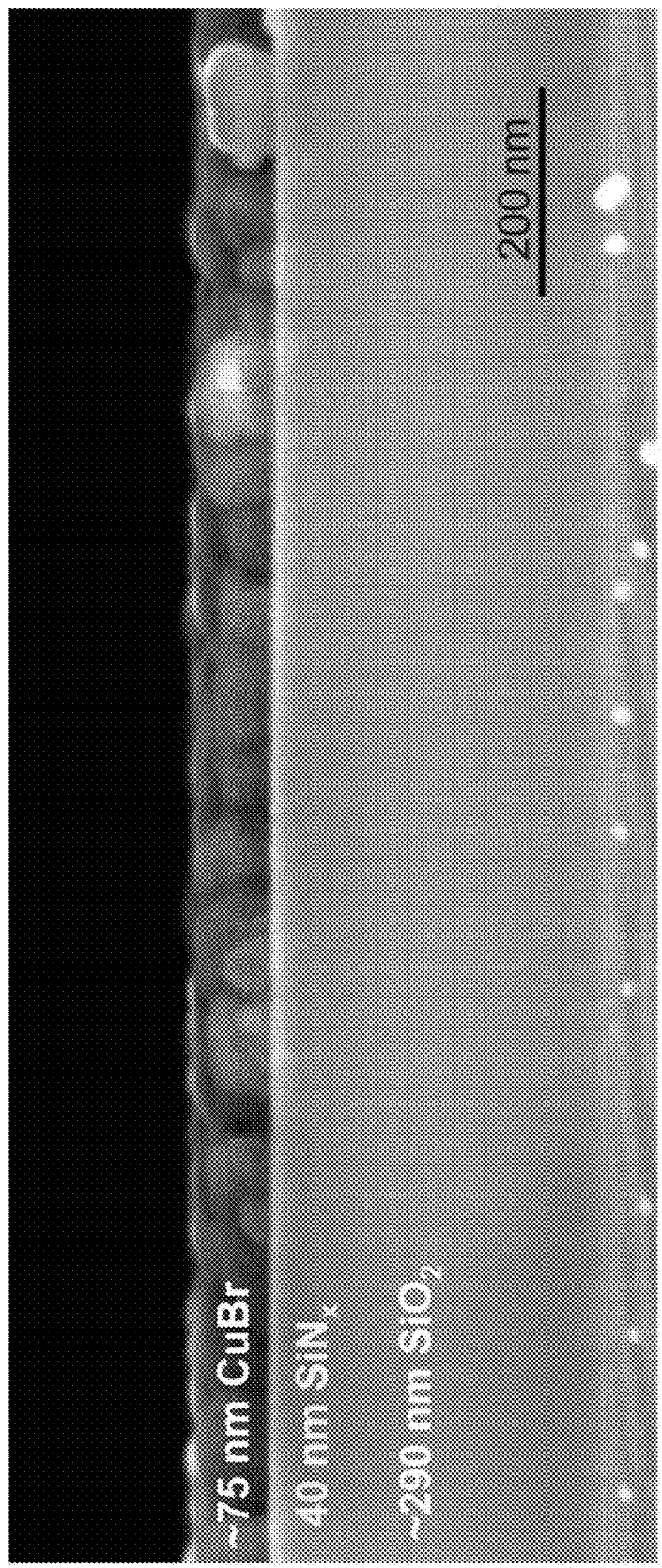
FIG. 15 shows a cross-sectional SEM image of a sample used for Hall effect measurements, according to one or more embodiments.

FIG. 15 shows a cross-sectional SEM image of the 75 nm CuBr sample used for the Hall effect measurements, from which electrical data (e.g., hole concentration, hole mobility, and primary carrier type (being holes rather than electrons)) were derived.

Growth Rate and Precursor Utilization Experiments

Figure 16:
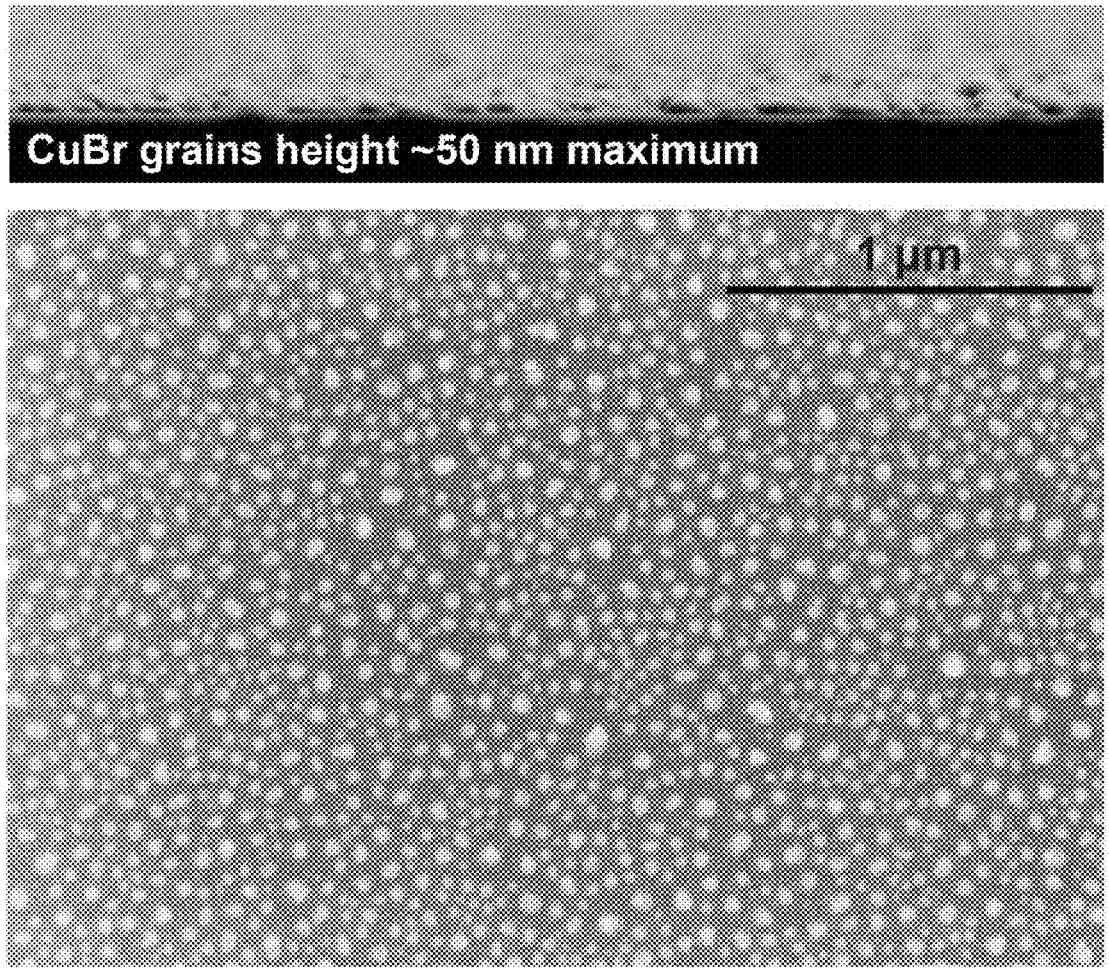
FIG. 16 shows a SEM image of CuBr deposited on SiN at a distance of 1 foot from the reactor inlet, according to one or more embodiments.
Figure 17A:
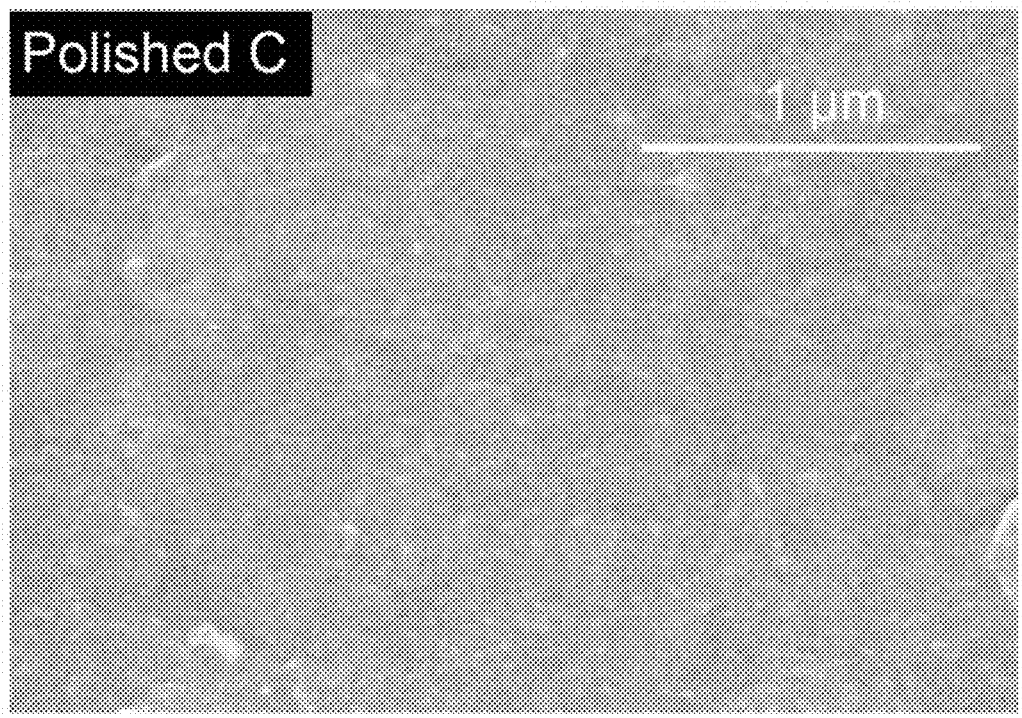
FIG. 17A shows SEM images of Cu(hfac)(vtms) dosed for 600 cycles onto a polished carbon insulating substrate at 83.4° C., according to one or more embodiments.
Figure 17B:
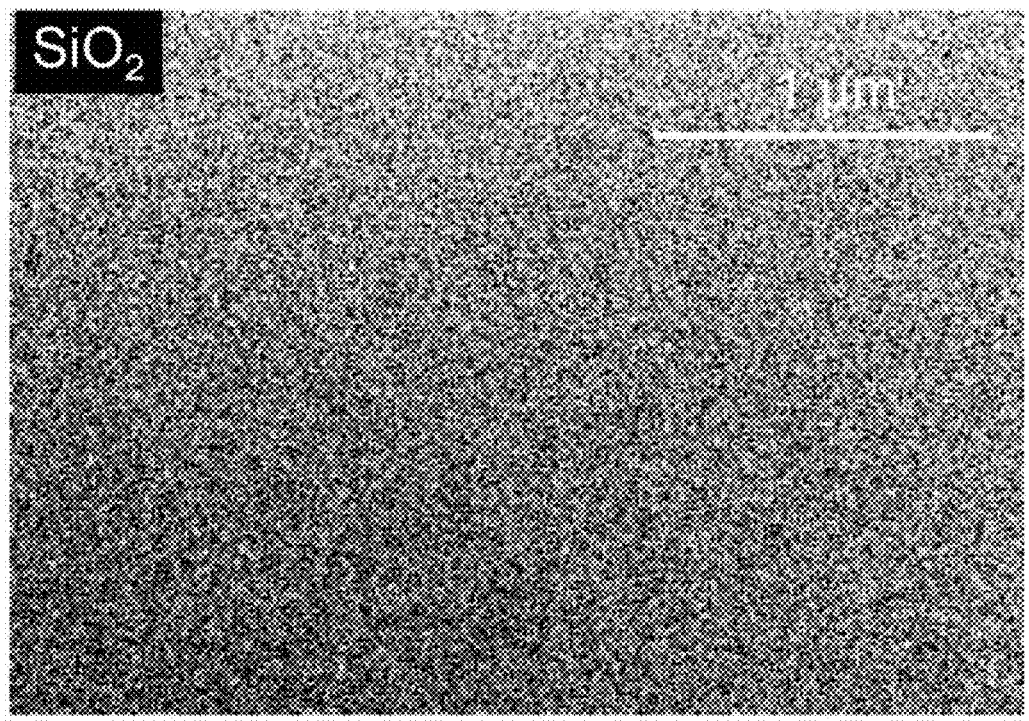
FIG. 17B shows SEM images of Cu(hfac)(vtms) dosed for 600 cycles onto a $SiO_2$ insulating substrate at 83.4° C., according to one or more embodiments.
Figure 17C:
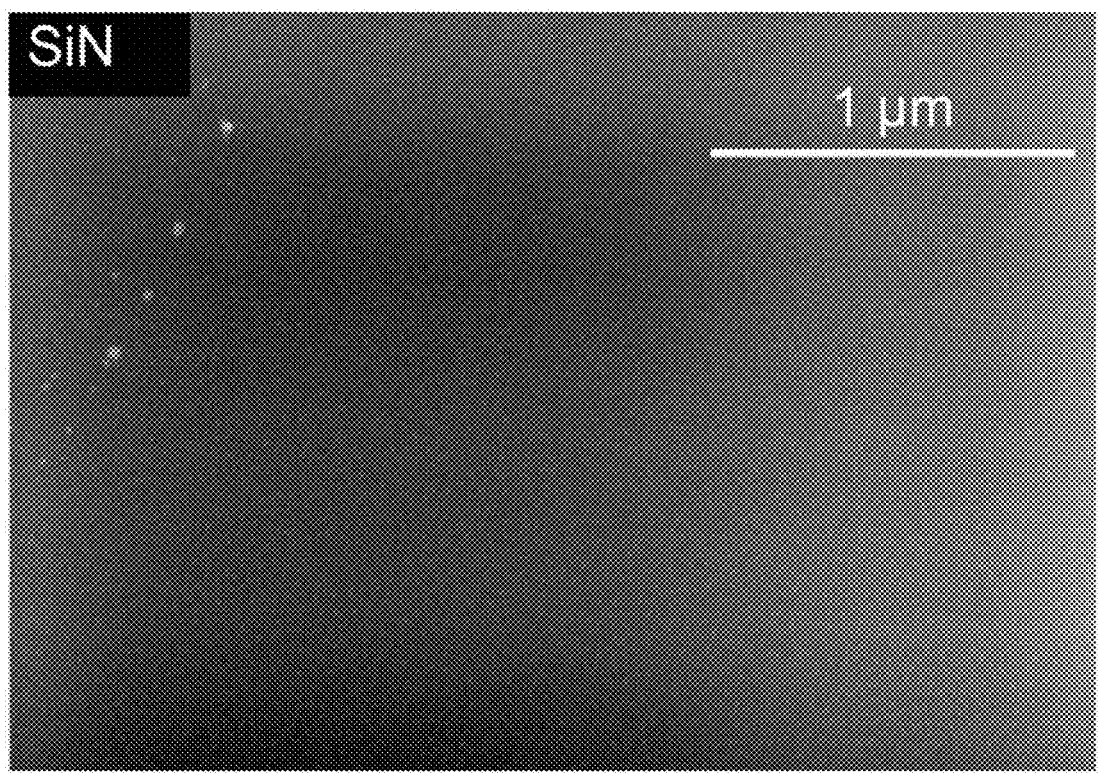
FIG. 17C shows SEM images of Cu(hfac)(vtms) dosed for 600 cycles onto a SiN insulating substrate at 83.4° C., according to one or more embodiments.
Figure 17D:
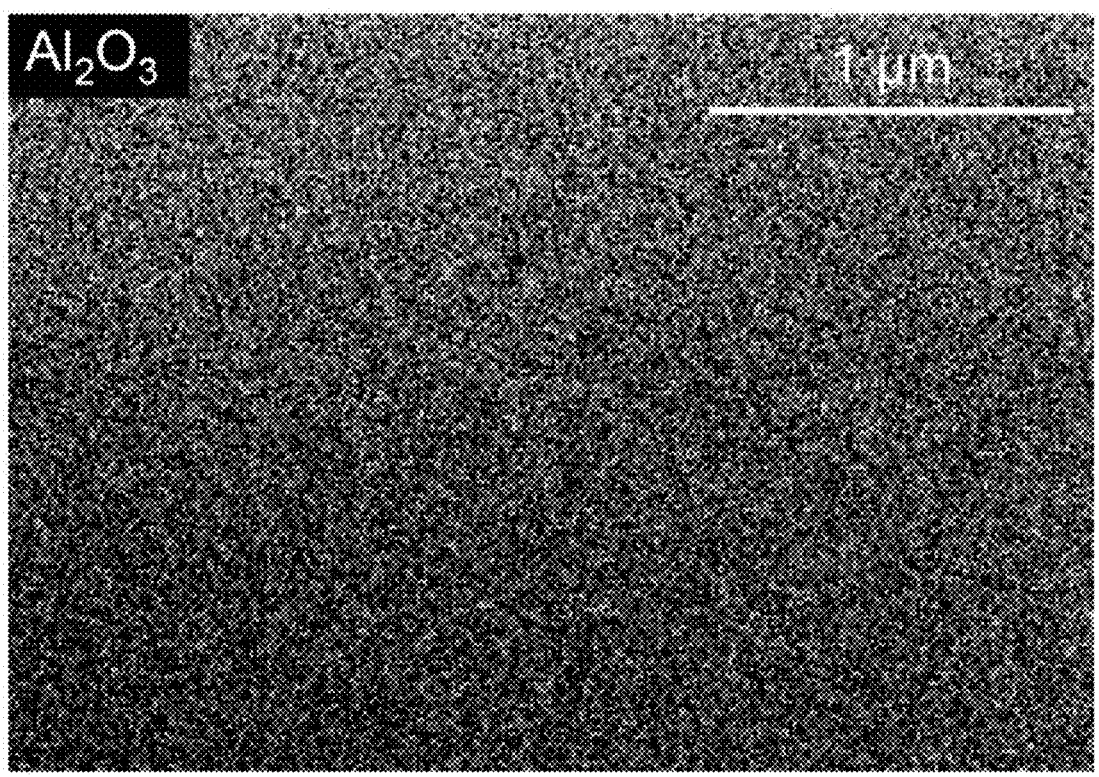
FIG. 17D shows SEM images of Cu(hfac)(vtms) dosed for 600 cycles onto an $Al_2O_3$ insulating substrate at 83.4° C., according to one or more embodiments.
Figure 18A:
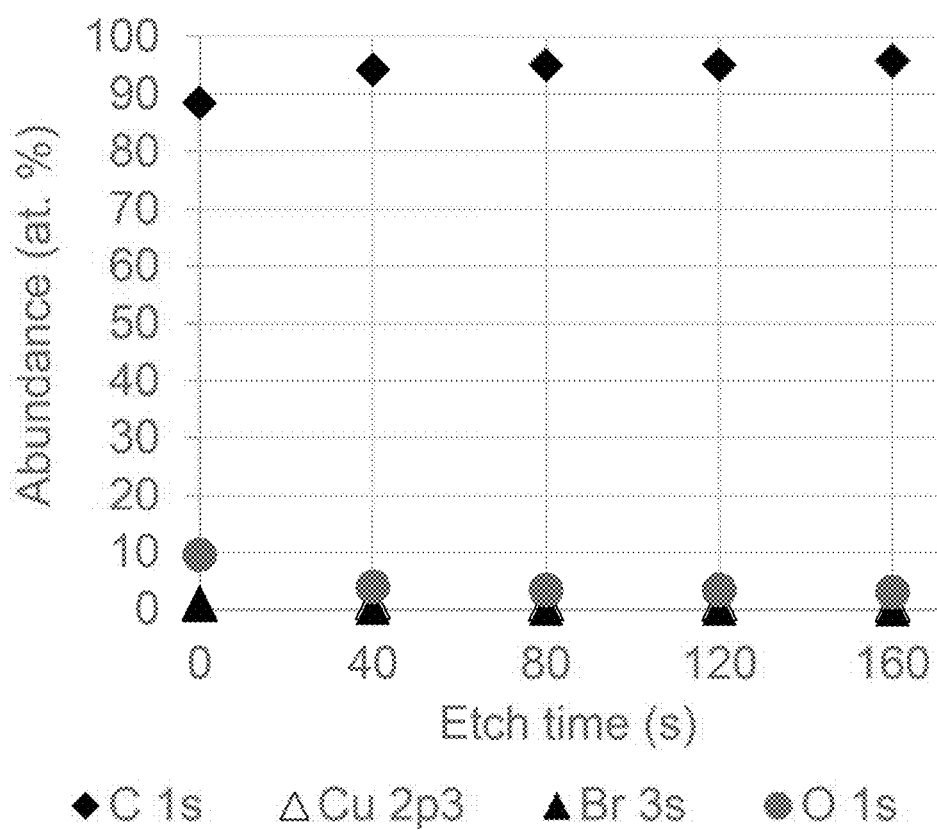
FIG. 18A shows XPS data for Cu(hfac)(vtms) dosed for 600 cycles onto a polished carbon insulating substrate at 83.4° C., according to one or more embodiments.
Figure 18B:
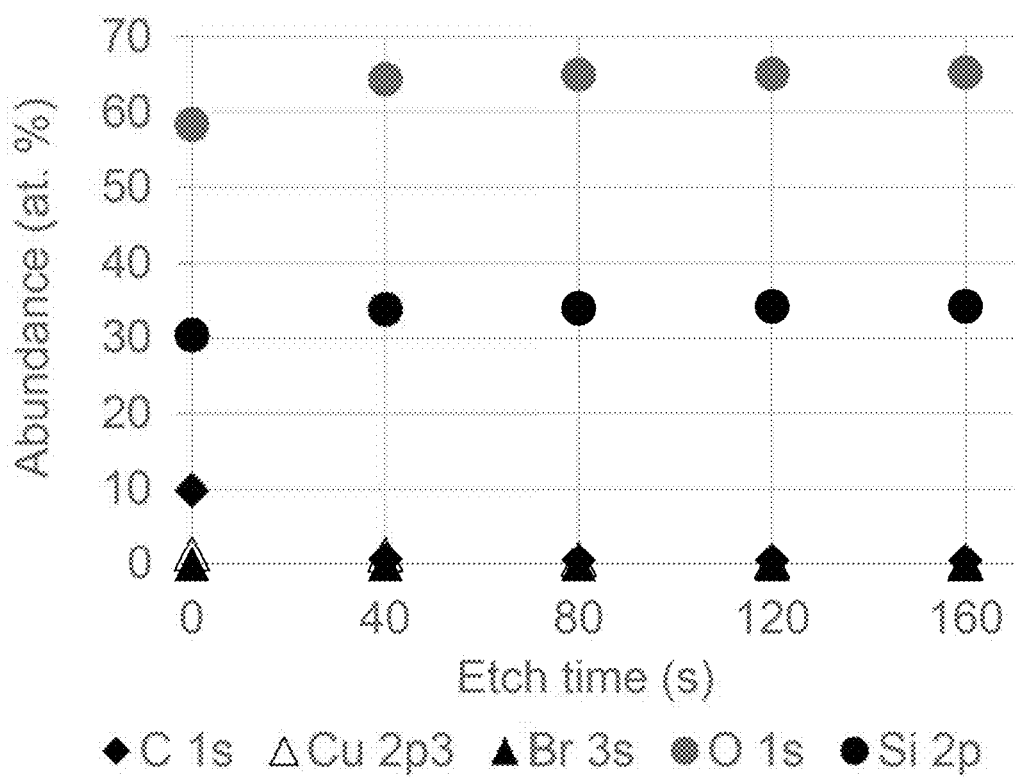
FIG. 18B shows XPS for Cu(hfac)(vtms) dosed for 600 cycles onto a $SiO_2$ insulating substrate at 83.4° C., according to one or more embodiments.
Figure 18C:
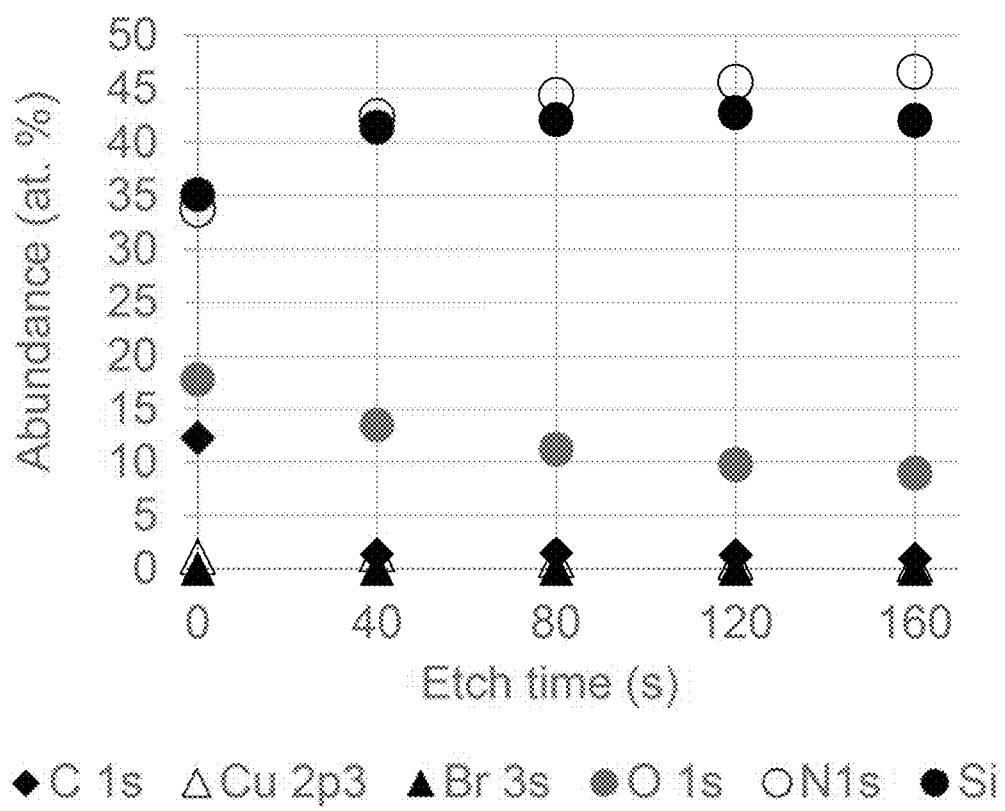
FIG. 18C shows XPS data for Cu(hfac)(vtms) dosed for 600 cycles onto a SiN insulating substrate at 83.4° C., according to one or more embodiments.
Figure 18D:
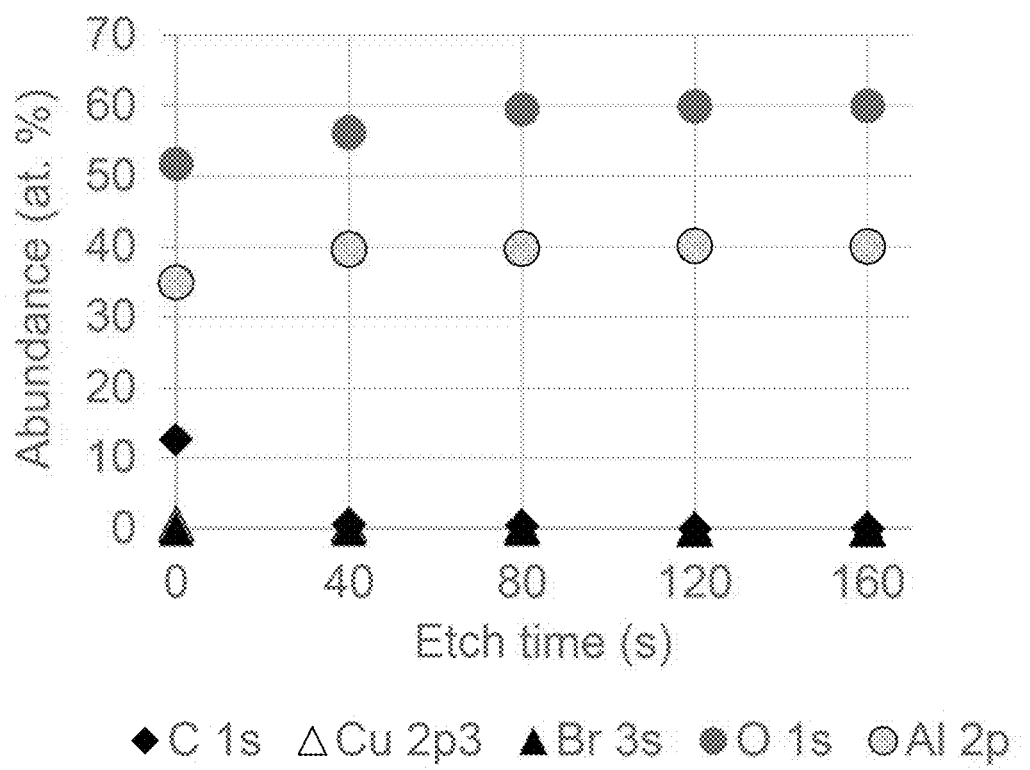
FIG. 18D shows XPS results for Cu(hfac)(vtms) dosed for 600 cycles onto an $Al_2O_3$ insulating substrate at 83.4° C., according to one or more embodiments.
Figure 19A:
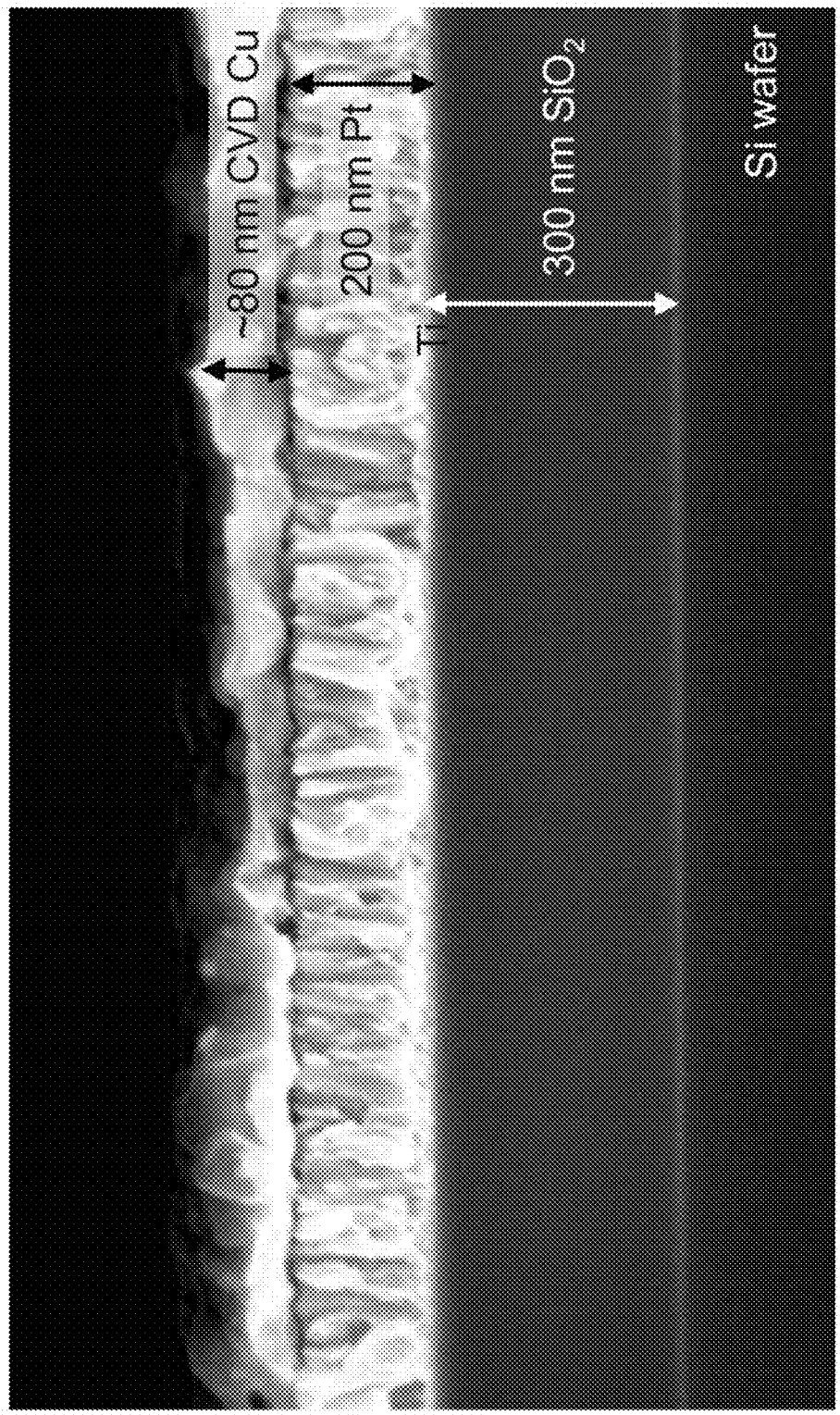
FIG. 19A shows a SEM image of Cu(hfac)(vtms) dosed for 600 cycles onto a platinum substrate at a temperature of 83.4° C., according to one or more embodiments.
Figure 19B:
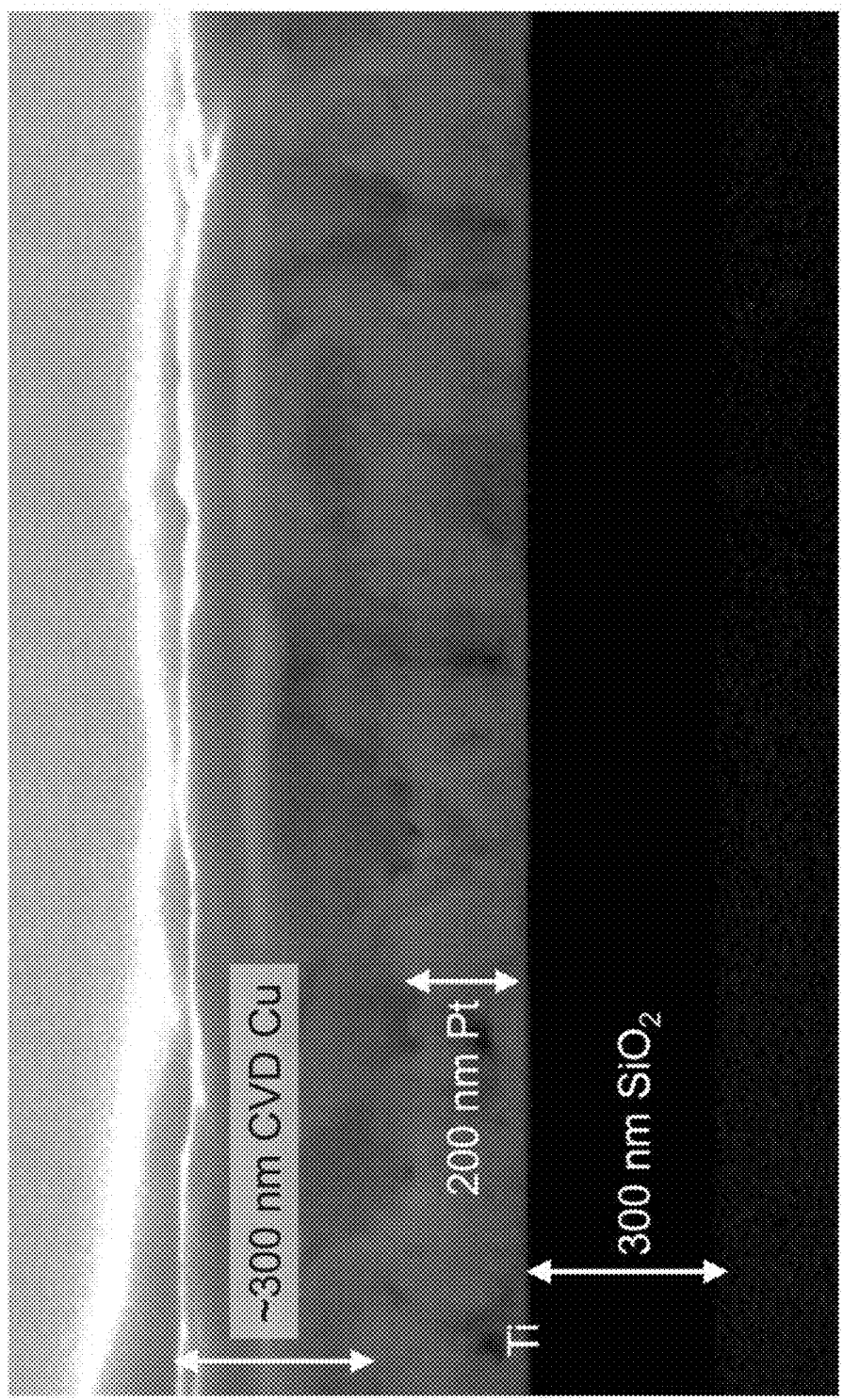
FIG. 19B shows a SEM image of Cu(hfac)(vtms) dosed for 600 cycles onto a platinum substrate at a temperature of 83.4° C., according to one or more embodiments.
Figure 19C:
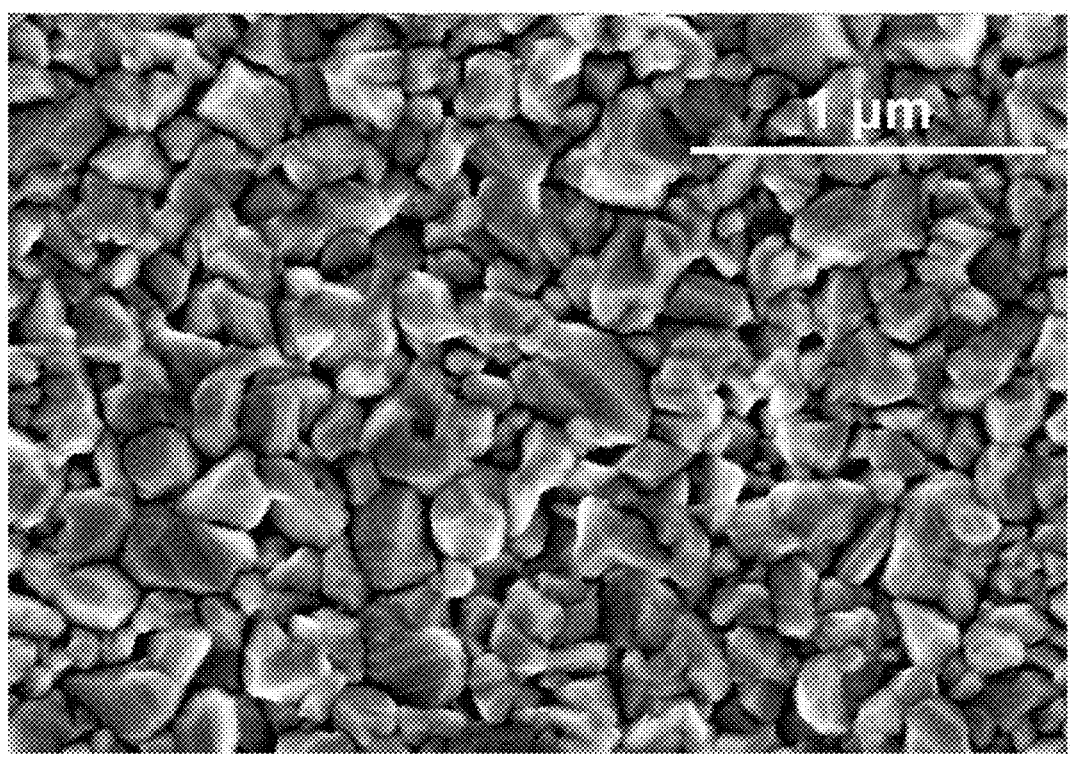
FIG. 19C shows a SEM image of Cu(hfac)(vtms) dosed for 600 cycles onto a platinum substrate at a temperature of 83.4° C., according to one or more embodiments.
Figure 19D:
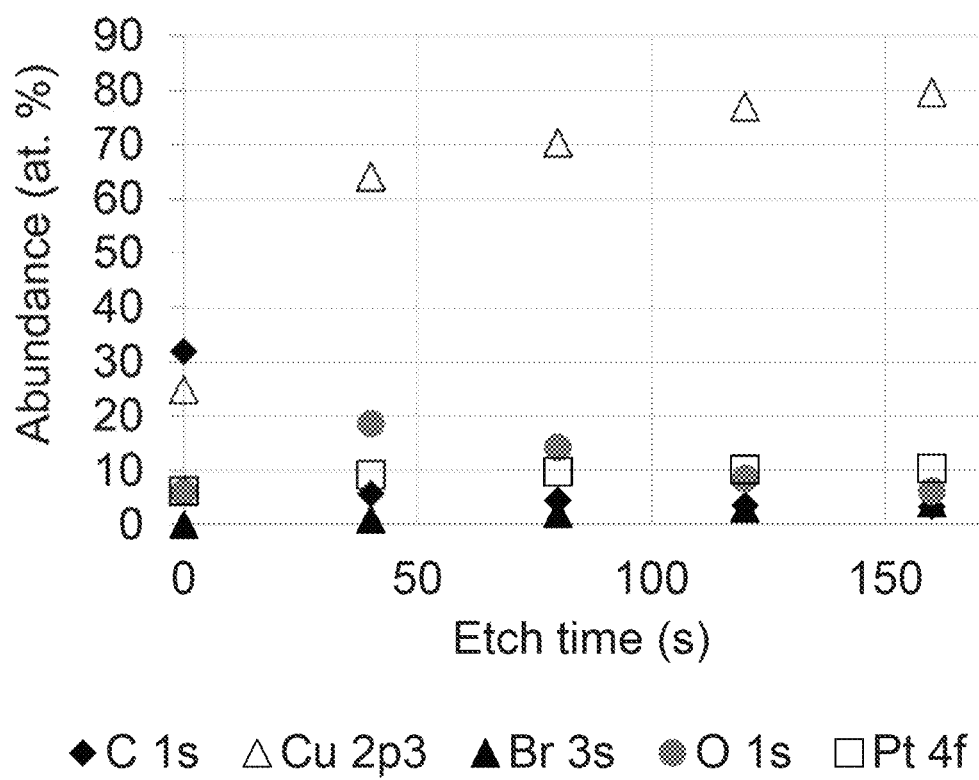
FIG. 19D shows XPS data for Cu(hfac)(vtms) dosed for 600 cycles onto a platinum substrate at a temperature of 83.4° C., according to one or more embodiments.

The CuBr film growth per cycle on SiN substrates at a substrate temperature of 83.4±0.5° C. was assessed using two closed-valve pCVD procedures. One procedure had a 5 second reaction wait time when all valves are closed, whereas the other procedure had 0.1 second wait time (the accelerated procedure). These two procedures had the same timings for all other pulses. When using either procedure, if the Cu(hfac)(vtms) liquid volume in the bubbler was greater than about 6 mL, a growth per cycle of 0.12 nm CuBr/cycle was obtained for substrates placed at the reactor inlet. Under these conditions for both procedures, more CuBr was deposited at the inlet than at the outlet, as shown in FIG. 16. However, if the Cu(hfac)(vtms) liquid volume in the bubbler was less than about 6 mL, the liquid-gas surface area was lower, because of the tapered shape of the bubbler bottom. Under this reduced surface area condition, growths per cycle of less than 0.12 nm/cycle were observed.

Experiments were conducted to qualitatively assess precursor utilization throughout the reactor tube. In some embodiments, substrates can be placed along a substrate holder between 0.5 in and 12 in away from the inlet where gases are introduced into the reactor. In order to assess the extent to which the precursor material is being utilized along the length of the reactor, a SiN substrate was placed 12 in away from the inlet. This experiment used 600 cycles of the CVD procedure having a 5 second reaction wait time, with the substrate at 65.8° C. For the substrate placed at the inlet, film closure was achieved under these same reaction conditions. However, for the substrate placed 12 in away from the inlet, the CuBr grains formed as islands rather than as a continuous film. This result may be attributed to precursor consumption by the walls of the reactor tube.

From these observations, it appears that, in some embodiments, the CVD reaction between Cu(hfac)(vtms) and HBr in the reactor takes place in a precursor-limited growth regime. In some embodiments, the CuBr film thickness decreases along the reactor length from inlet to outlet because either one or both precursors are being depleted. These observations are consistent with precursor-limited growth behavior. Furthermore, the observation of the same film thickness for both 5 second and 0.1 second reaction wait times supports that the film deposition was not limited by the chemical reaction time under the tested conditions. One cycle of the 0.1 second wait time procedure took 34.55 seconds, corresponding to a growth rate of 0.2 nm/min.

Seeking to increase the CuBr growth rate, another CuBr deposition recipe was evaluated, this time employing open-valve mode. In some embodiments, open-valve mode recipes can be faster than closed-valve mode recipes because purging happens simultaneously with precursor dosing. In some embodiments, the reactor is constantly purged with N$_2$, and alternating doses of Cu(hfac)(vtms) and HBr are released into the reactor while purging is still occurring. The results suggested that CuBr could be grown using open-valve mode with a growth per cycle of at least 0.18 nm/cycle. One cycle of this open-valve procedure took only 10.55 seconds, corresponding to a growth rate of 1 nm/min. Further increase in growth rate may be achieved via other modifications to the deposition protocols described herein, including, for example, increasing the precursor gas pressures, e.g., via increasing the Cu(hfac)(vtms) bubbler temperature and HBr regulator outlet pressure.

Copper Deposition Control Experiments

Though similar CuBr layers were deposited on a range of substrates, the mechanism of CuBr layer growth might not be the same on all substrates. In some embodiments, while layers were attempted to be deposited by protonolysis of the hfac ligand, the Cu(hfac)(vtms) precursor is known to disproportionate to form Cu and volatile Cu(hfac)$_2$, a process promoted by increasing temperature and metal surfaces. In some embodiments, this competing reaction pathway for Cu(hfac)(vtms) may occur under the CVD reaction conditions, especially, for example, at high temperatures and on the platinum metal substrate.

Without wishing to be bound by any one theory, there may be at least two classes of pathways by which CuBr is formed via reaction between Cu(hfac)(vtms) and HBr. In the first pathway, HBr and Cu(hfac)(vtms) may undergo an acid-base bimolecular reaction to form CuBr, Hhfac, and vtms, according to the following reaction:

Cu(hfac)(vtms)+HBr→CuBr+Hhfac+vtms.

There are variations on this mechanism depending on when vtms is released and which species is/are bound to the surface.

The second pathway may contain two reactions. First, two Cu(hfac)(vtms) molecules may undergo a metal-catalyzed disproportionation to form a Cu metal film, and the volatile species Cu(hfac)$_2$ and vtms, according to the following reaction:

2Cu(hfac)(vtms)→Cu+Cu(hfac)$_2$+2vtms.

Second, HBr may oxidize the copper metal to Cu$^{1+}$, resulting in CuBr and a reduced species, such as H$_2$ vapor, according to the following reaction:

2Cu+2HBr→2CuBr+H$_2$.

The first pathway bears analogy to metalorganic precursor reactions with vapors of Brønsted acids (H$_2$O, H$_2$S, etc.) to form metal chalcogenides and metal oxides.

The second pathway is thermodynamically feasible. The preceding reaction has a $\Delta G_{rxn}°$ of −85.5 kJ/mol at 90° C. However, the Cu metal might not be deposited on a SiN substrate, since the disproportion of Cu(hfac)(vtms) has been reported at temperatures above about 100° C. and it is metal-surface-catalyzed. To evaluate this, a control experiment was conducted to determine whether metallic Cu may be formed on the substrates under the reaction conditions disclosed herein.

In this control experiment, Cu(hfac)(vtms) was dosed into the reactor using the same pulse sequence as the CuBr depositions described above, but without introducing HBr, at a substrate temperature of 83.4° C. The reactor chamber contained five substrates: glassy carbon, SiO$_2$, SiN, Al$_2$O$_3$, and platinum. Upon the four substrates that are electrical insulators (glassy carbon, SiO$_2$, SiN, and Al$_2$O$_3$), it was determined that within the detection limits of the XPS and SEM instruments used, no solid material had been deposited (see SEM images in FIGS. 17A-17D and XPS data in FIGS. 18A-18D). Based on this test, the mechanism of the observed CuBr deposition upon electrically insulating substrates is likely not bromination of existing copper metal.

FIGS. 17A-17D include plan-view SEM images of the resulting substrates after the control experiment to deposit copper metal. The scale bar on FIG. 17C applies to FIGS. 17A, 17B, and 17D as well. FIGS. 18A-D show that, after surface carbon is sputtered away beyond the first etch level, the substrate was the most appreciably detected component, with about 0-0.5 atomic % of Cu and 0-0.5 atomic % Br detected. These SEM images combined with the XPS data in FIG. 18A-18D indicate that the surface remains mostly unchanged, with a small (~1 atomic % or less) amount of copper on the surface. High-resolution XPS spectra were taken and corroborated with survey scans to ensure no peaks were missed.

In contrast, upon the platinum substrate, it was observed that a copper layer had been deposited (see XPS and SEM in FIGS. 19A-D). Based on these SEM images, this copper layer's thickness was determined to vary with distance into the reactor. Specifically, on a substrate that was 1 in long, via cross-sectional SEM, film thicknesses measured ranging from about 300 nm to about 80 nm within the first inch of the reactor substrate holder. Based on this test, the observed CuBr deposition upon platinum may proceed through direct CuBr deposition from the gaseous precursors or stepwise deposition then bromination of copper metal.

Contact Angle Measurements

In some embodiments, the composition of the substrate may affect CuBr film morphology. This may be attributed to substrate-CuBr interfacial free energy matching. Therefore, experiments were conducted to assess these interfacial free energies. One method involved using contact angle measurements between test liquids and surfaces to estimate the free energy of each surface. The work of adhesion was determined by using a geometric mean:

$$W_A = 2(\sqrt{\gamma_{LV}^d \gamma_{SV}^d} + \sqrt{\gamma_{LV}^p \gamma_{SV}^p})$$

By combining this equation with the Young-Dupré equation, the following equation related the contact angle, $\theta_c$, of a liquid on a surface with the polar and dispersive components of the interfacial free energies of the solid and the liquid (in the same given vapor, which can be the normal atmosphere):

$$\gamma_{LV}(1+\cos\theta_c) = 2(\sqrt{\gamma_{LV}^d \gamma_{SV}^d} + \sqrt{\gamma_{LV}^p \gamma_{SV}^p})$$

The goal of this calculation was to determine unknown $\gamma_{SV}$ values from known $\gamma_{LV}$ values and measured $\theta_c$ values. This equation was rearranged to produce a formula in the format y=mx+b, which enabled a statistical best fit line from which the most accurate values of $\gamma^p_{SV}$ and $\gamma^d_{SV}$ were determined from several test liquids:

$$\frac{\gamma_V(1+\cos\theta_c)}{2\sqrt{\gamma_{LV}^d}} = (\sqrt{\gamma_{SV}^p})\left(\frac{\sqrt{\gamma_{LV}^p}}{\sqrt{\gamma_{LV}^d}}\right) + \sqrt{\gamma_{SV}^d}.$$

Figure 20:
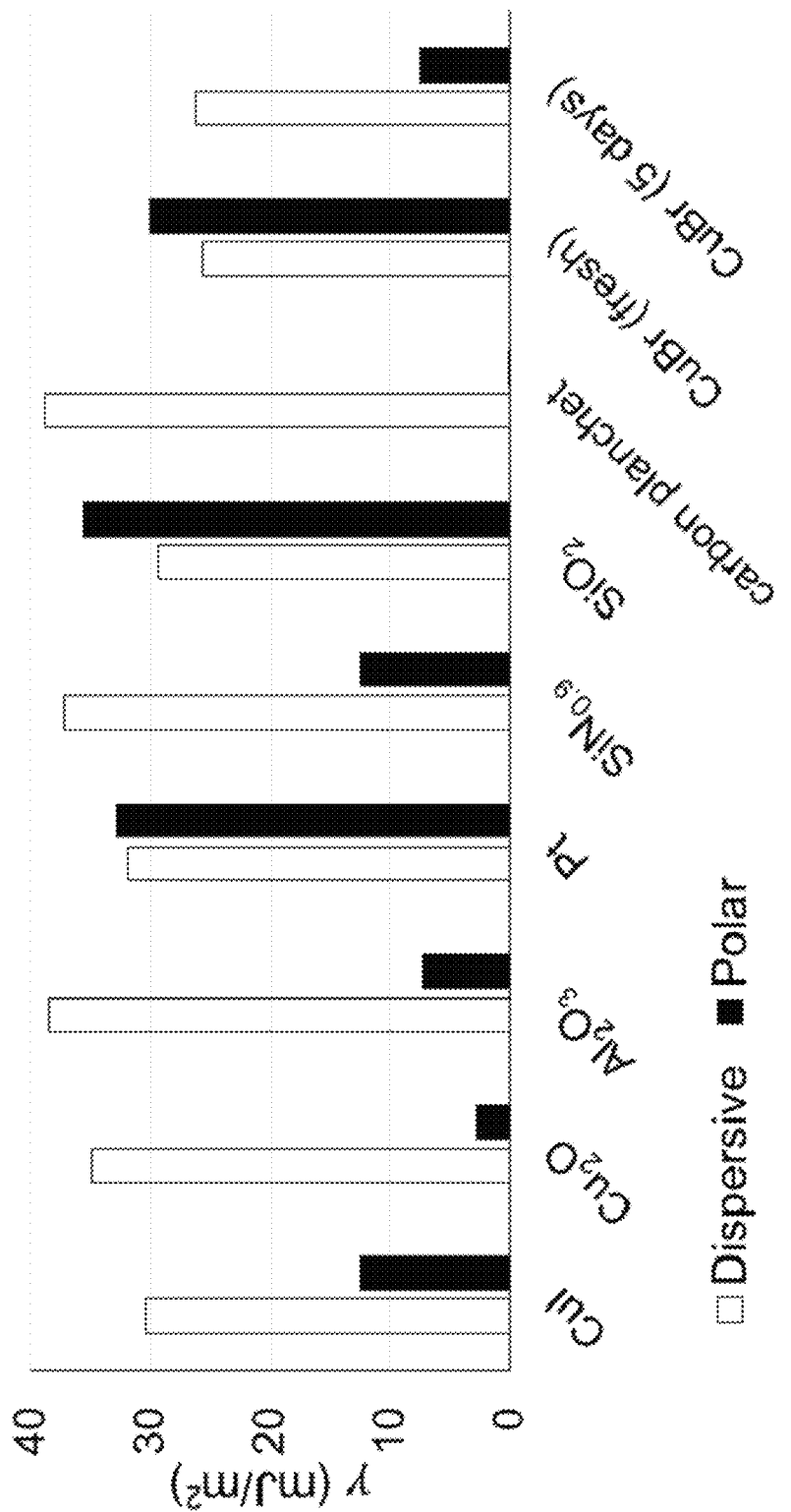
FIG. 20 shows calculated dispersive and polar components of free energy for CuBr films and substrates, according to one or more embodiments.

In order to estimate $\gamma_{SV}$ for a solid surface of interest, a test liquid with known $\gamma^p_{LV}$ and $\gamma^d_{LV}$ values can be used, and $\theta_c$ of the liquid on the surface measured experimentally. A battery of test liquids was assembled with polar and dispersive components of surface free energy spanning a large range: diiodomethane, thiodiglycol, deionized water, ethylene glycol, toluene, dimethyl sulfoxide, and benzyl alcohol. The results of these experiments and analysis are shown in FIG. 20. Contact angle measurements of a CuBr film measured directly after deposition and again 5 days later showed a significant decrease in the polar component of the free energy with age. Noting that the aged CuBr sample's polar and dispersive components appear to approach those of cuprous oxide, CuBr suffered surface oxidation when stored in air, and this oxidation significantly altered the surface free energy within 5 days.

To estimate the interfacial free energy between two solids, the following equation used the dispersive and polar components of the solid-vapor surface free energy of two materials α and β:

$$\gamma_{\alpha\beta} = \gamma_\alpha + \gamma_\beta - 2(\sqrt{\gamma_\alpha^d \gamma_\beta^d} + \sqrt{\gamma_\alpha^p \gamma_\beta^p}).$$

Figure 21:
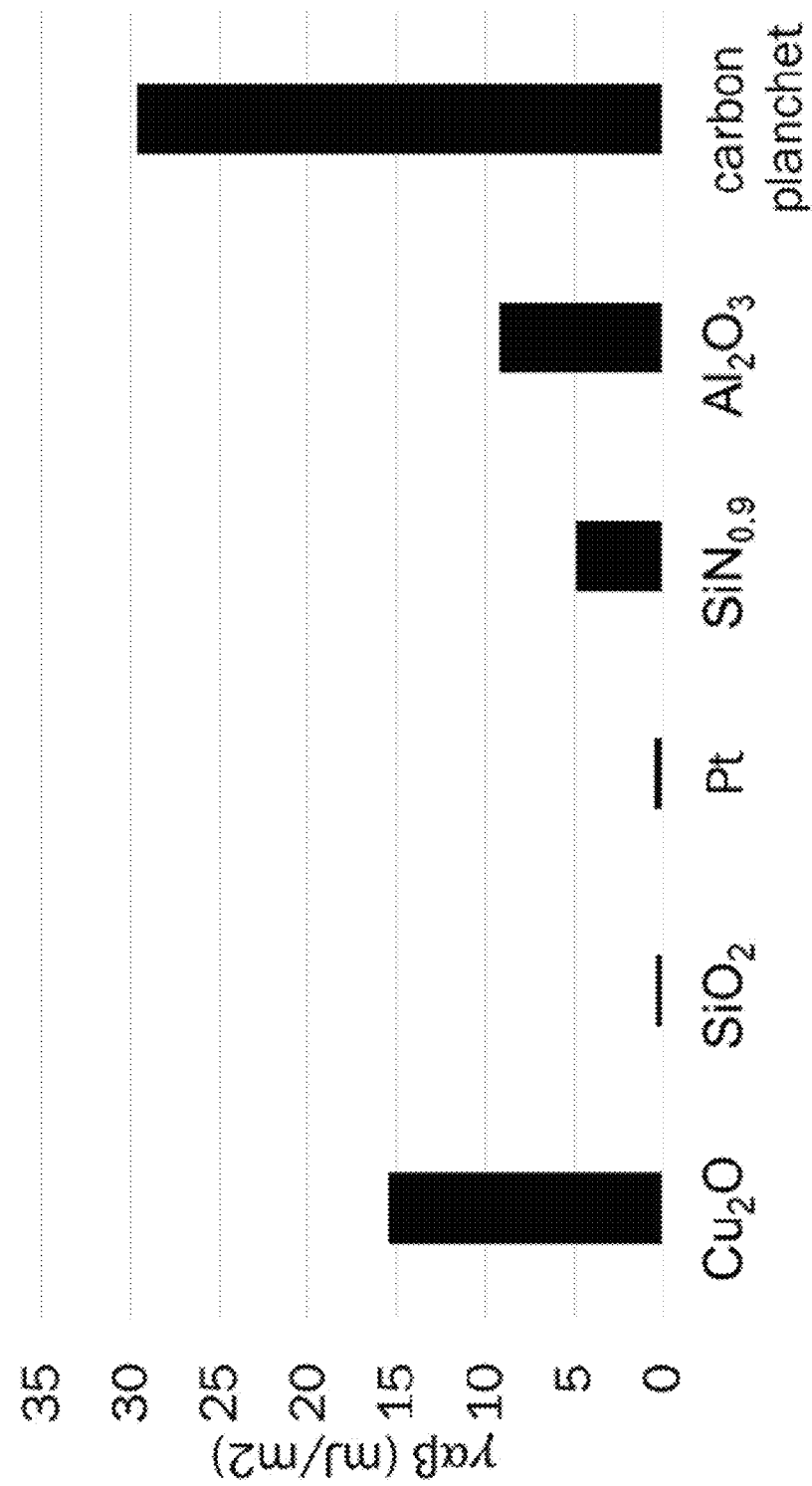
FIG. 21 shows calculated interfacial free energy between CuBr and substrates, according to one or more embodiments.
Figure 22A:
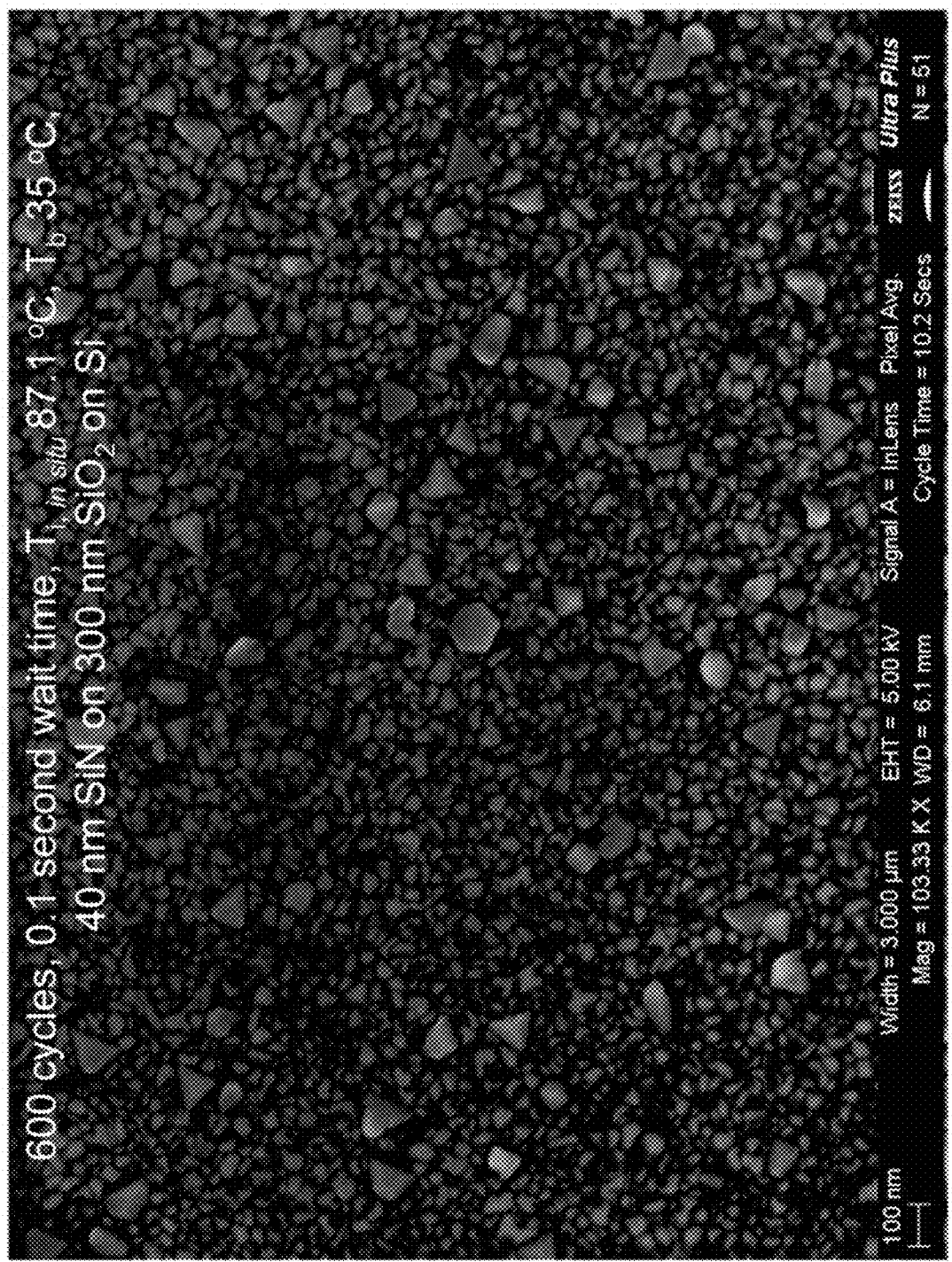
FIG. 22A shows a SEM image of a CuI layer deposited for 600 cycles on 40 nm SiN on 300 nm $SiO_2$, according to one or more embodiments.
Figure 22B:
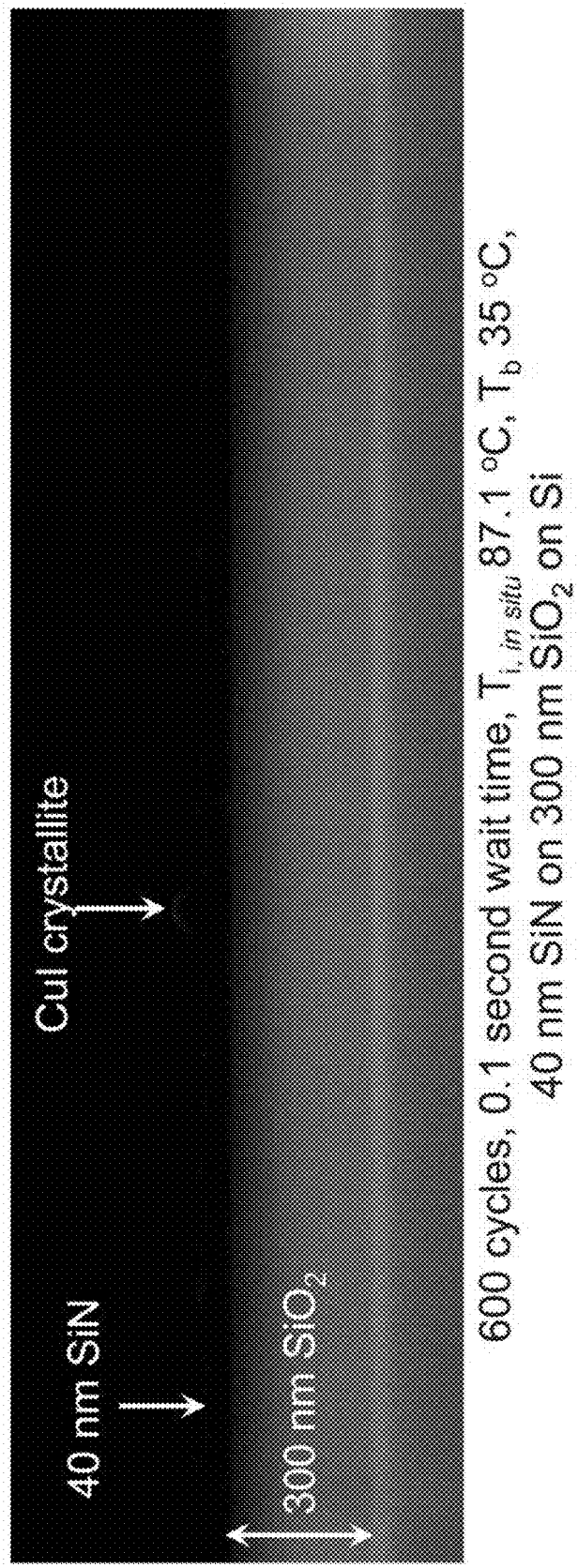
FIG. 22B shows a cross-sectional SEM image of a CuI layer deposited for 600 cycles on 40 nm SiN on 300 nm $SiO_2$, according to one or more embodiments.
Figure 22C:
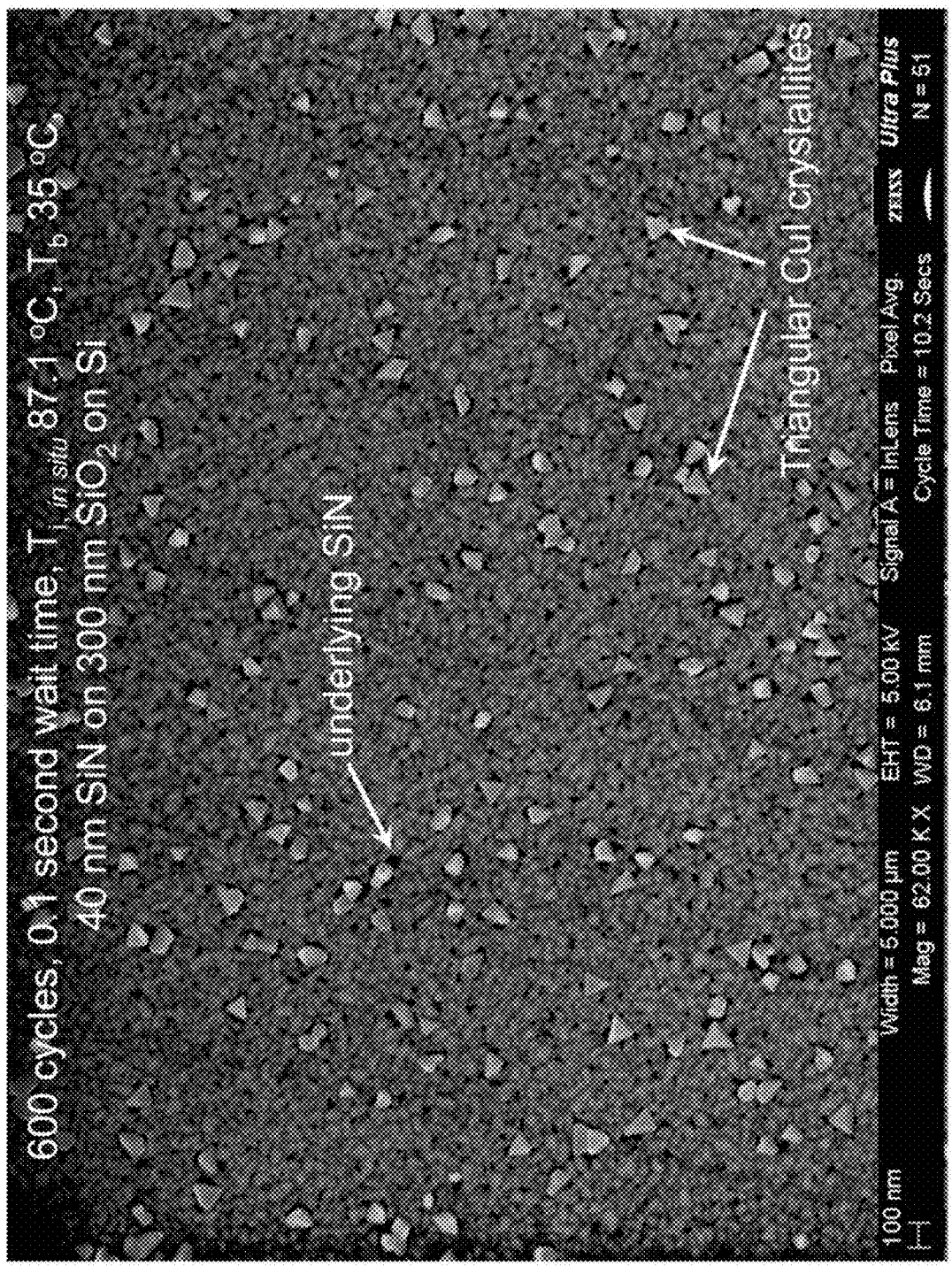
FIG. 22C shows a SEM image of a CuI layer deposited for 600 cycles on 40 nm SiN on 300 nm $SiO_2$, according to one or more embodiments.
Figure 22D:
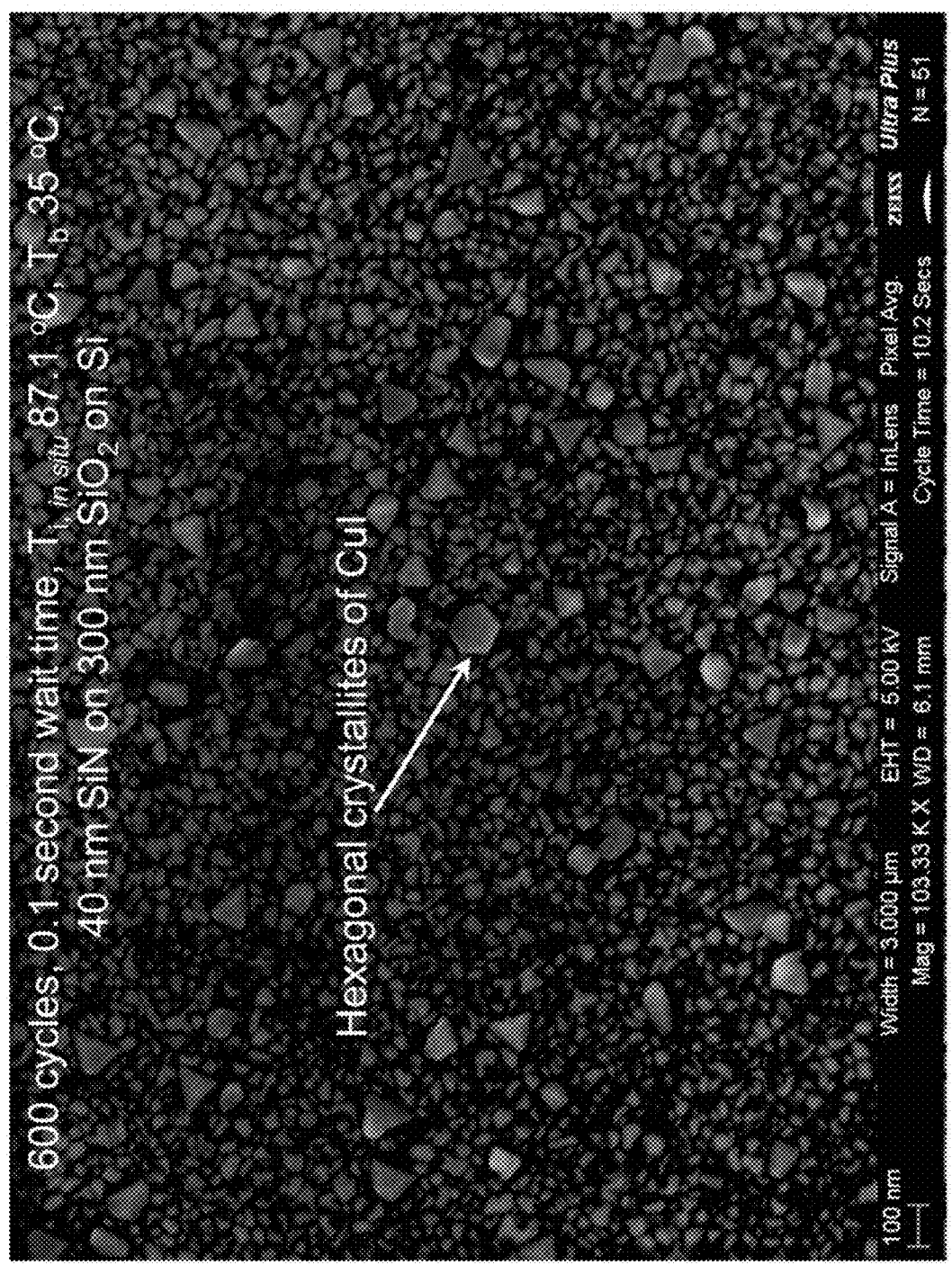
FIG. 22D shows a SEM image of a CuI layer deposited for 600 cycles on 40 nm SiN on 300 nm $SiO_2$, according to one or more embodiments.
Figure 22E:
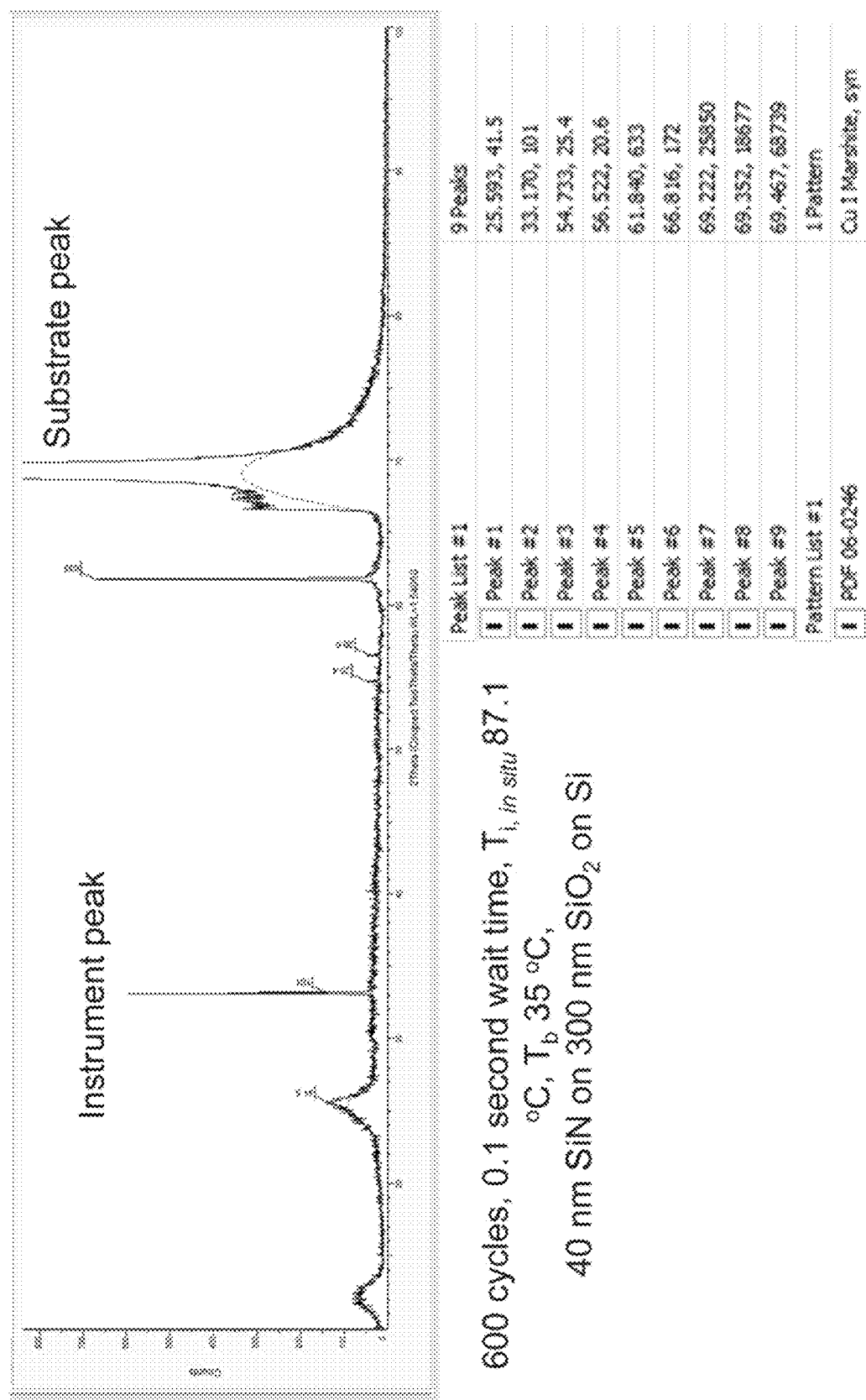
FIG. 22E shows XRD data for a CuI layer deposited for 600 cycles on 40 nm SiN on 300 nm $SiO_2$, according to one or more embodiments.
Figure 22F:
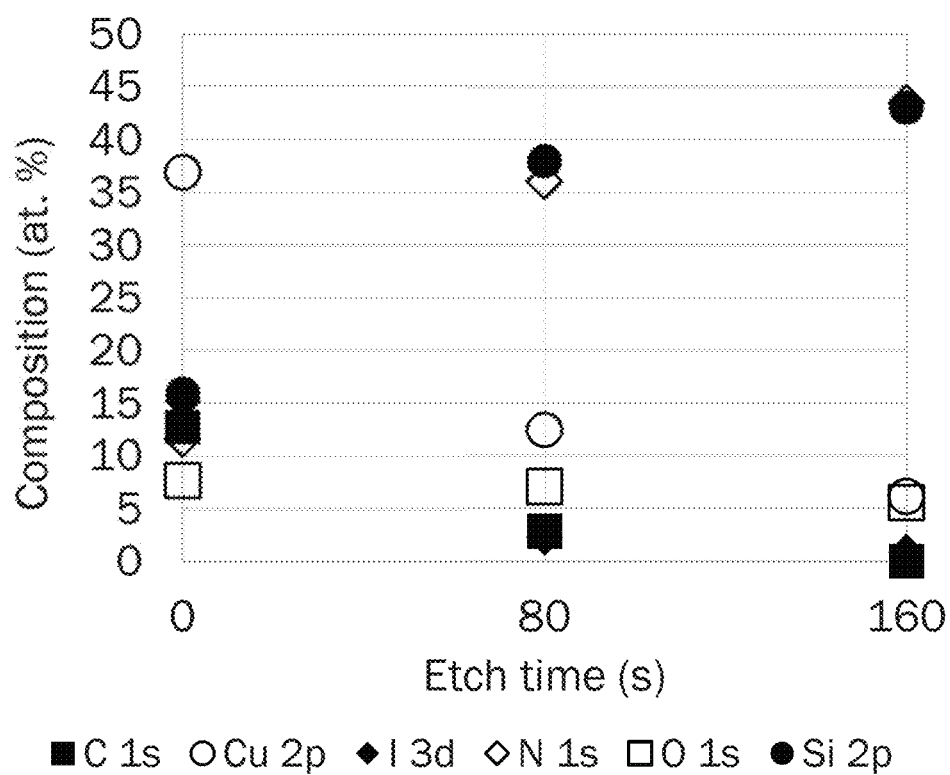
FIG. 22F shows XPS data for a CuI layer deposited for 600 cycles on 40 nm SiN on 300 nm $SiO_2$, according to one or more embodiments.
Figure 23A:
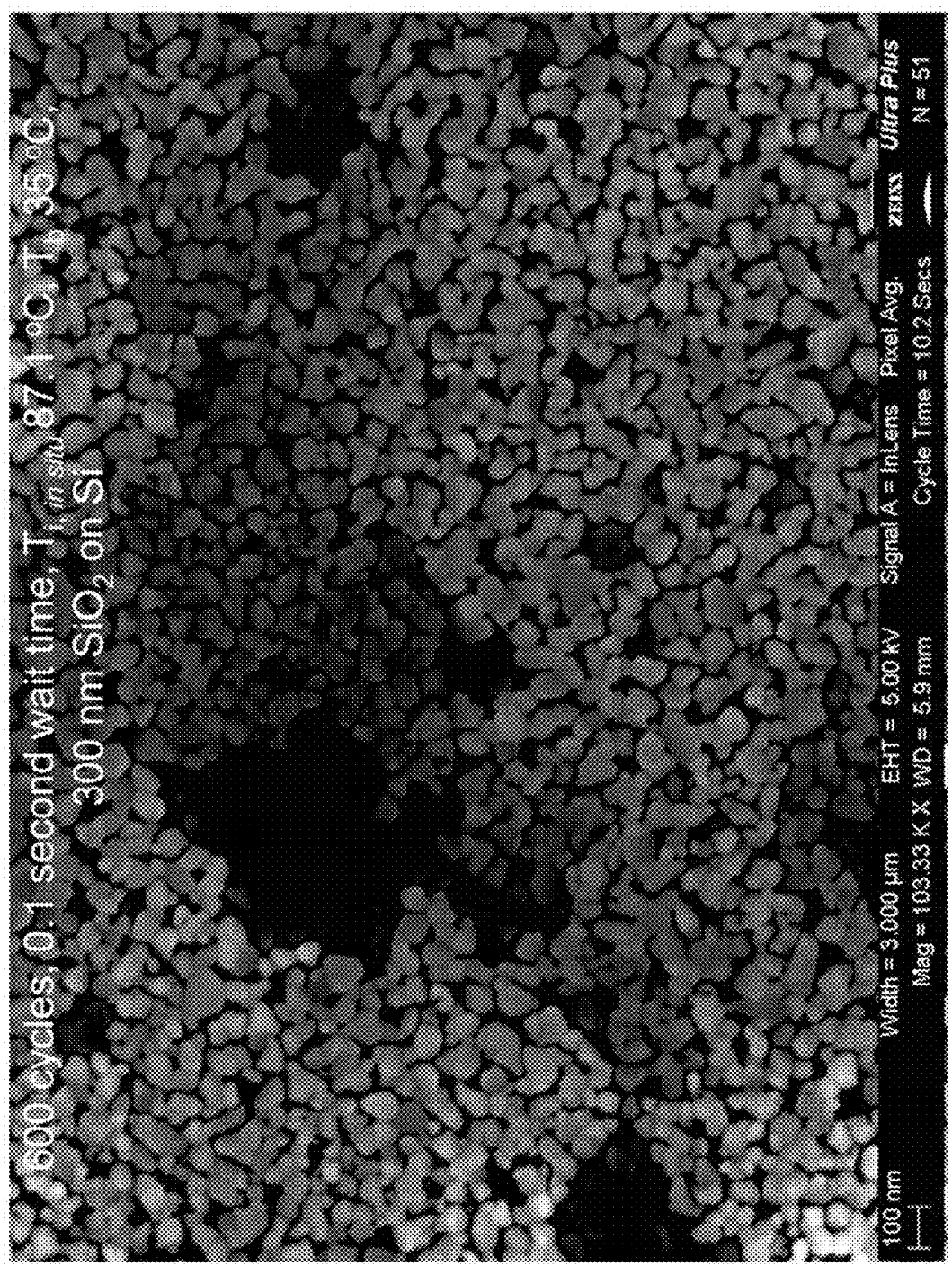
FIG. 23A shows a SEM image for a CuI layer deposited for 600 cycles on 300 nm $SiO_2$ on Si, according to one or more embodiments.
Figure 23B:
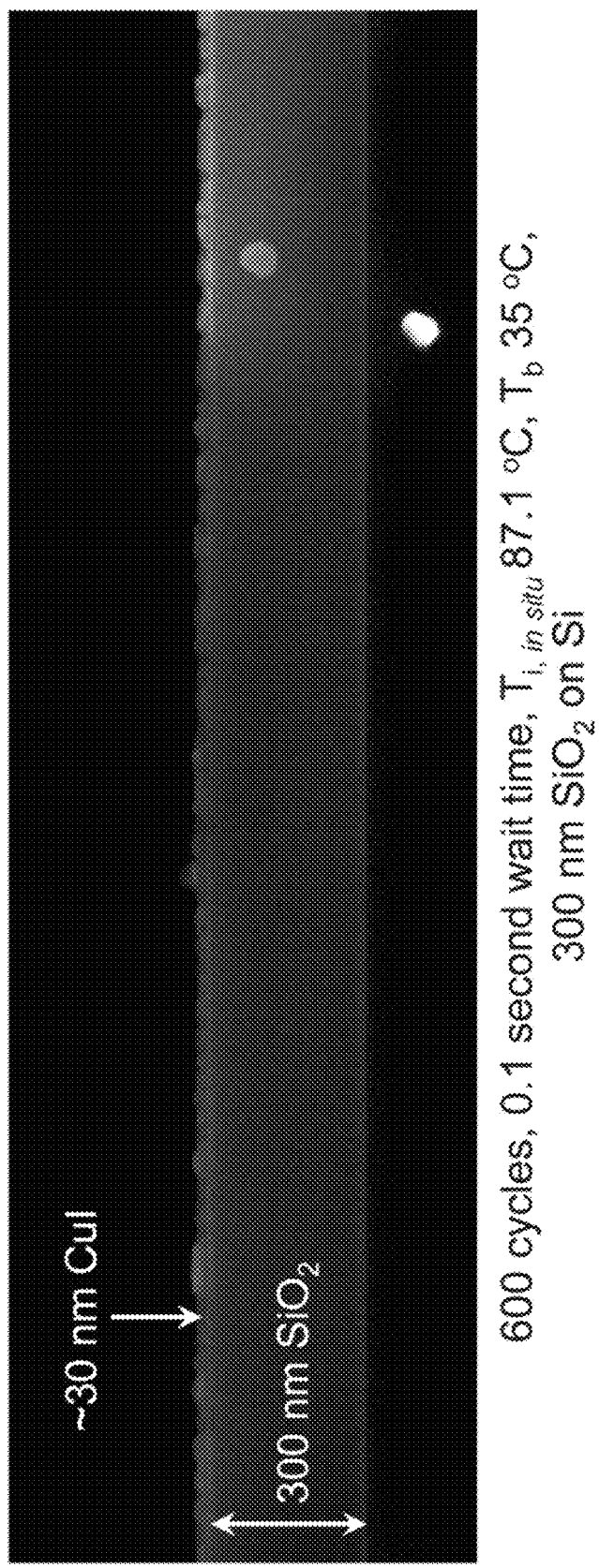
FIG. 23B shows a cross-sectional SEM image for a CuI layer deposited for 600 cycles on 300 nm $SiO_2$ on Si, according to one or more embodiments.
Figure 23C:
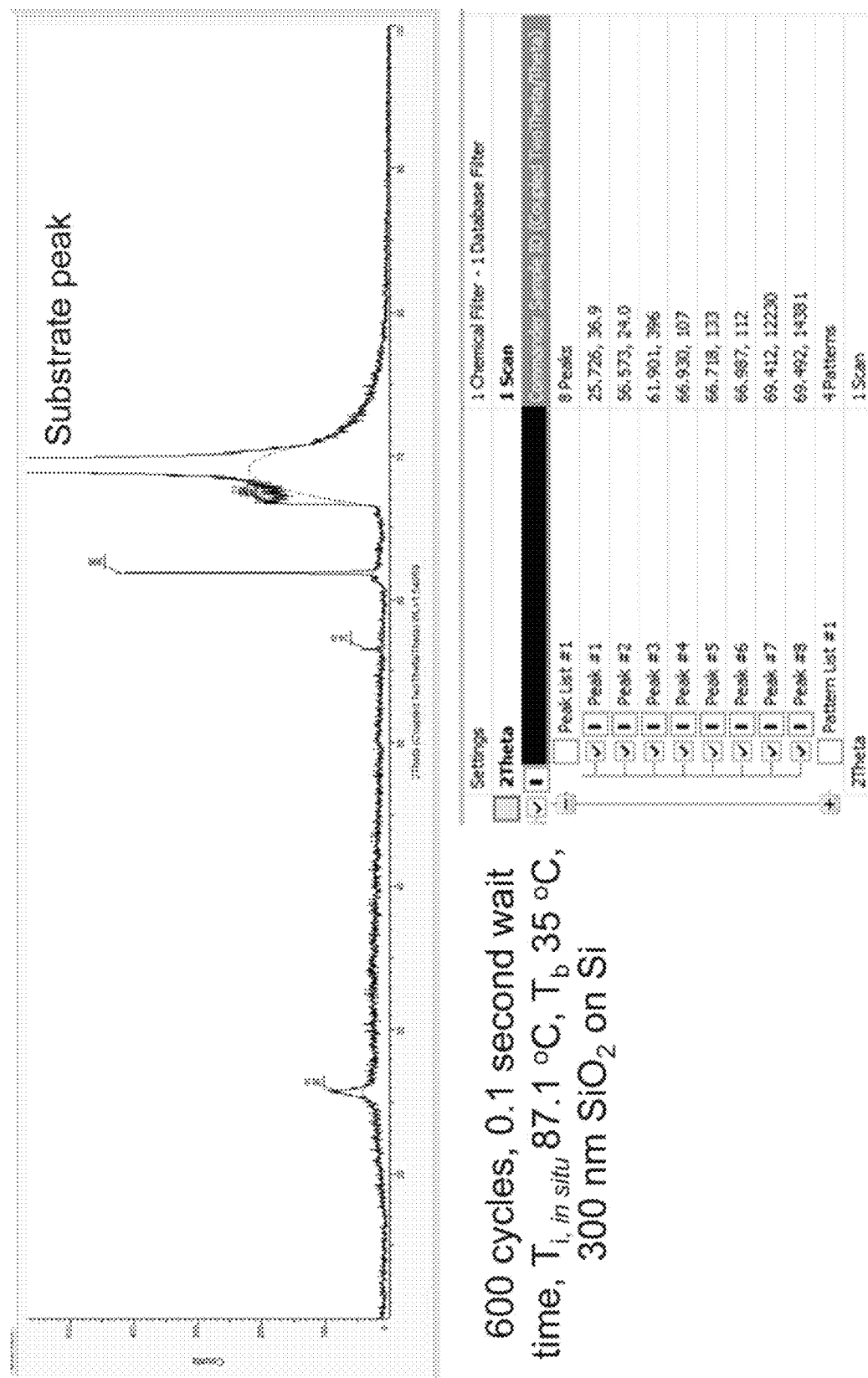
FIG. 23C shows XRD data for a CuI layer deposited for 600 cycles on 300 nm $SiO_2$ on Si, according to one or more embodiments.
Figure 23D:
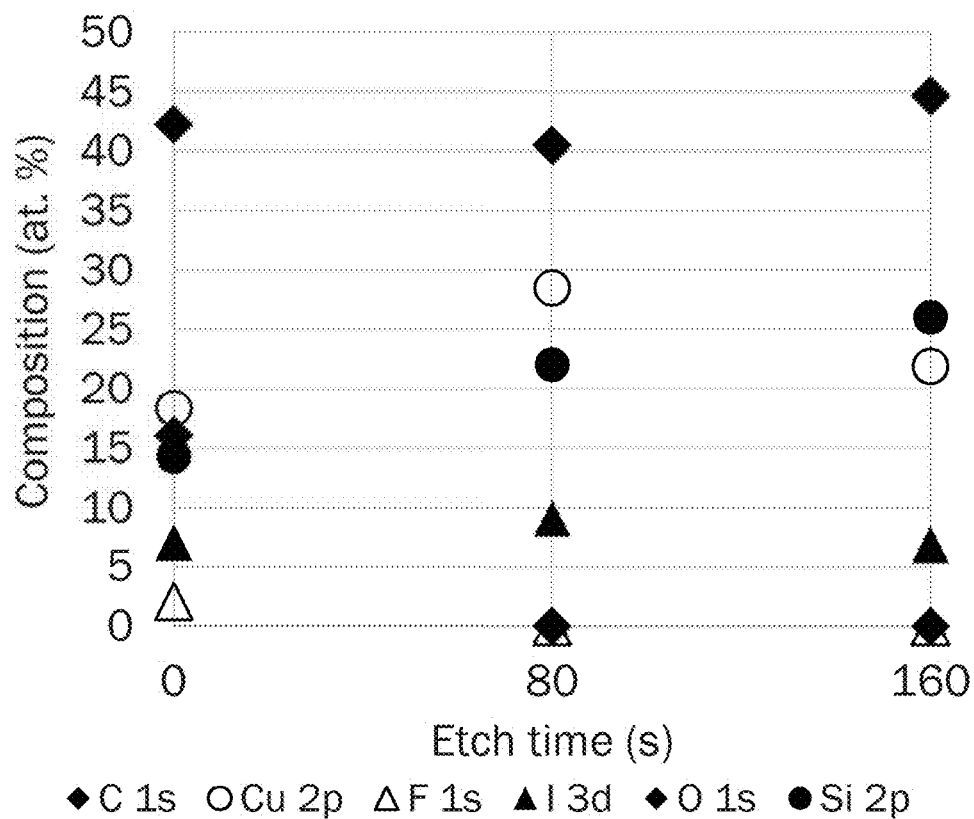
FIG. 23D shows XPS data for a CuI layer deposited for 600 cycles on 300 nm $SiO_2$ on Si, according to one or more embodiments.
Figure 24A:
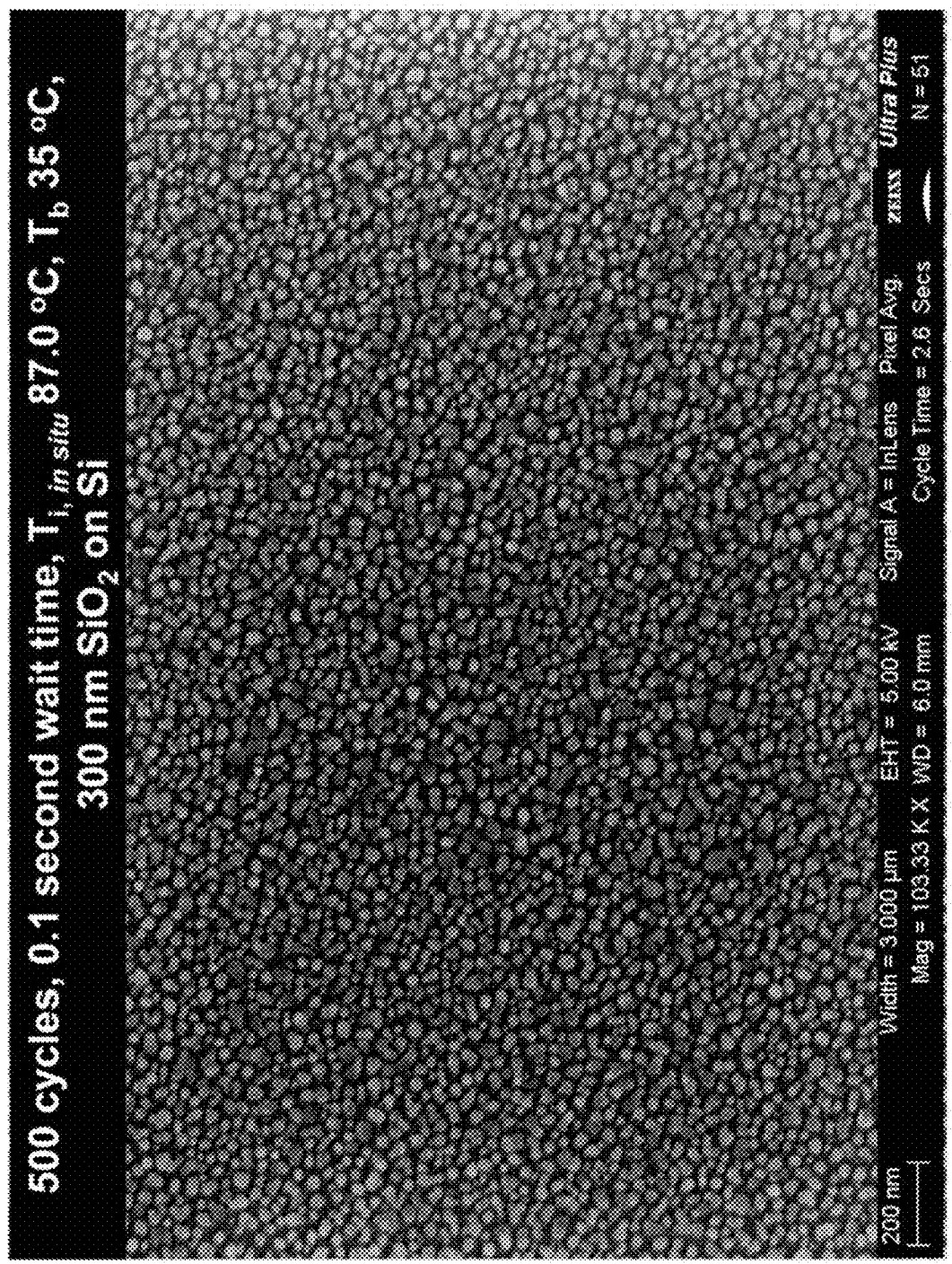
FIG. 24A shows a SEM image of a CuI layer deposited on 300 nm $SiO_2$ on Si for 500 cycles, according to one or more embodiments.
Figure 24B:
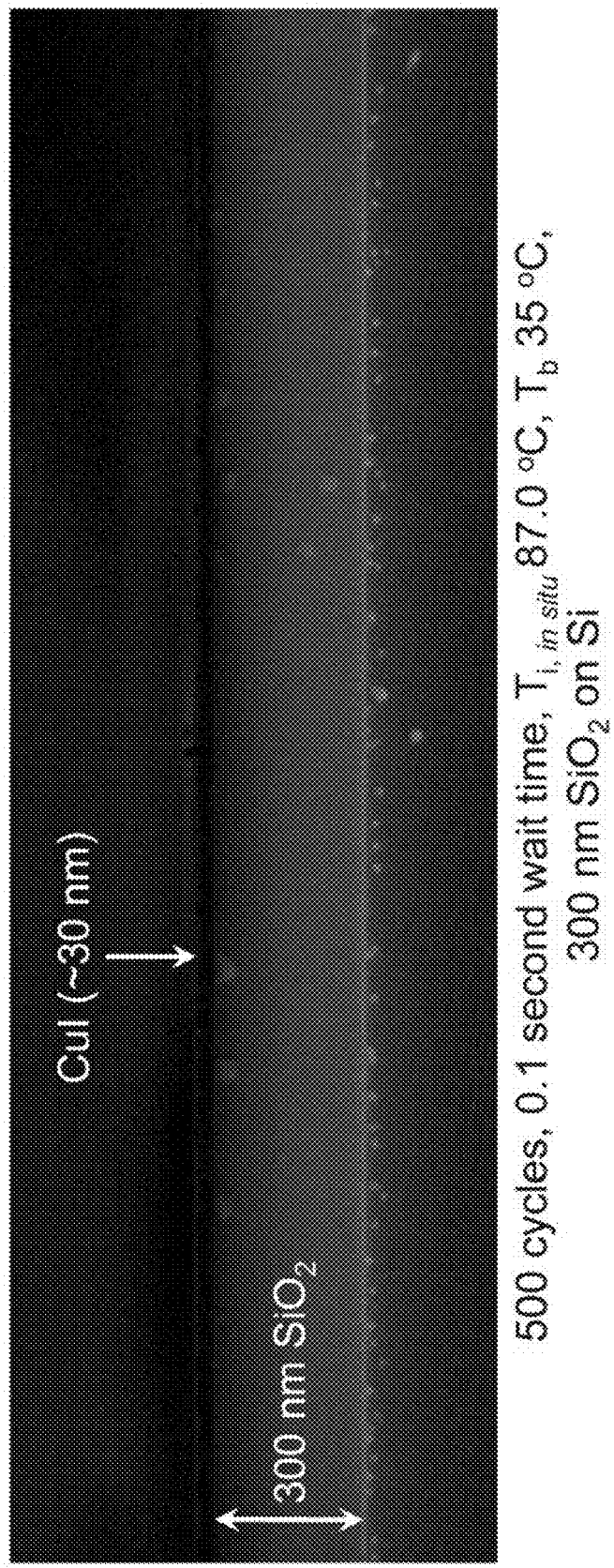
FIG. 24B shows a cross-sectional SEM image of a CuI layer deposited for 500 cycles on 300 nm $SiO_2$ on Si, according to one or more embodiments.
Figure 24C:
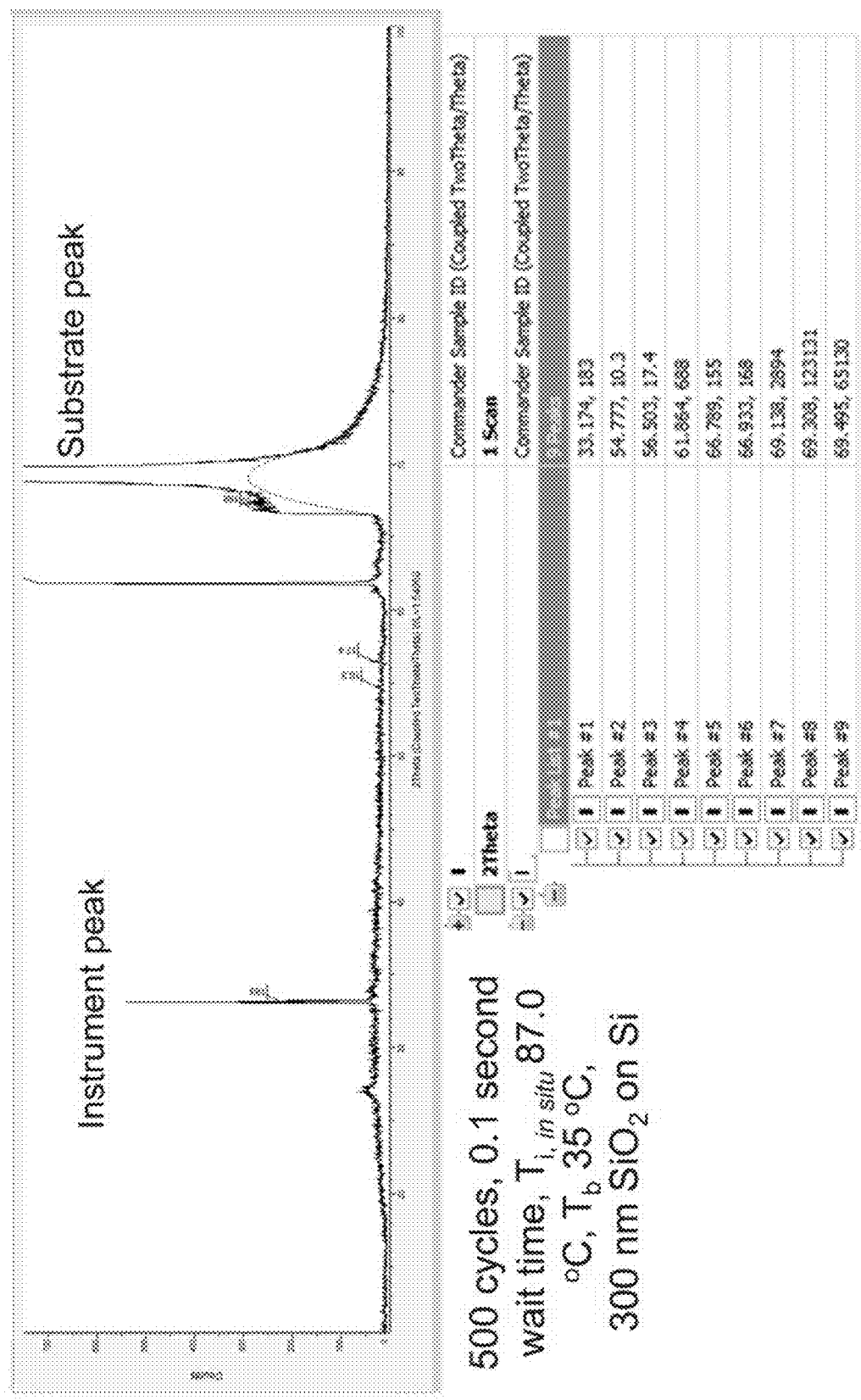
FIG. 24C shows XRD data for a CuI layer deposited for 500 cycles on 300 nm $SiO_2$ on Si, according to one or more embodiments.
Figure 24D:
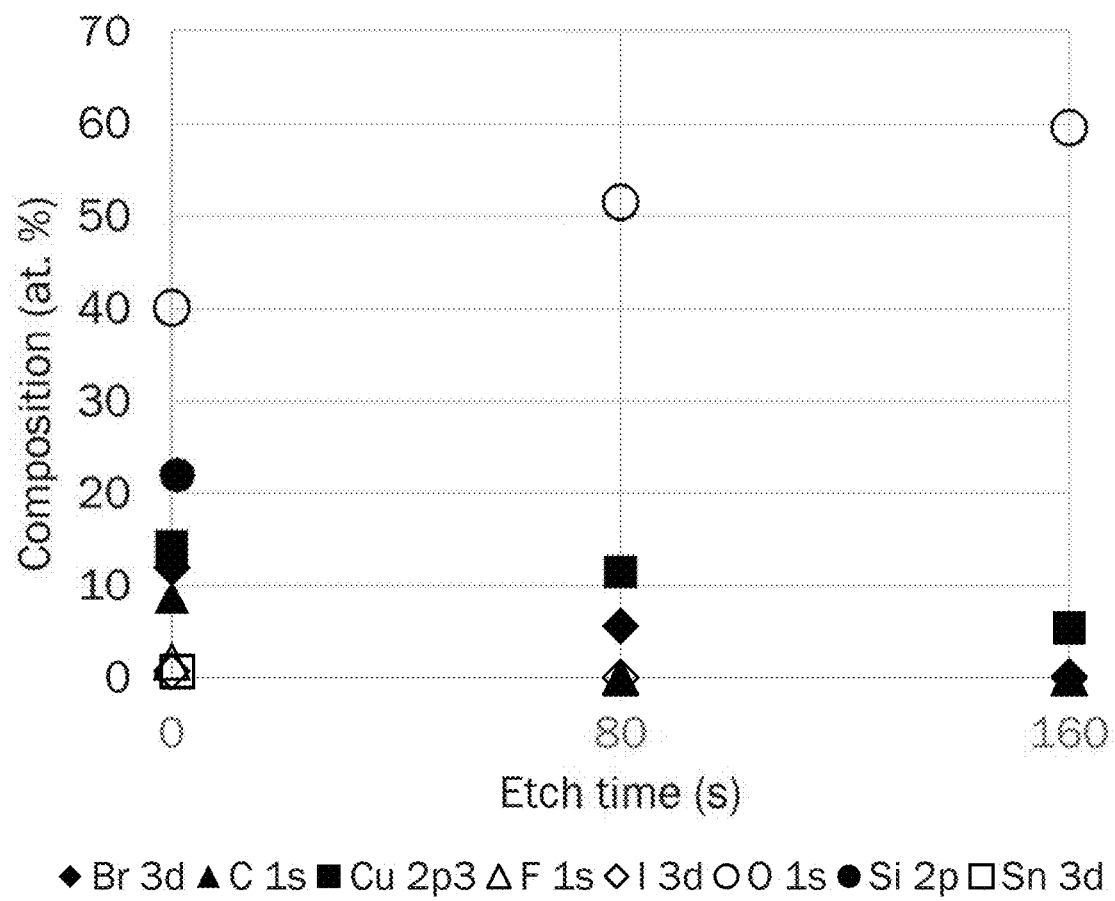
FIG. 24D shows XPS data for a CuI layer deposited for 500 cycles on 300 nm $SiO_2$ on Si, according to one or more embodiments.
Figure 25A:
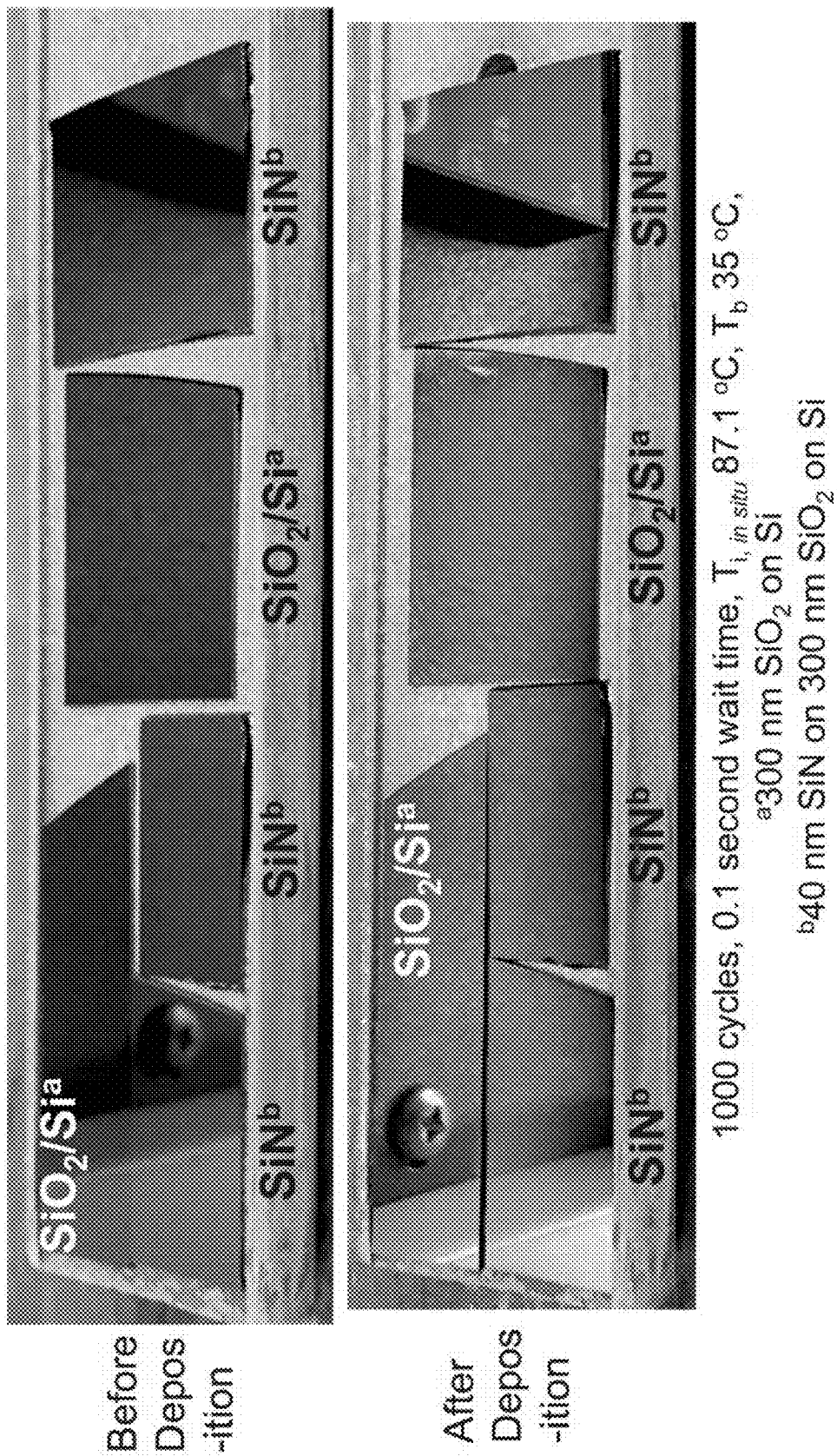
FIG. 25A shows photographs of 300 nm $SiO_2$ on Si and 40 nm SiN on 300 nm $SiO_2$ on Si substrates pre- and post-deposition with CuI for 1000 cycles, according to one or more embodiments.
Figure 25B:
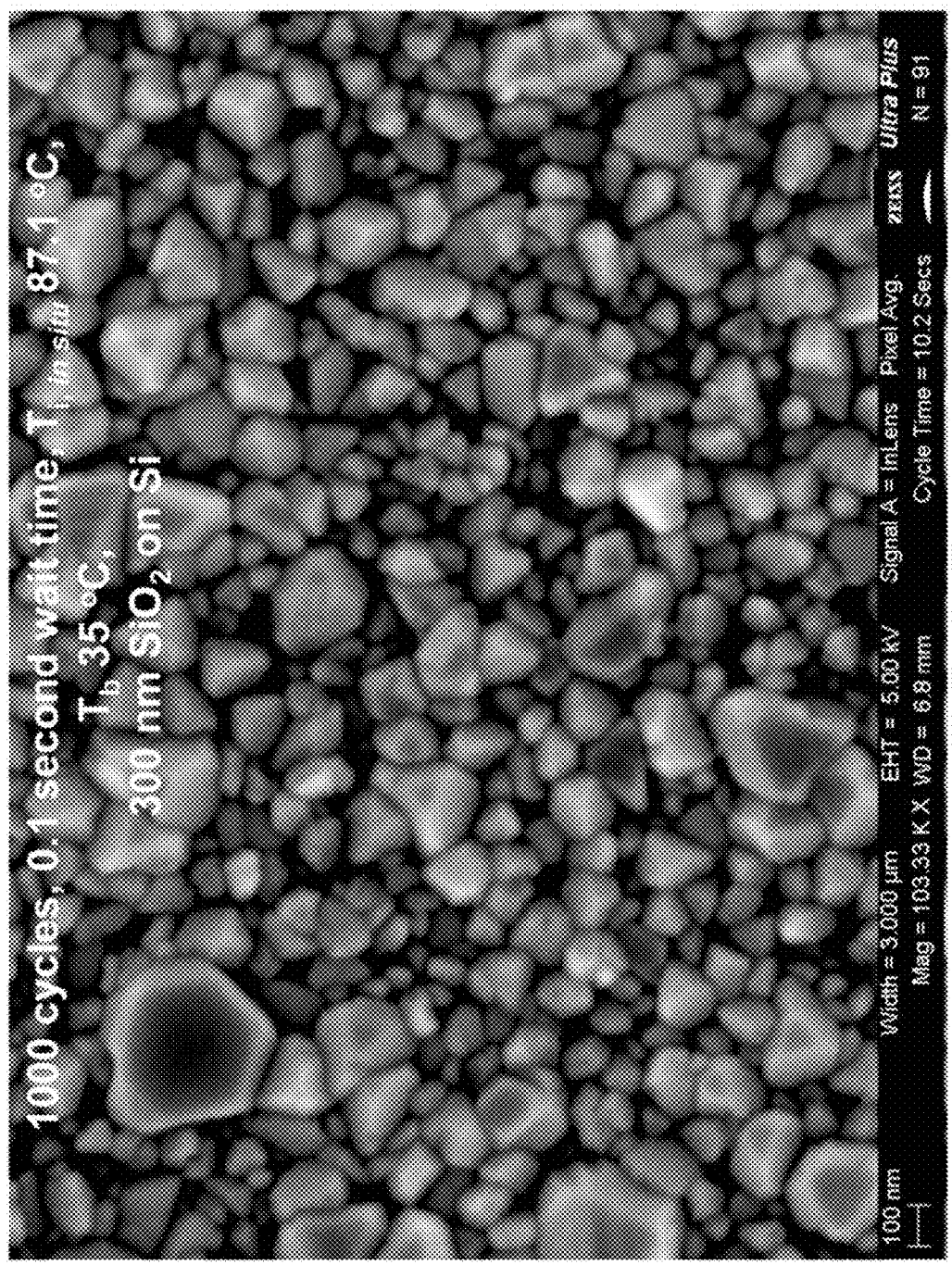
FIG. 25B shows a SEM image of CuI deposited for 1000 cycles on 300 nm $SiO_2$ on Si, according to one or more embodiments.
Figure 25C:
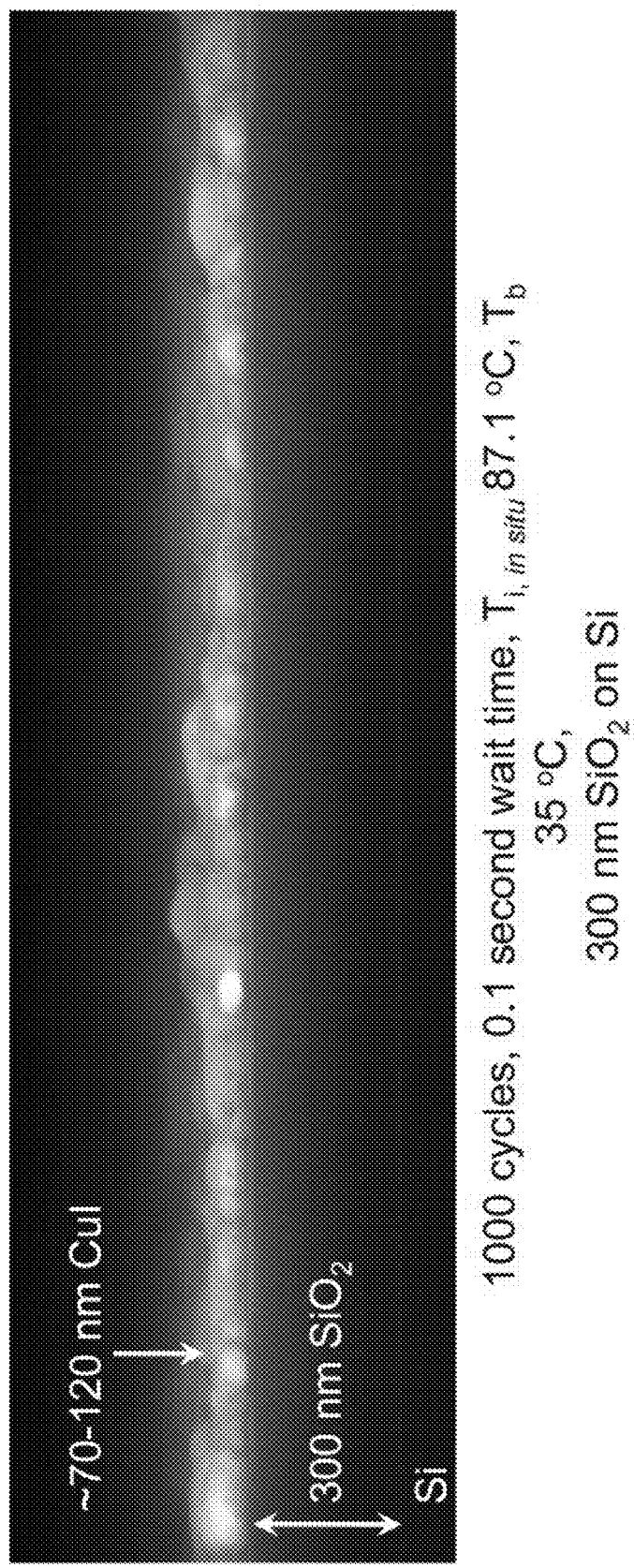
FIG. 25C shows a cross-sectional SEM image of CuI deposited for 1000 cycles on 300 nm $SiO_2$ on Si, according to one or more embodiments.
Figure 25D:
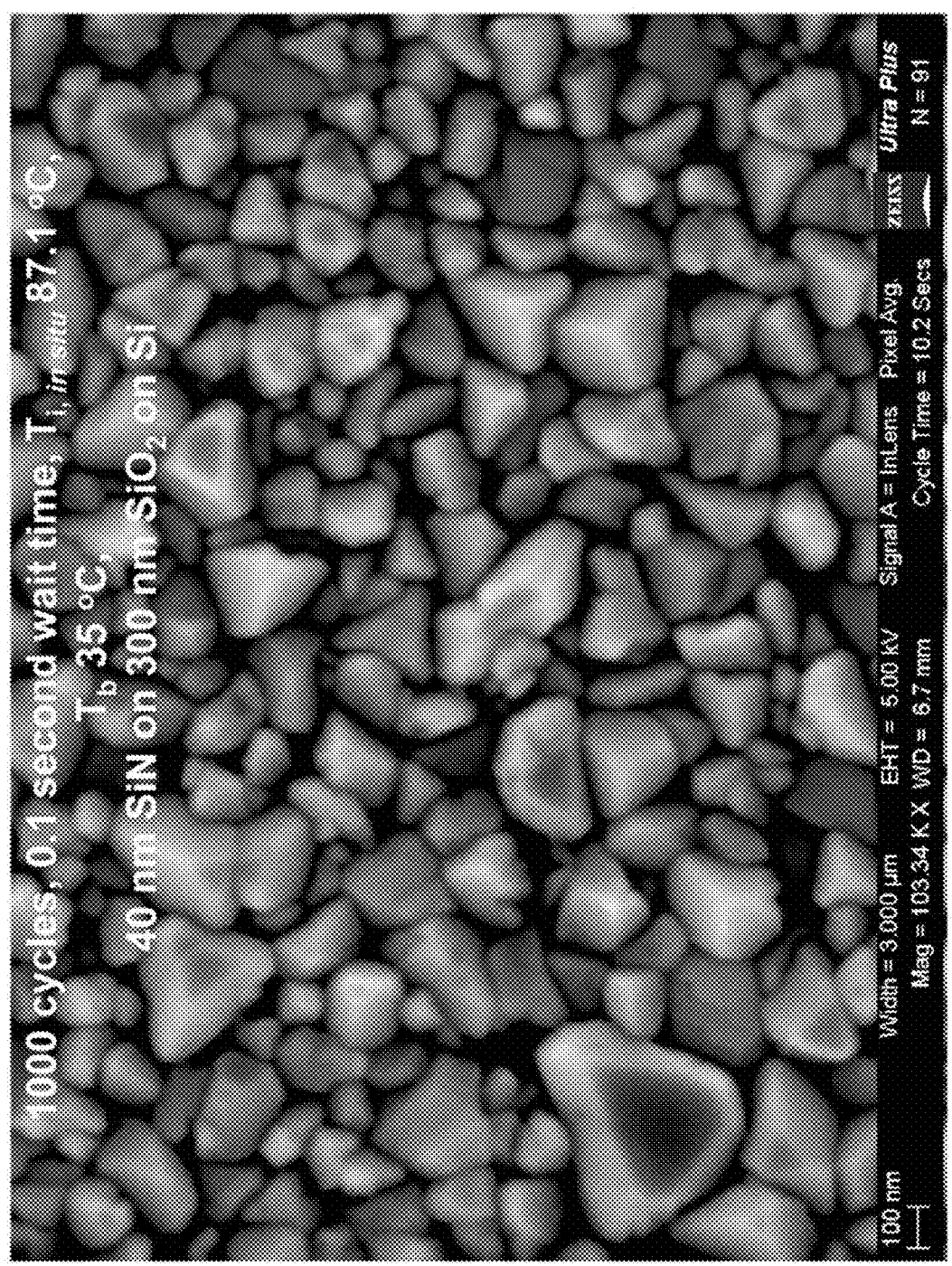
FIG. 25D shows a SEM image of CuI deposited for 1000 cycles on 40 nm SiN on 300 nm $SiO_2$ on Si, according to one or more embodiments.
Figure 25E:
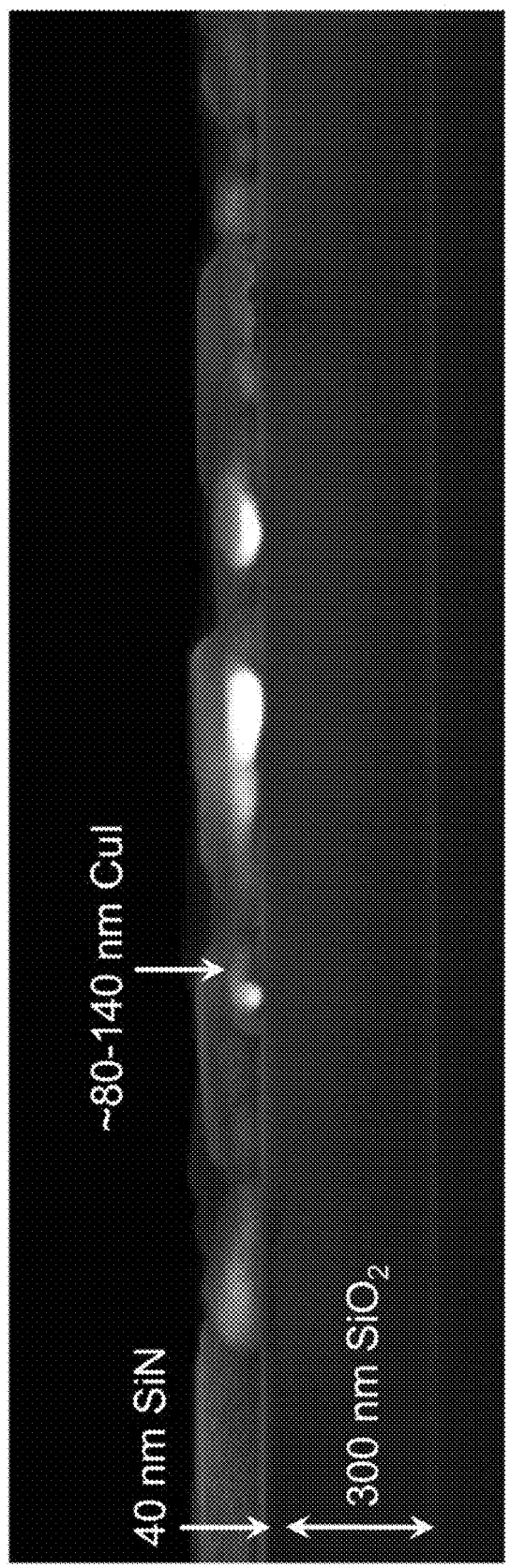
FIG. 25E shows a cross-sectional SEM image of CuI deposited for 1000 cycles on 40 nm SiN on 300 nm $SiO_2$ on Si, according to one or more embodiments.
Figure 25F:
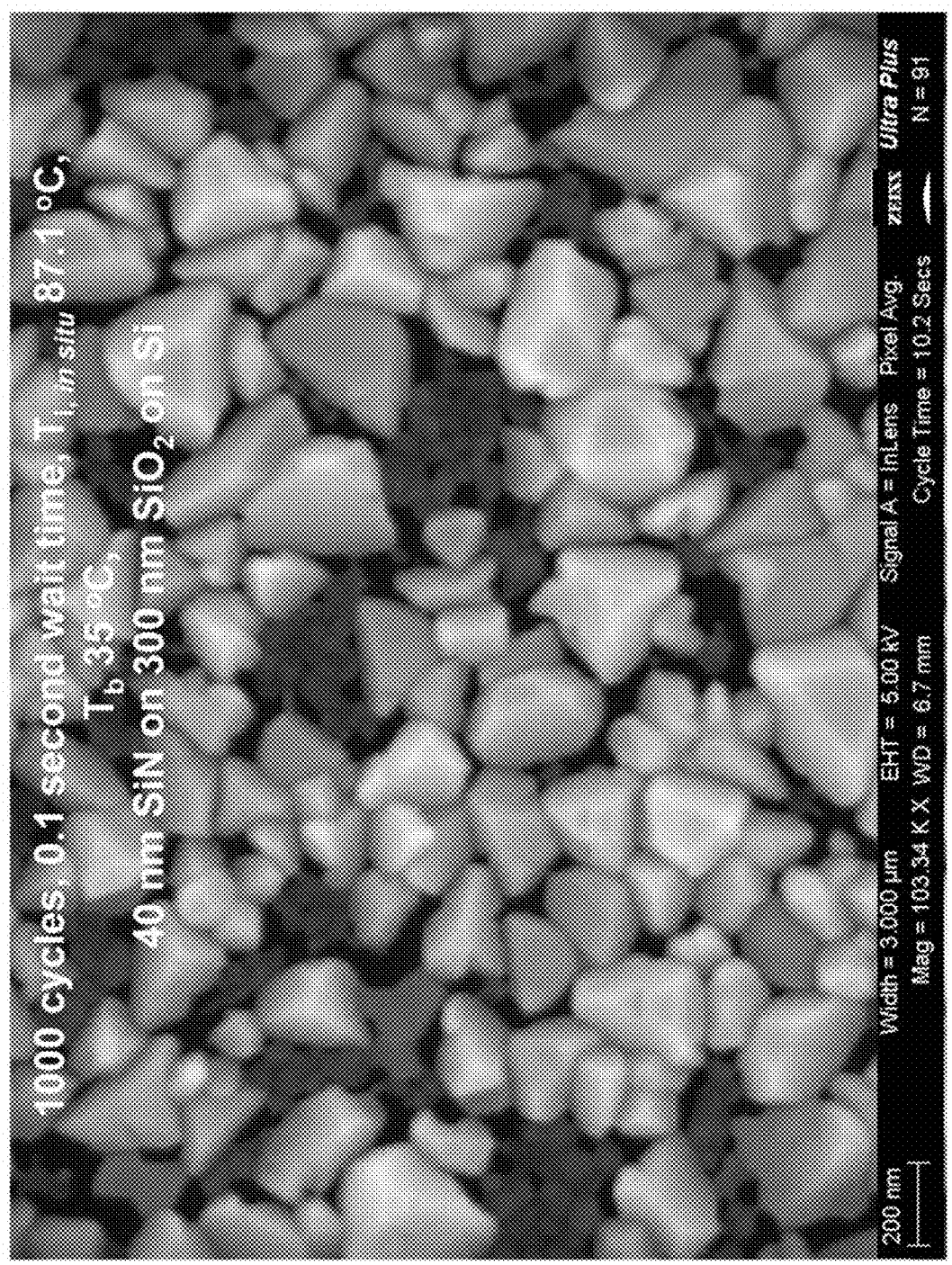
FIG. 25F shows a SEM image of CuI deposited for 1000 cycles on 40 nm SiN on 300 nm $SiO_2$ on Si, according to one or more embodiments.
Figure 25G:
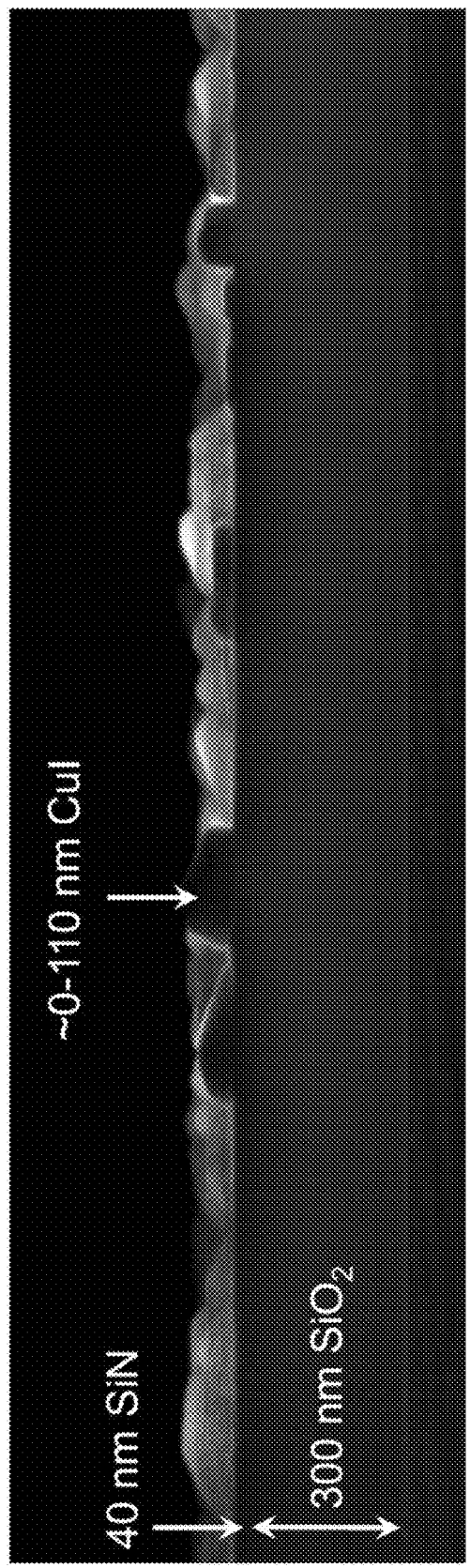
FIG. 25G shows a cross-sectional SEM image of CuI deposited for 1000 cycles on 40 nm SiN on 300 nm $SiO_2$ on Si, according to one or more embodiments.
Figure 25H:
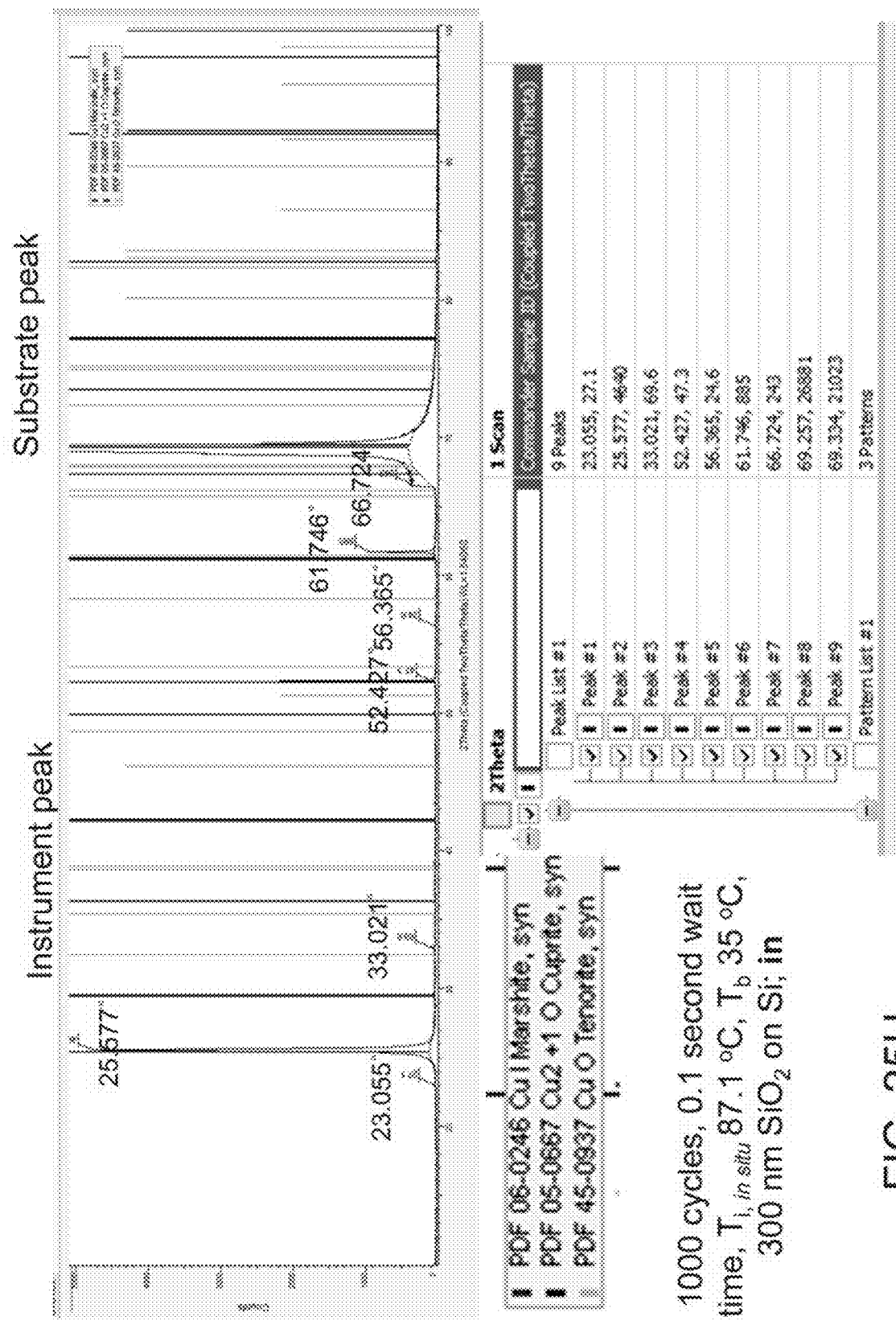
FIG. 25H shows XRD data for CuI deposited for 1000 cycles on 300 nm $SiO_2$ on Si, according to one or more embodiments.
Figure 25I:
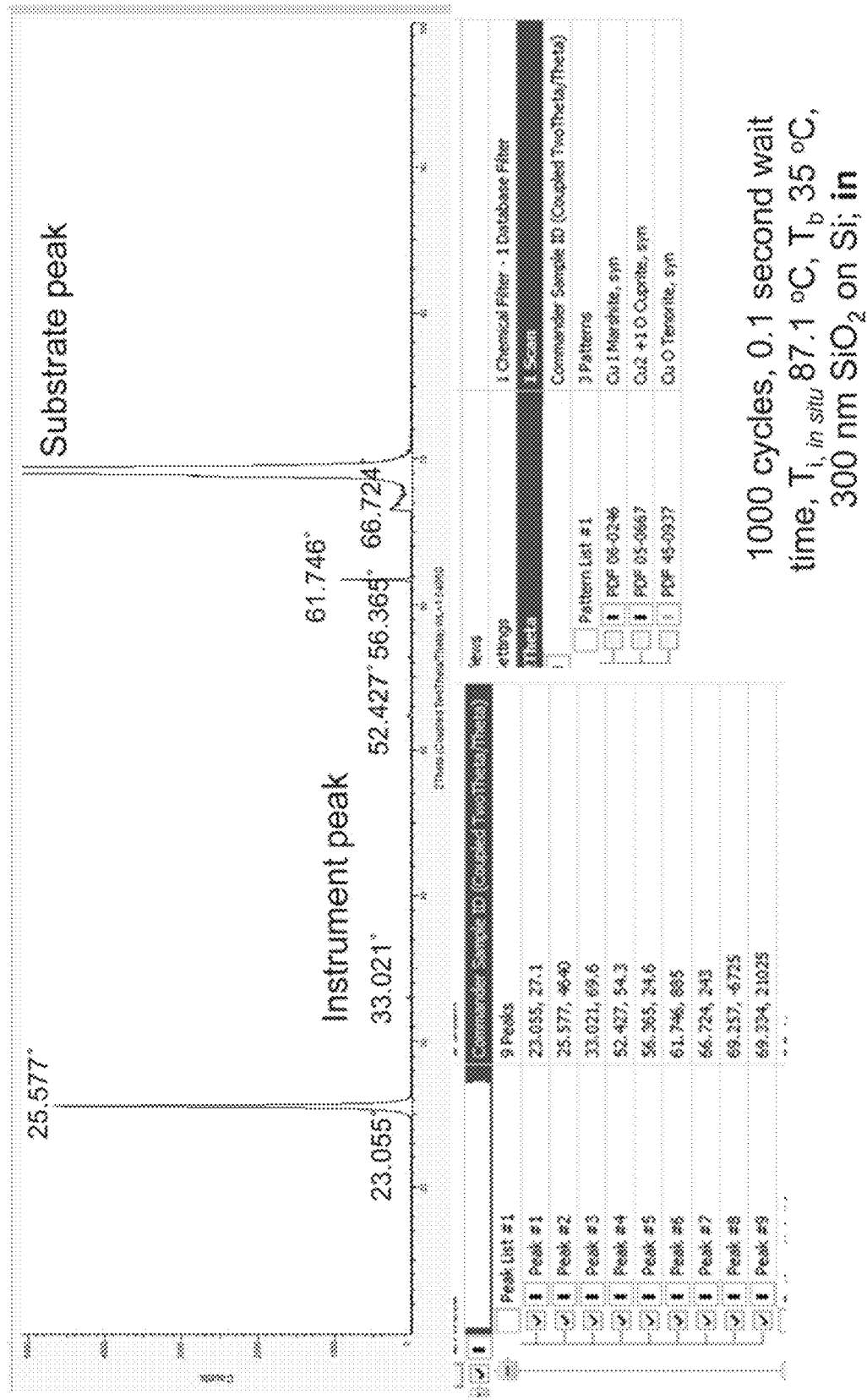
FIG. 25I shows XRD data for CuI deposited for 1000 cycles on 300 nm $SiO_2$ on Si, according to one or more embodiments.
Figure 25J:
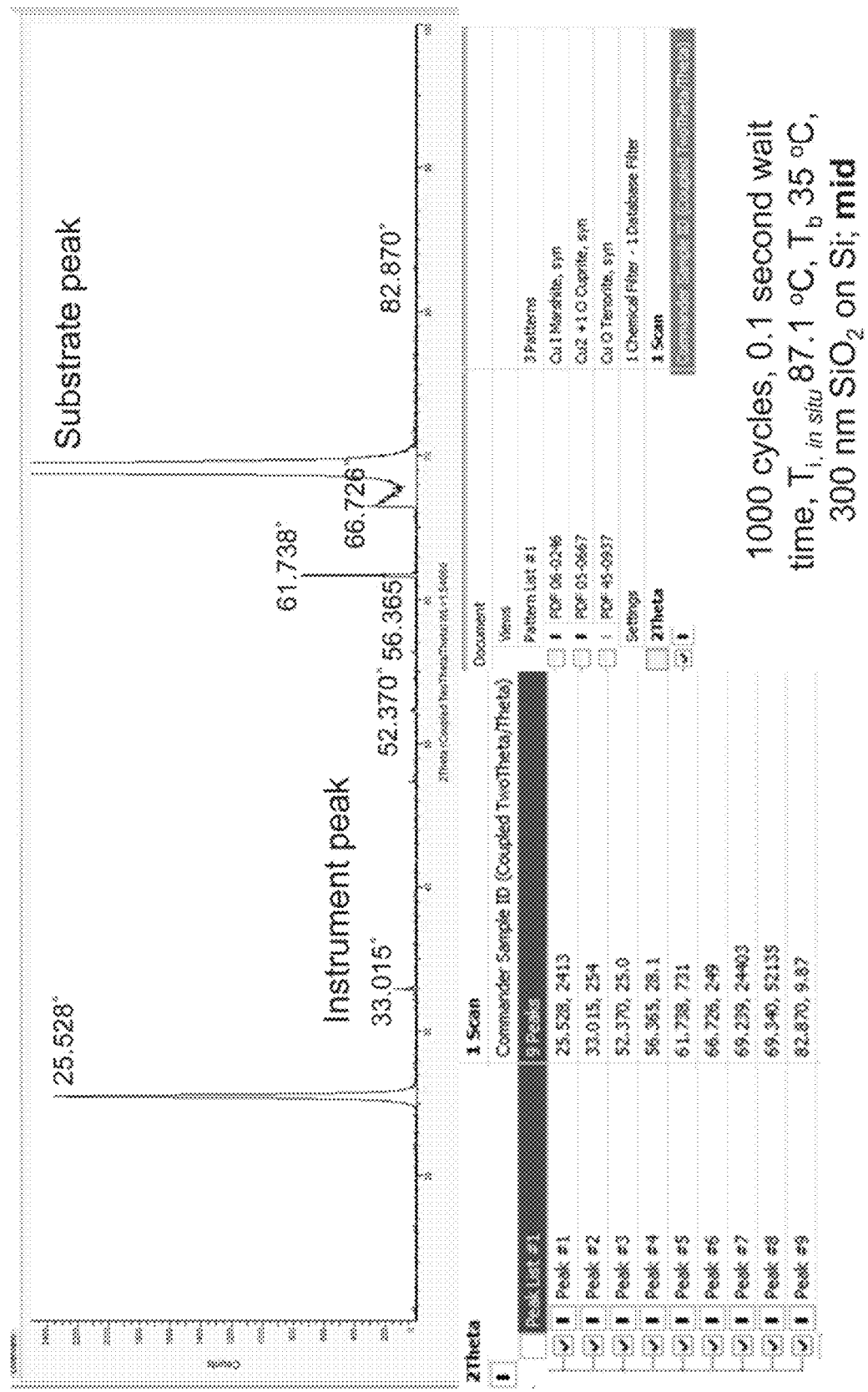
FIG. 25J shows XRD data for CuI deposited for 1000 cycles on 300 nm $SiO_2$ on Si, according to one or more embodiments.
Figure 25K:
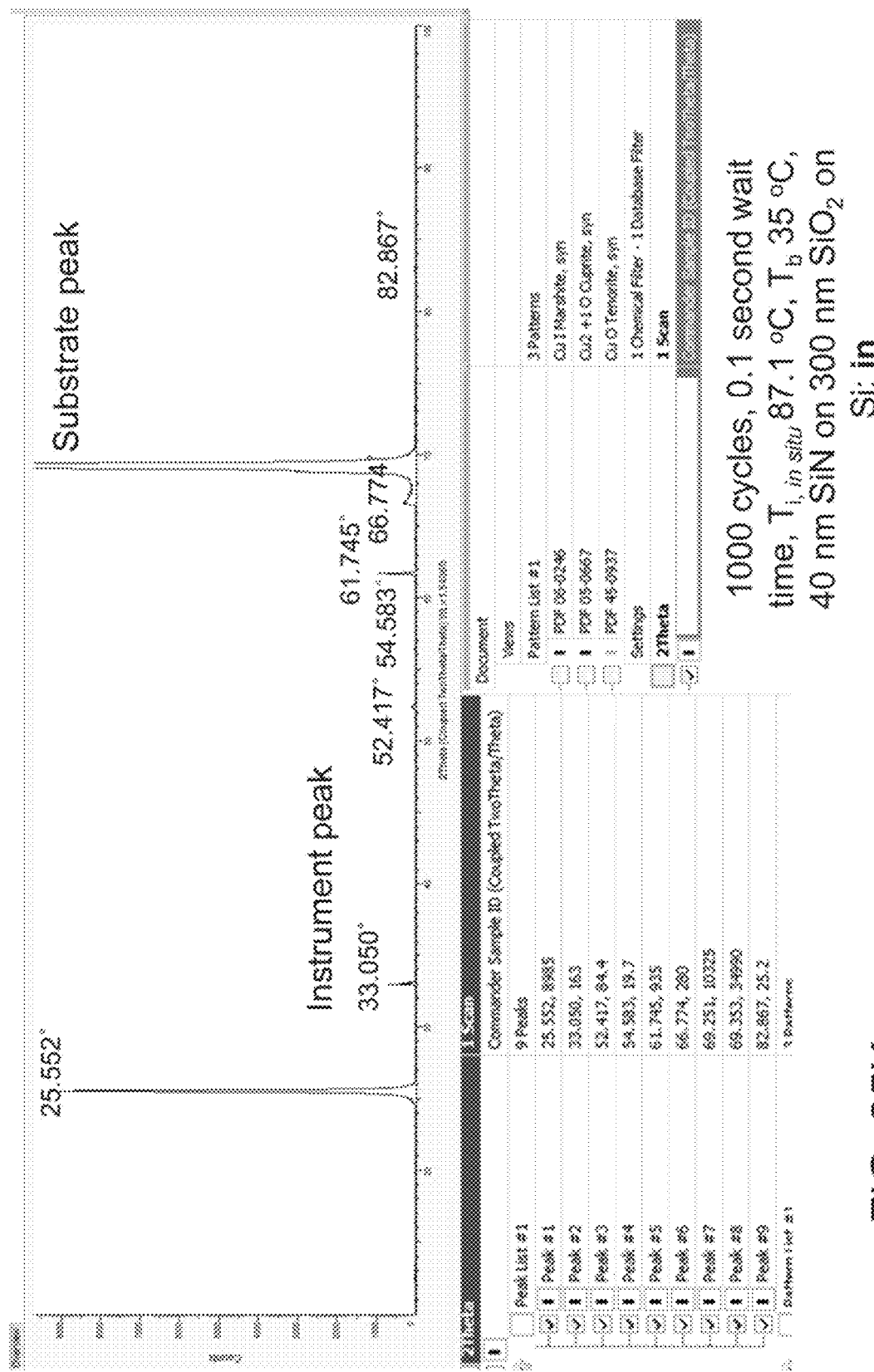
FIG. 25K shows XRD data for CuI deposited for 1000 cycles on 40 nm SiN on 300 nm $SiO_2$ on Si, according to one or more embodiments.
Figure 25L:
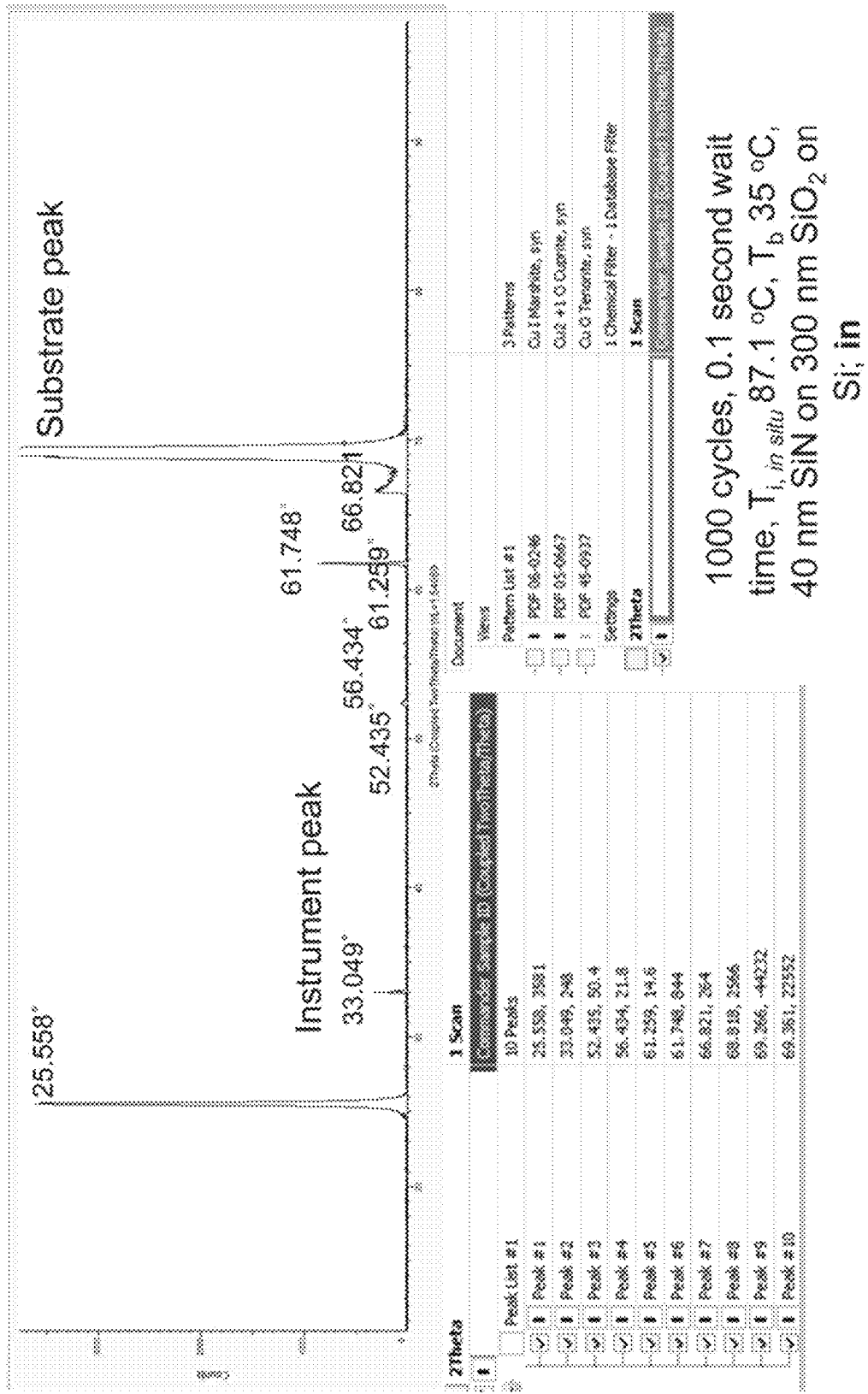
FIG. 25L shows XRD data for CuI deposited for 1000 cycles on 40 nm SiN on 300 nm $SiO_2$ on Si, according to one or more embodiments.
Figure 25M:
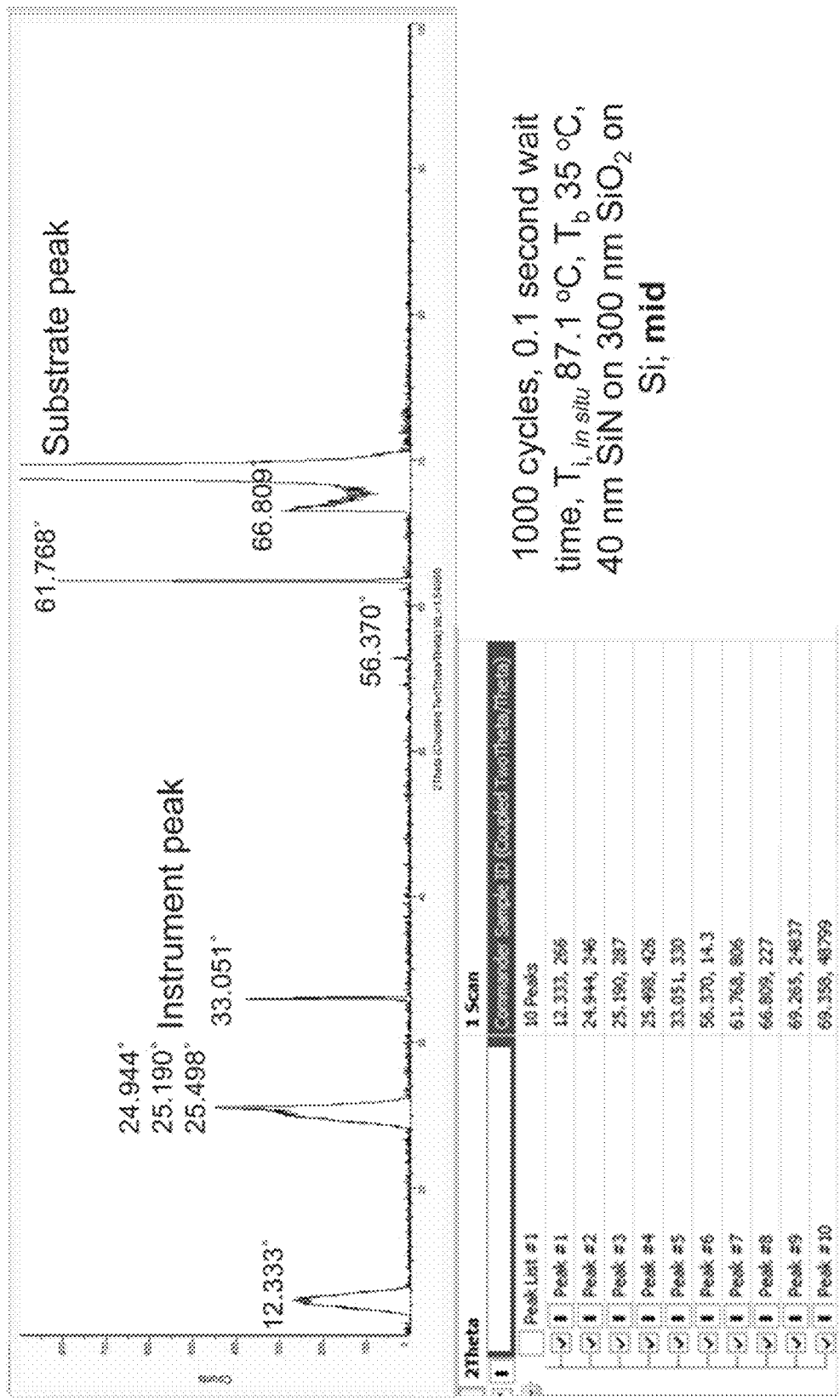
FIG. 25M shows XRD data for CuI deposited for 1000 cycles on 40 nm SiN on 300 nm $SiO_2$ on Si, according to one or more embodiments.
Figure 25N:
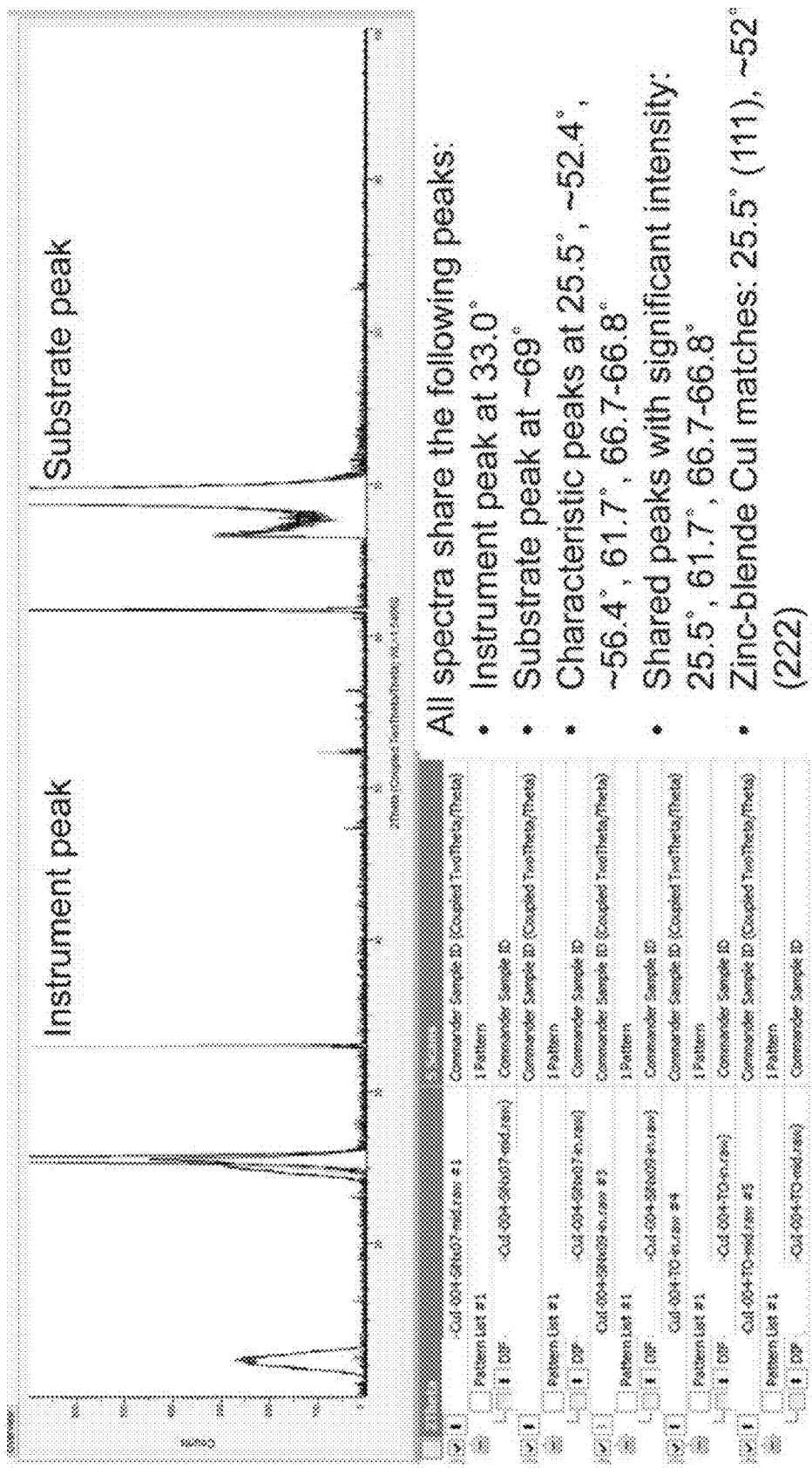
FIG. 25N shows an overlay of the XRD data of FIGS. 25I-25M, according to one or more embodiments.
Figure 26:
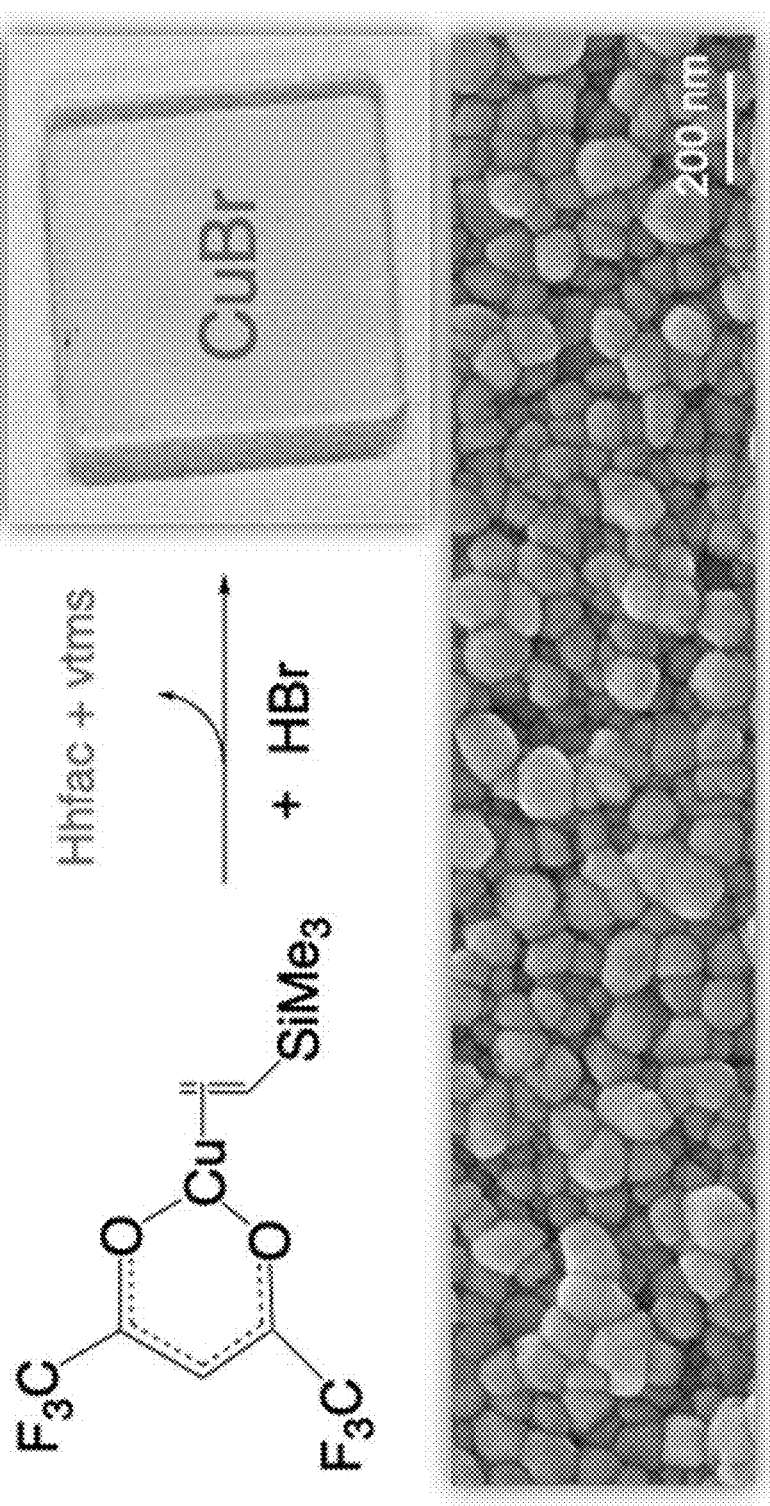
FIG. 26 shows formation of a copper bromide layer, according to one or more embodiments.

As was apparent by inspection of this equation, interfacial free energy was minimized when the two materials had quantitatively similar dispersive components and quantitatively similar polar components of free energy. The results of this analysis are shown in FIG. 21, where α refers to the as-deposited CuBr and β refers to the listed solid. In order from best to poorest wetting match for CuBr, the substrates ranked as follows: $SiO_2$ (0.4), Pt (0.4), SiN (4.9), $Al_2O_3$ (9.2), cupric oxide (15.4), and glassy carbon (29.6). These results suggested that good wetting of CuBr on $SiO_2$ and poor wetting of CuBr on glassy carbon should be observed. However, it was surprisingly observed that CuBr films were continuous on glassy carbon, SiN, and platinum, whereas they poorly wet $SiO_2$ and $Al_2O_3$.

The surface cleaning procedure for substrates used in contact angle measurements was more thorough than, but similar to, the substrate cleaning for the CVD. For contact angle measurements, sample preparation was as follows: $SiO_2$ (thermal oxide on Si wafer) and platinum substrates were sonicated in acetone and isopropanol for 5 minutes each and then treated with UV-ozone for 10 minutes. SiN was sonicated in acetone and isopropanol for 5 minutes each. Glassy carbon substrates and CuBr films were not cleaned.

The mismatch between the deposited CuBr morphologies and the contact angle measurements may mean that the latter (open-air, room-temperature, 1 atm) do not fully capture the interfacial free energy values of the substrates when under reaction conditions (83° C., with reactant headspace gases, ~10 torr pressure). It may be that the chemistry of the reaction caused the altered interfacial free energy. For example, the neutral ligand used in Cu(hfac)(vtms), vinyltrimethylsilane, is present in the reactor stoichiometrically with copper. Vtms concentration is known to alter the growth versus nucleation rates in the chemical vapor deposition of Cu from Cu(hfac)(vtms).

Using Cu(hfac)(vtms) and HBr as precursors, direct CVD of continuous CuBr layers was conducted. By controlling the growth conditions and choice of substrate, continuous layers of CuBr were produced at substrate temperatures ranging from 65 to 110° C., with growth rates up to 1 nm/min. These films had high optical transparency, exceeding 80% transmittance below their bandgap, and Hall mobilities of about 3 $cm^2V^{-1} s^{-1}$. In some embodiments, the films are suitable for use as transparent p-type semiconductors in optoelectronic devices.

Copper Iodide Depositions

In some embodiments, the pCVD method can be used to deposit CuI layers. In some embodiments, the pCVD method may have a certain number of cycles (e.g., 500, 600, or 1000 cycles), a certain wait time (e.g., 0.1 or 5 seconds), or a certain temperature (e.g., 35, 87.0, or 87.1° C.). In some embodiments, the CuI layers can be deposited on a substrate or adhesion layer on a substrate (e.g., SiN, thermal $SiO_2$ on Si (also termed "TO" for "thermal oxide"), or SiN on thermal $SiO_2$ on Si). In some embodiments, the substrate may have a certain size or mixture of sizes (e.g., 40 and/or 300 nm). In some embodiments, the CuI layers can be characterized using, e.g., SEM, XRD, or XPS. In some embodiments, the CuI deposition may have any combination of the conditions exemplified in Table 3. In some embodiments, the CuI deposition may be described by the SEM, XRD, or XPS data shown in FIGS. 22A-22F, 23A-23D, 24A-24D, and 25A-25N.

TABLE 3

Exemplary CuI deposition conditions.

| # cycles | 600 | 500 | 1000 |
|---|---|---|---|
| Substrate | SiN, $SiO_2$/Si, TiPt, Glassy Carbon | $SiO_2$/Si | SiN, $SiO_2$/Si |
| HI exposure (torr × second) | 0.18 | 0.067 | 0.43 |
| Cu exposure (torr × second) | 2.8 | 2.3 | 2.7 |
| Bubbler set temperature (° C.) | 35 | 35 | 35 |
| Possible bubbler actual temperature (° C.) | 34.5 | 34.6 | |
| Substrate set temperature (° C.) | 90 | 90 | 90 |
| Possible substrate actual temp. (° C.) | 87.1 | 87 | |
| $N_2$ carrier pressure (torr) | 0.7 | 0.7 | 0.7 |
| Scanning electron microscopy thickness (nm) | ~30 | ~30 | |
| Growth per cycle (nm/cycle) | 0.05 | 0.06 | |

It will be appreciated that while one or more particular materials or steps have been shown and described for purposes of explanation, the materials or steps may be varied in certain respects, or materials or steps may be combined, while still obtaining the desired outcome. Additionally, modifications to the disclosed embodiment and the invention as claimed are possible and within the scope of this disclosed invention.

The invention claimed is:

1. An article comprising:
   a substrate; and
   a copper halide layer on the substrate;
   wherein the interfacial free energy between the substrate and the copper halide layer is configured such that:
   the copper halide layer is free of discontinuations of sizes of about 5 $nm^2$ or greater; and
   the copper halide layer conforms to the shape of the substrate.

2. The article of claim 1, wherein the copper halide comprises a compound of formula $CuF_aCl_bBr_dI_e$, where a, b, d, and e are independently between 0 and 1, inclusive, and the sum of a, b, d, and e is 1.

3. The article of claim 2, wherein the copper halide is CuF, CuCl, CuBr, or CuI.

4. The article of claim 1, wherein the substrate has a thickness of between about 1 nm and about 1 mm.

5. The article of claim 1, wherein the substrate has a thickness of between about 1 nm and about 1 cm.

6. The article of claim 1, wherein the article is optically transparent.

7. The article of claim 6, wherein the article has a transmittance of greater than about 80% over the wavelength range from about 400 nm to about 800 nm.

8. The article of claim 1, wherein the article is electrically conductive.

9. The article of claim 8, wherein the resistivity of the article is between about 0.00375 Ω·cm and about 20 Ω·cm.

10. The article of claim 8, wherein the sheet resistance of the article is between about $2.5 \times 10^2$ $\Omega \cdot sq^{-1}$ and about $2 \times 10^6$ $\Omega \cdot sq^{-1}$.

11. The article of claim 8, wherein the hole concentration of the article is between about $1 \times 10^{17}$ cm$^{-3}$ and about $1 \times 10^{19}$ cm$^{-3}$.

12. The article of claim 8, wherein the mobility of the article is between about 0.07 cm$^2$ V$^{-1}$ s$^{-1}$ and about 10 cm$^2$ V$^{-1}$ s$^{-1}$.

13. The article of claim 8, wherein the electrical conductivity of the copper halide layer is p-type.

14. The article of claim 1, wherein the copper halide layer has a thickness of between about 50 nm to about 1000 nm.

15. The article of claim 1, wherein the copper halide layer is CuBr and the substrate is selected from the group consisting of silicon nitride, platinum, SiO$_2$, Al$_2$O$_3$, and glassy carbon.

16. The article of claim 1, wherein the copper halide layer is CuI and the substrate is selected from the group consisting of silicon nitride, platinum, SiO$_2$, Al$_2$O$_3$, and glassy carbon.

17. The article of claim 1, wherein:
the substrate further comprises an adhesion layer conformally formed on the substrate; and
the copper halide layer is on the adhesion layer;
wherein the interfacial free energy between the substrate or the adhesion layer and the copper halide layer allows the copper halide layer to be free of discontinuities of sizes of about 5 nm$^2$ or greater; and
wherein the copper halide layer conforms to the shape of the adhesion layer.

18. The article of claim 17, wherein the substrate and adhesion layer are independently selected from the group consisting of a metal, a metalloid, a metal halide, a metal oxide, a metal nitride, glassy carbon, a semiconductor wafer, plastic, glass, and a combination thereof.

19. The article of claim 18, wherein the metal is platinum, titanium, gold, or a combination thereof.

20. The article of claim 18, wherein the metalloid is silicon.

21. The article of claim 18, wherein the metal halide is NaCl or a perovskite.

22. The article of claim 21, wherein the perovskite comprises methylammonium tin trishalide, methylammonium lead trishalide, cesium tin trishalide, cesium lead trishalide, formamidinium tin trishalide, formamidinium lead trishalide, or a combination thereof.

23. The article of claim 18, wherein the metal oxide is SiO$_2$, Al$_2$O$_3$, TiO$_2$, quartz, or a combination thereof.

24. The article of claim 18, wherein the metal nitride is silicon nitride, manganese nitride, or a combination thereof.

25. The article of claim 24, wherein the silicon nitride includes silicon oxynitride at its surface.

26. The article of claim 18, wherein the semiconductor wafer comprises silicon, a mixture of silicon and SiO$_2$, GaAs, silicon carbide, or gallium nitride.

27. The article of claim 26, wherein the semiconductor wafer comprises a mixture of silicon and SiO$_2$.

28. The article of claim 17, wherein the adhesion layer has a thickness of between about 1 nm and about 1000 nm.

29. The article of claim 28, wherein the adhesion layer has a thickness of between about 40 nm and about 300 nm.

30. The article of claim 17, wherein the surface free energy of the copper halide layer, the substrate, or the adhesion layer is between about 0 mJ/m$^2$ to about 50 mJ/m$^2$.

31. The article of claim 17, wherein the copper halide layer is CuBr, the adhesion layer is silicon nitride or platinum, and the substrate is selected from the group consisting of SiO$_2$, quartz, silicon, and a SiO$_2$/Si wafer.

32. The article of claim 17, wherein the copper halide layer is CuI, the adhesion layer is silicon nitride or platinum, and the substrate is selected from the group consisting of SiO$_2$, quartz, silicon, and a SiO$_2$/Si wafer.

33. An optoelectronic device, comprising the article of claim 1.

34. The optoelectronic device of claim 33, wherein the optoelectronic device is selected from the group consisting of perovskite solar cells, dye-sensitized solar cells, photonic emitters, electrooptic modulators, optical fibers, four-wave mixing devices, flat-panel displays, and thin-film transistors.

35. A method of fabricating an article, comprising:
providing a substrate; and
depositing a copper halide layer on the substrate using a chemical vapor deposition process;
wherein the interfacial free energy between the substrate and the copper halide layer allows the copper halide layer to form free of discontinuities of sizes of about 5 nm$^2$ or greater; and
wherein the copper halide layer conforms to the shape of the substrate.

36. The method of claim 35, wherein
the substrate further comprises an adhesion layer;
wherein the copper halide layer is deposited on the adhesion layer using a chemical vapor deposition process;
wherein the interfacial free energy between the substrate or adhesion layer and the copper halide layer allows the copper halide layer to form free of discontinuities of sizes of about 5 nm$^2$ or greater; and
wherein the copper halide layer conforms to the shape of the substrate or adhesion layer.

\* \* \* \* \*